US011469126B2

(12) United States Patent
Moura et al.

(10) Patent No.: US 11,469,126 B2
(45) Date of Patent: Oct. 11, 2022

(54) TOOL AUTO-TEACH METHOD AND APPARATUS

(71) Applicant: Brooks Automation, Inc., Chelmsford, MA (US)

(72) Inventors: Jairo T. Moura, Marlborough, MA (US); Aaron Gawlik, Burlington, MA (US); Reza Saeidpourazar, Boston, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 99 days.

(21) Appl. No.: 17/014,575

(22) Filed: Sep. 8, 2020

(65) Prior Publication Data

US 2021/0098276 A1 Apr. 1, 2021

Related U.S. Application Data

(63) Continuation of application No. 16/539,819, filed on Aug. 13, 2019, now Pat. No. 10,770,325, which is a
(Continued)

(51) Int. Cl.
*H01L 21/677* (2006.01)
*H01L 21/67* (2006.01)
(Continued)

(52) U.S. Cl.
CPC .. *H01L 21/67742* (2013.01); *H01L 21/67265* (2013.01); *H01L 21/67294* (2013.01);
(Continued)

(58) Field of Classification Search
CPC ..................................................... B65G 1/137
See application file for complete search history.

(56) References Cited

U.S. PATENT DOCUMENTS

| 598,194 | A | | 2/1898 | Case | |
|---|---|---|---|---|---|
| 4,692,876 | A | * | 9/1987 | Tenma | ................... G06Q 10/08 901/7 |

(Continued)

FOREIGN PATENT DOCUMENTS

| CN | 102763209 | 10/2012 |
|---|---|---|
| EP | 0597637 | 8/2000 |

(Continued)

OTHER PUBLICATIONS

International Search Report, International Application No. PCT/US2015/060016, dated Mar. 29, 2016.

*Primary Examiner* — Kyle O Logan
(74) *Attorney, Agent, or Firm* — Perman & Green LLP; Colin C. Durham

(57) ABSTRACT

A substrate transport apparatus auto-teach system for auto-teaching a substrate station location, the system including a frame, a substrate transport connected to the frame, the substrate transport having an end effector configured to support a substrate, and a controller configured to move the substrate transport so that the substrate transport biases the substrate supported on the end effector against a substrate station feature causing a change in eccentricity between the substrate and the end effector, determine the change in eccentricity, and determine the substrate station location based on at least the change in eccentricity between the substrate and the end effector.

20 Claims, 42 Drawing Sheets

Related U.S. Application Data continuation of application No. 16/011,978, filed on Jun. 19, 2018, now Pat. No. 10,381,252, which is a continuation of application No. 14/937,676, filed on Nov. 10, 2015, now Pat. No. 10,002,781.

(60) Provisional application No. 62/247,647, filed on Oct. 28, 2015, provisional application No. 62/191,829, filed on Jul. 13, 2015, provisional application No. 62/078,345, filed on Nov. 11, 2014, provisional application No. 62/077,775, filed on Nov. 10, 2014.

(51) Int. Cl.
  *H01L 21/68* (2006.01)
  *H01L 21/687* (2006.01)

(52) U.S. Cl.
  CPC .. *H01L 21/67766* (2013.01); *H01L 21/67778* (2013.01); *H01L 21/68* (2013.01); *H01L 21/68707* (2013.01)

(56) References Cited

U.S. PATENT DOCUMENTS

| | | |
|---|---|---|
| 4,724,322 A | 2/1988 | Knowles et al. |
| 4,819,167 A | 4/1989 | Cheng et al. |
| 5,102,280 A | 4/1992 | Poduje et al. |
| 5,155,423 A | 10/1992 | Karlen et al. |
| 5,214,362 A | 5/1993 | Torii et al. |
| 5,442,269 A | 8/1995 | Takayama et al. |
| 5,483,138 A | 1/1996 | Shmookler et al. |
| 5,512,746 A | 4/1996 | Saito |
| 5,581,166 A | 12/1996 | Eismann et al. |
| 5,740,062 A | 4/1998 | Berken et al. |
| 5,789,890 A | 8/1998 | Genov et al. |
| 5,908,283 A * | 6/1999 | Huang ............ B65G 61/00 414/21 |
| 6,022,485 A | 2/2000 | Cheek |
| 6,037,733 A | 3/2000 | Genov et al. |
| 6,075,334 A | 6/2000 | Sagues et al. |
| 6,116,848 A | 9/2000 | Thomas et al. |
| 6,121,743 A | 9/2000 | Genov et al. |
| 6,198,976 B1 | 3/2001 | Sundar et al. |
| 6,205,870 B1 | 3/2001 | Hosokawn et al. |
| 6,213,708 B1 | 4/2001 | Allen |
| 6,228,429 B1 | 5/2001 | Bluck et al. |
| 6,242,879 B1 | 6/2001 | Sagues et al. |
| 6,254,719 B1 | 7/2001 | Cheek |
| 6,256,555 B1 | 7/2001 | Sugiura et al. |
| 6,275,748 B1 | 8/2001 | Bacchi et al. |
| 6,304,051 B1 | 10/2001 | Sagues et al. |
| 6,323,616 B1 | 11/2001 | Sagues et al. |
| 6,327,517 B1 | 12/2001 | Sundar |
| 6,405,101 B1 | 6/2002 | Johanson et al. |
| 6,438,460 B1 | 8/2002 | Bacchi et al. |
| 6,453,214 B1 | 9/2002 | Bacchi et al. |
| 6,474,712 B1 | 11/2002 | Govzman et al. |
| 6,478,532 B1 | 11/2002 | Coady et al. |
| 6,516,244 B1 | 2/2003 | Yoo et al. |
| 6,543,980 B2 | 4/2003 | Lin et al. |
| 6,556,887 B2 | 4/2003 | Freeman et al. |
| 6,577,923 B1 | 6/2003 | White et al. |
| 6,591,160 B2 | 7/2003 | Hine et al. |
| 6,591,161 B2 | 7/2003 | Yoo et al. |
| 6,618,645 B2 | 9/2003 | Bacchi et al. |
| 6,629,053 B1 | 9/2003 | Mooring |
| 6,669,829 B2 | 12/2003 | Feltsman et al. |
| 6,675,666 B2 | 1/2004 | Maruyama et al. |
| 6,690,185 B1 | 2/2004 | Khandros et al. |
| 6,707,528 B1 | 3/2004 | Aoyama et al. |
| 6,795,786 B2 | 9/2004 | LaMarca et al. |
| 6,822,413 B2 | 11/2004 | Simondet |
| 6,831,436 B2 | 12/2004 | Gonzalez |
| 6,850,806 B2 | 2/2005 | Yutkowitz |
| 6,852,644 B2 | 2/2005 | Dickinson |
| 6,855,858 B2 | 2/2005 | Cheng et al. |
| 6,859,747 B2 | 2/2005 | Yutkowitz |
| 6,865,499 B2 | 3/2005 | Yutkowitz |
| 6,897,646 B2 | 5/2005 | Grebner et al. |
| 6,898,487 B2 | 5/2005 | Bacchi et al. |
| 6,914,337 B2 | 7/2005 | Chuang et al. |
| 6,920,408 B2 | 7/2005 | Yutkowitz |
| 6,934,606 B1 | 8/2005 | Genetti et al. |
| 6,973,370 B2 | 12/2005 | Ito et al. |
| 6,996,456 B2 | 2/2006 | Cordell et al. |
| 7,008,802 B2 | 3/2006 | Lu |
| 7,039,498 B2 | 5/2006 | Bnacchi et al. |
| 7,039,501 B2 | 5/2006 | Freeman et al. |
| 7,054,713 B2 | 5/2006 | Teng et al. |
| 7,058,622 B1 | 6/2006 | Tedesco |
| 7,085,622 B2 | 8/2006 | Sadighi et al. |
| 7,139,641 B2 | 11/2006 | Jan |
| 7,223,323 B2 | 5/2007 | Yang et al. |
| 7,226,269 B2 | 6/2007 | Sundar et al. |
| 7,230,702 B2 | 6/2007 | Rice et al. |
| 7,233,842 B2 | 6/2007 | Bacchi et al. |
| 7,289,230 B2 | 10/2007 | Ramsey et al. |
| 7,300,082 B2 | 11/2007 | Rogers et al. |
| 7,331,250 B2 | 2/2008 | Hunter |
| 7,400,392 B2 | 4/2008 | Tillmann |
| 7,397,539 B2 | 7/2008 | Willems et al. |
| 7,433,759 B2 | 10/2008 | Nangoy |
| 7,440,091 B2 | 10/2008 | Bagley et al. |
| 7,486,384 B2 | 2/2009 | Tinnemans et al. |
| 7,522,267 B2 | 4/2009 | Hofmeister et al. |
| 7,637,142 B2 | 12/2009 | Tsui et al. |
| 7,670,530 B2 | 3/2010 | Choi et al. |
| 7,779,554 B2 | 8/2010 | Onishi et al. |
| 7,813,832 B2 | 10/2010 | Sundar |
| 7,894,657 B2 | 2/2011 | van der Meulen et al. |
| 7,921,690 B2 | 4/2011 | Uebel et al. |
| 7,933,685 B1 | 4/2011 | Sarver et al. |
| 7,963,736 B2 | 6/2011 | Takizawa et al. |
| 8,000,837 B2 | 8/2011 | Allen et al. |
| 8,109,753 B2 | 2/2012 | Choi et al. |
| 8,112,171 B2 | 2/2012 | Krupyshev |
| 8,121,732 B2 | 2/2012 | Hashimoto et al. |
| 8,125,652 B2 | 2/2012 | Fogel et al. |
| 8,149,005 B2 | 4/2012 | Matsumoto et al. |
| 8,151,622 B2 | 4/2012 | Uebel et al. |
| 8,224,607 B2 | 4/2012 | Sakhare et al. |
| 8,242,730 B2 | 8/2012 | Nichols et al. |
| 8,260,461 B2 | 9/2012 | Krishnasamy et al. |
| 8,335,589 B2 | 12/2012 | Sarver et al. |
| 8,401,701 B2 | 3/2013 | Kimura |
| 8,459,922 B2 | 6/2013 | Hosek |
| 8,532,818 B2 * | 9/2013 | Ohashi ............ H01L 21/67766 700/214 |
| 8,628,288 B2 | 1/2014 | Duhamel et al. |
| 8,641,351 B2 | 2/2014 | Nobuyasu |
| 8,692,503 B2 | 4/2014 | Wiggers |
| 8,731,718 B2 | 5/2014 | Rodnick |
| 8,739,598 B2 | 6/2014 | Uebel et al. |
| 2002/0042666 A1 | 4/2002 | Bacchi et al. |
| 2002/0068992 A1 | 6/2002 | Hine et al. |
| 2002/0076305 A1 | 6/2002 | Lin et al. |
| 2002/0089655 A1 | 7/2002 | Kida et al. |
| 2002/0134179 A1 | 9/2002 | Maruyama et al. |
| 2003/0026683 A1 | 2/2003 | Govzman et al. |
| 2003/0055533 A1 | 3/2003 | Bacchi et al. |
| 2003/0076126 A1 | 4/2003 | Grebner et al. |
| 2003/0201170 A1 | 10/2003 | Gandikota et al. |
| 2004/0016637 A1 | 1/2004 | Yang et al. |
| 2004/0039486 A1 | 2/2004 | Watanabe et al. |
| 2004/0258514 A1 | 12/2004 | Raaijmakers et al. |
| 2005/0017529 A1 | 1/2005 | Rogers et al. |
| 2005/0021177 A1 | 1/2005 | Bacchi et al. |
| 2005/0091863 A1 | 5/2005 | Chuang et al. |
| 2005/0105991 A1 | 5/2005 | Hofmeister et al. |
| 2005/0158153 A1 | 7/2005 | Sundar et al. |
| 2006/0005602 A1 | 1/2006 | Tsui et al. |
| 2006/0045719 A1 | 3/2006 | Bacchi et al. |
| 2006/0046269 A1 | 3/2006 | Thompson et al. |
| 2006/0245856 A1 | 11/2006 | Sundar et al. |

(56) References Cited

U.S. PATENT DOCUMENTS

| | | |
|---|---|---|
| 2007/0012084 A1 | 1/2007 | Tsui et al. |
| 2007/0029227 A1 | 2/2007 | Bonora |
| 2007/0080067 A1 | 4/2007 | Gu et al. |
| 2007/0170617 A1 | 7/2007 | Choi et al. |
| 2008/0044262 A1* | 2/2008 | Kim .................. B65G 1/0421 414/281 |
| 2008/0187413 A1 | 8/2008 | Kondoh |
| 2008/0213076 A1 | 9/2008 | Hanson et al. |
| 2008/0302480 A1 | 11/2008 | Berger |
| 2009/0039581 A1 | 2/2009 | Onishi et al. |
| 2009/0093908 A1 | 4/2009 | Hashimoto et al. |
| 2009/0110532 A1 | 4/2009 | Salek |
| 2009/0259337 A1 | 10/2009 | Harrold et al. |
| 2010/0011785 A1 | 1/2010 | Behdjat et al. |
| 2010/0112116 A1 | 5/2010 | Choi et al. |
| 2010/0161124 A1 | 6/2010 | Kimura |
| 2010/0222915 A1* | 9/2010 | Kuehnemann ......... B65G 57/00 706/14 |
| 2010/0316468 A1* | 12/2010 | Lert .................. B65G 1/0492 414/273 |
| 2010/0316470 A1* | 12/2010 | Lert .................. B65G 1/1373 414/807 |
| 2011/0137454 A1* | 6/2011 | Ohashi ............. H01L 21/67766 700/228 |
| 2011/0287177 A1 | 11/2011 | Yamada et al. |
| 2012/0022827 A1 | 1/2012 | Hertgens et al. |
| 2012/0101627 A1* | 4/2012 | Lert .................. B65G 1/065 700/216 |
| 2012/0125808 A1 | 5/2012 | Bonora |
| 2012/0185082 A1* | 7/2012 | Toebes ............... B65G 1/0492 700/218 |
| 2012/0186192 A1* | 7/2012 | Toebes ............... B65G 1/04 53/235 |
| 2012/0189409 A1* | 7/2012 | Toebes ............... B65G 1/0492 414/273 |
| 2012/0195720 A1* | 8/2012 | Sullivan .............. B65G 1/04 414/277 |
| 2012/0197431 A1* | 8/2012 | Toebes ............... B65G 1/0492 901/1 |
| 2012/0200259 A1* | 8/2012 | Sullivan .............. B60S 5/00 320/109 |
| 2012/0328397 A1* | 12/2012 | Yamashita ......... B65G 1/065 414/282 |
| 2013/0173039 A1 | 7/2013 | Rowell et al. |
| 2014/0100999 A1* | 4/2014 | Mountz ............. G06Q 10/087 705/28 |
| 2014/0222202 A1 | 8/2014 | Yoshida |

FOREIGN PATENT DOCUMENTS

| | | |
|---|---|---|
| EP | 1465011 | 6/2004 |
| EP | 20450492 | 8/2009 |
| EP | 20450491 | 9/2011 |
| EP | 2000872 | 3/2014 |
| JP | 3134481 | 5/1993 |
| JP | 05114804 | 5/1993 |
| JP | 05235376 | 9/1993 |
| JP | 2002514833 | 5/2002 |
| JP | 2002178279 | 6/2002 |
| JP | 2012152898 | 8/2012 |
| JP | 5401748 | 12/2012 |
| JP | 2012254524 | 12/2012 |
| JP | 5235376 | 4/2013 |
| JP | 2013235870 | 11/2013 |
| JP | 2014148031 | 8/2014 |
| WO | 9205920 | 4/1992 |
| WO | 9902996 | 1/1999 |
| WO | 9959056 | 11/1999 |
| WO | 0033359 | 6/2000 |
| WO | 0052646 | 9/2000 |
| WO | 2001069336 | 2/2001 |
| WO | 0140086 | 6/2001 |
| WO | 01056708 | 8/2001 |
| WO | 03105192 | 12/2003 |
| WO | 2004094702 | 11/2004 |
| WO | 2007008555 | 1/2007 |
| WO | 2007044232 | 4/2007 |
| WO | 2007084774 | 7/2007 |
| WO | 2010004635 | 1/2010 |
| WO | 2010004636 | 1/2010 |
| WO | 2010009048 | 1/2010 |
| WO | 2011077976 | 6/2011 |
| WO | 2011082011 | 7/2011 |

* cited by examiner

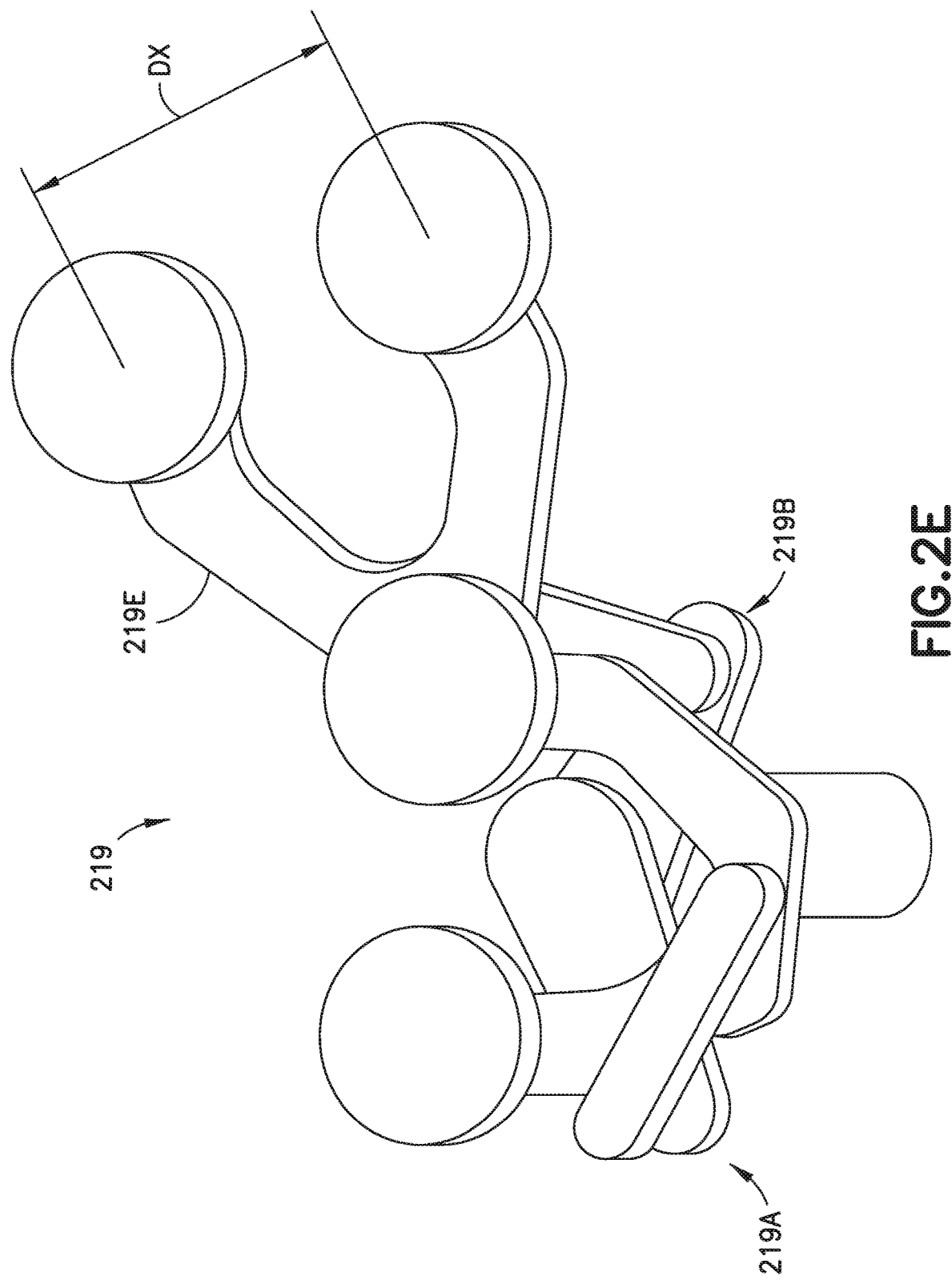

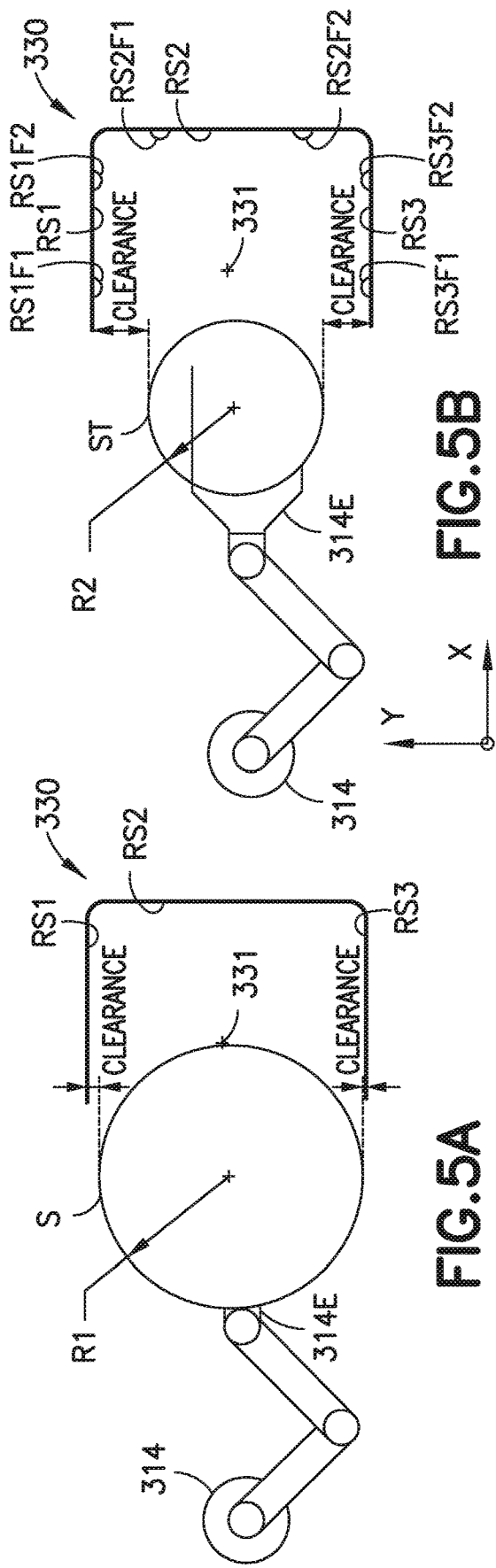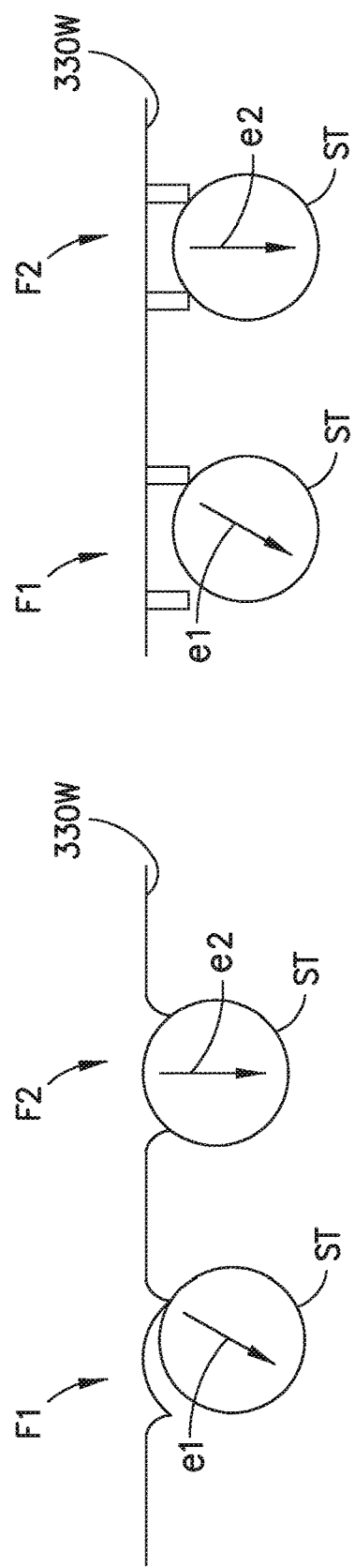

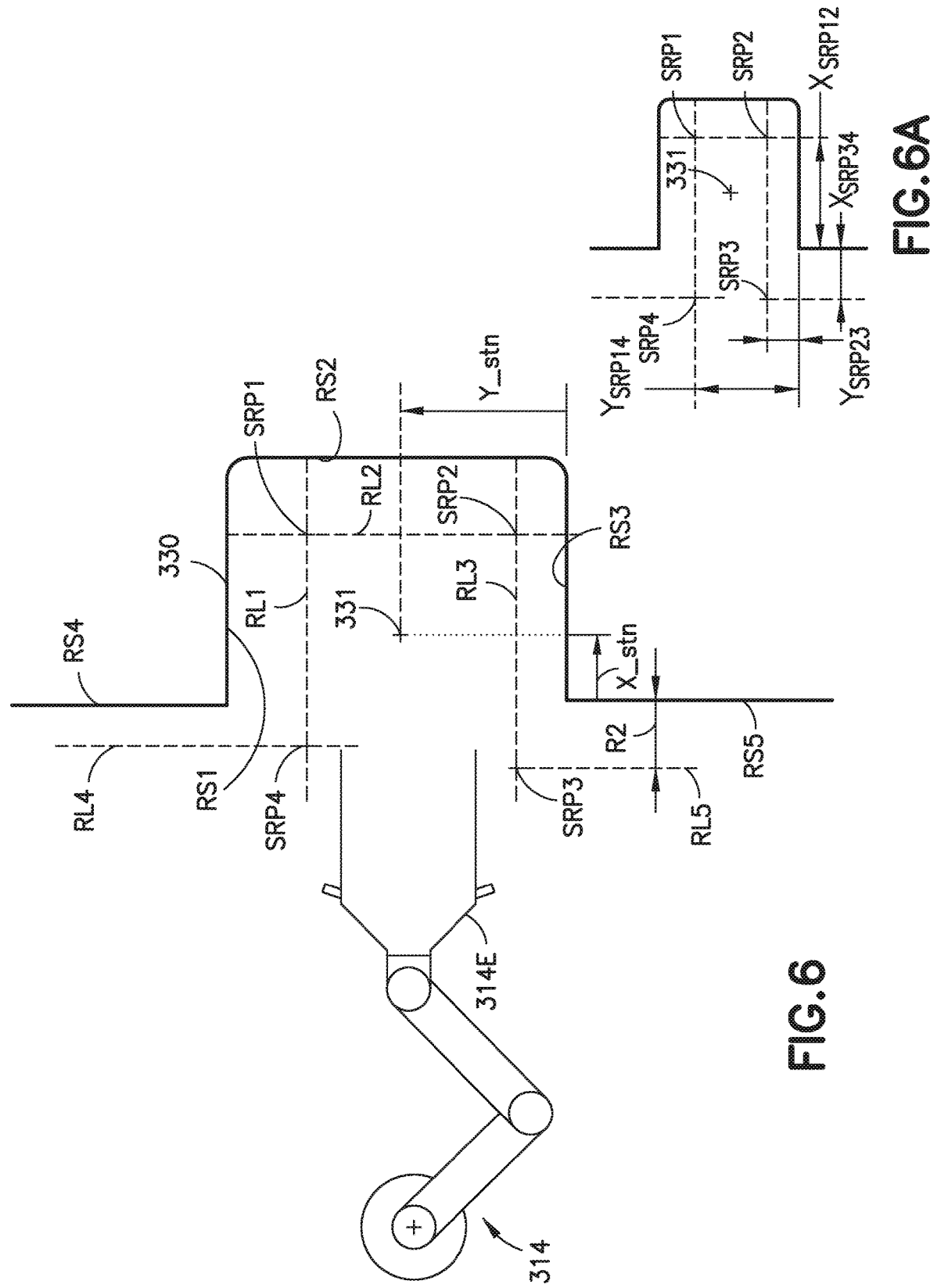

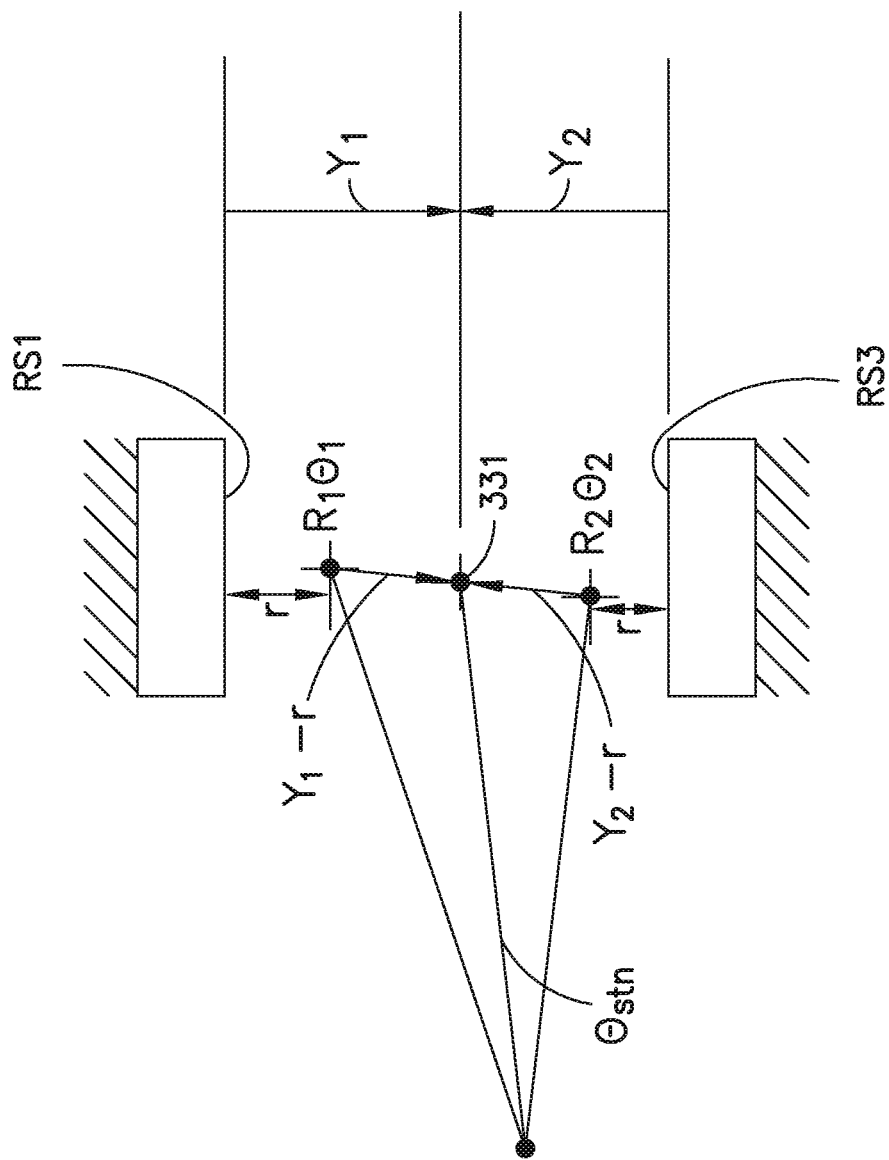

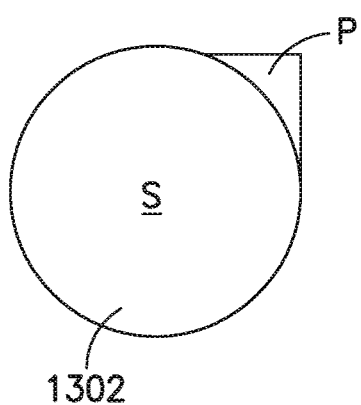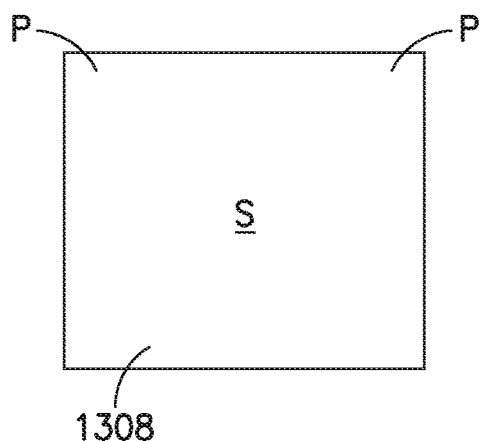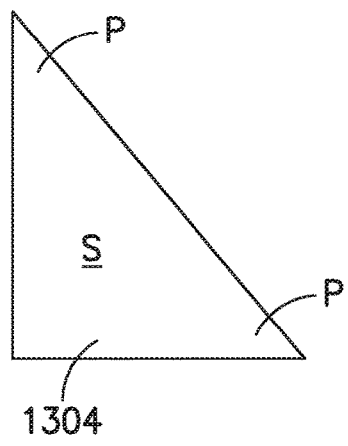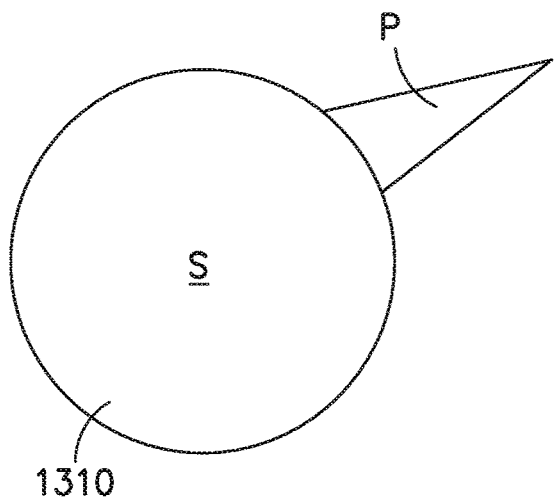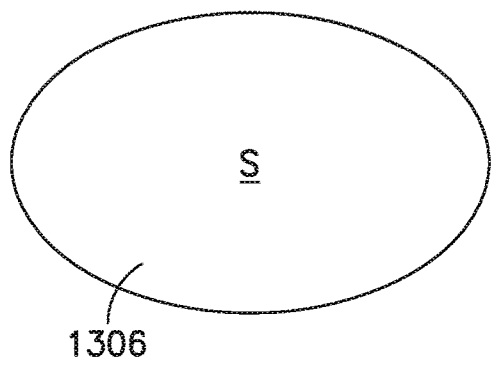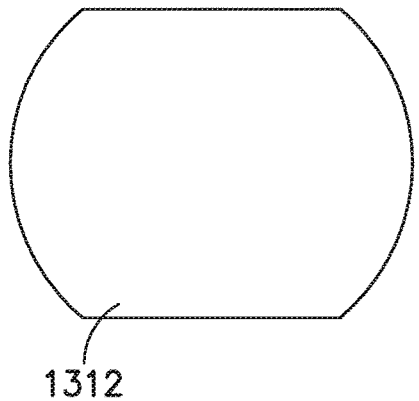
FIG.13

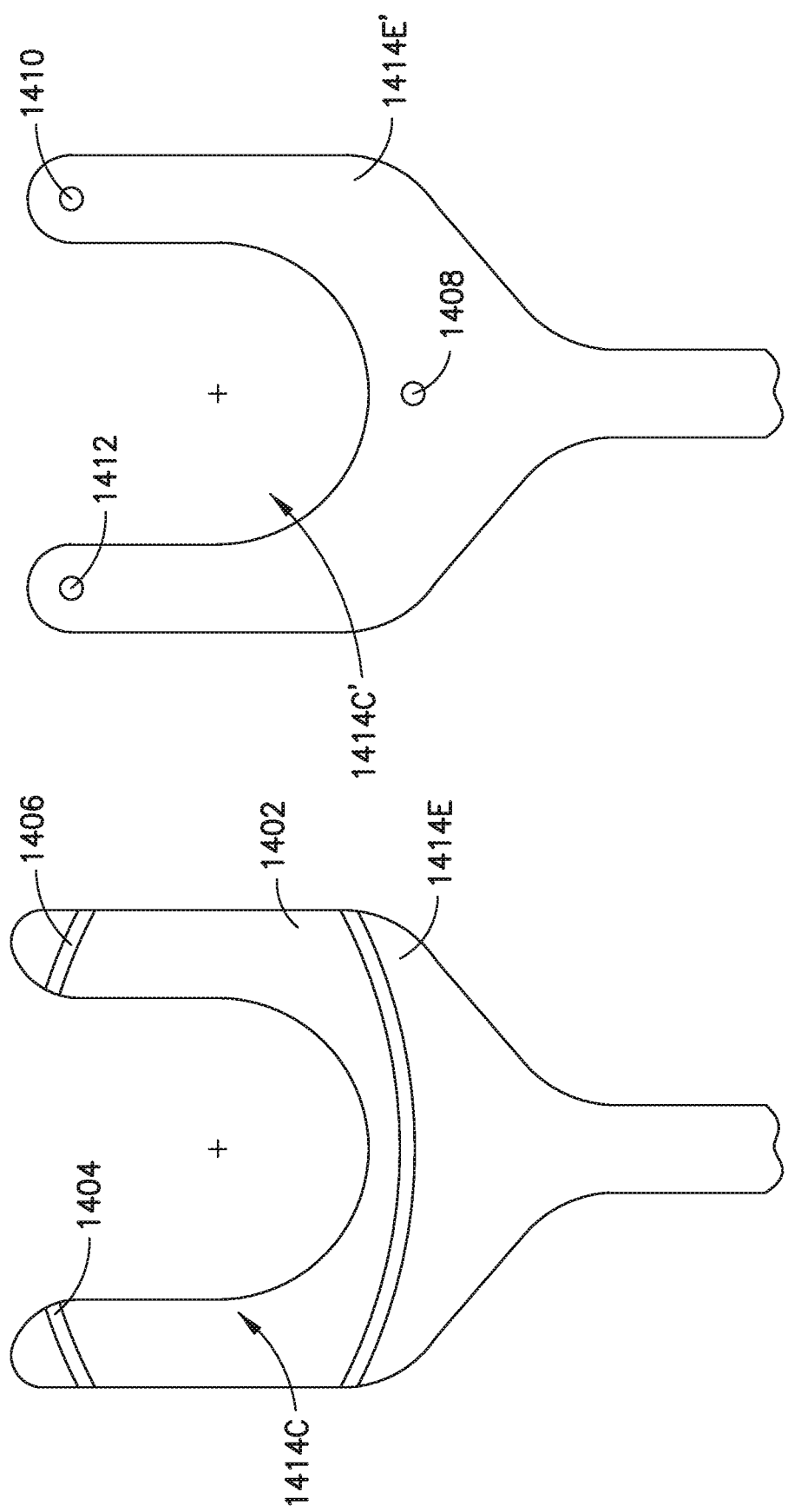

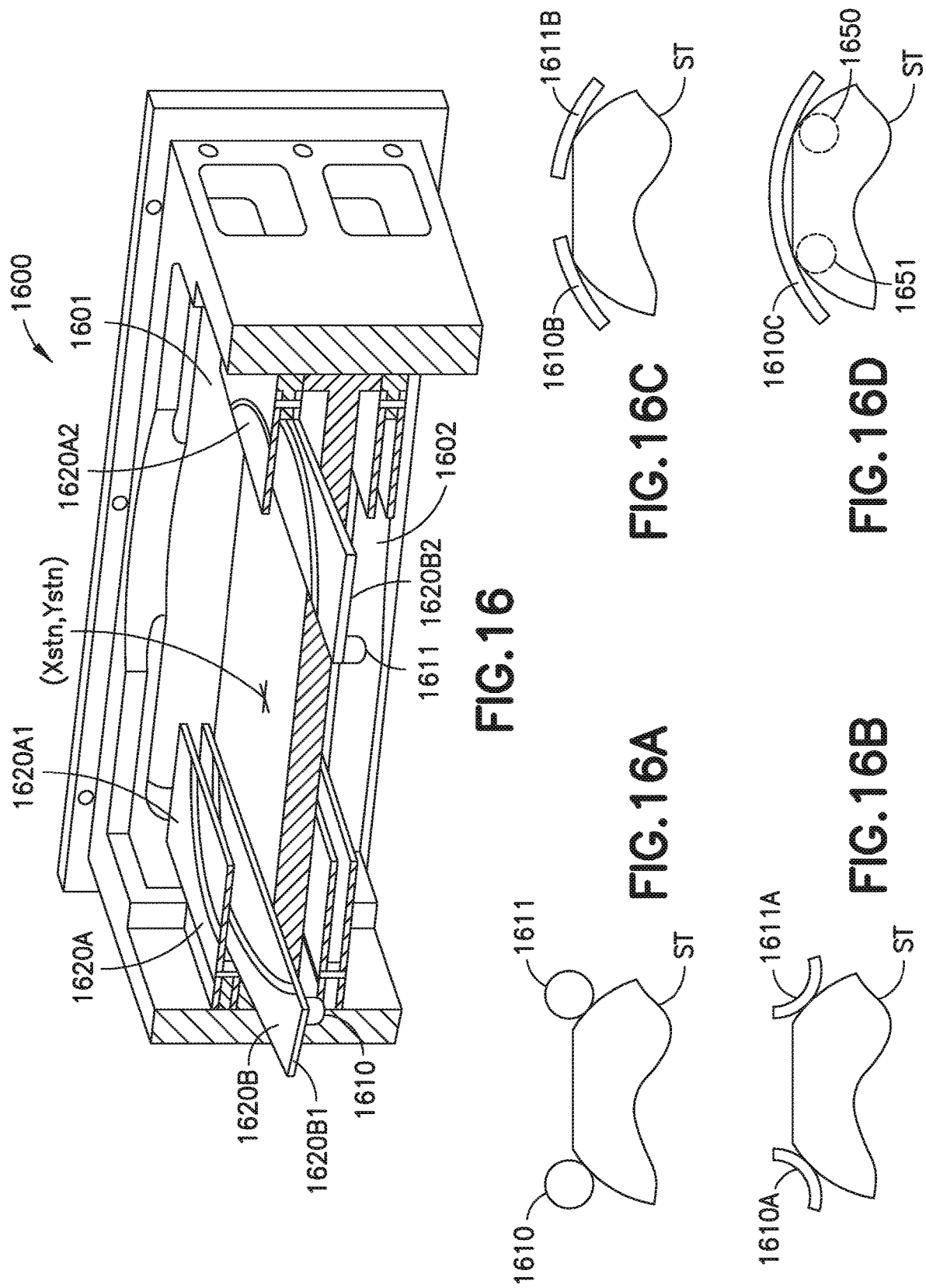

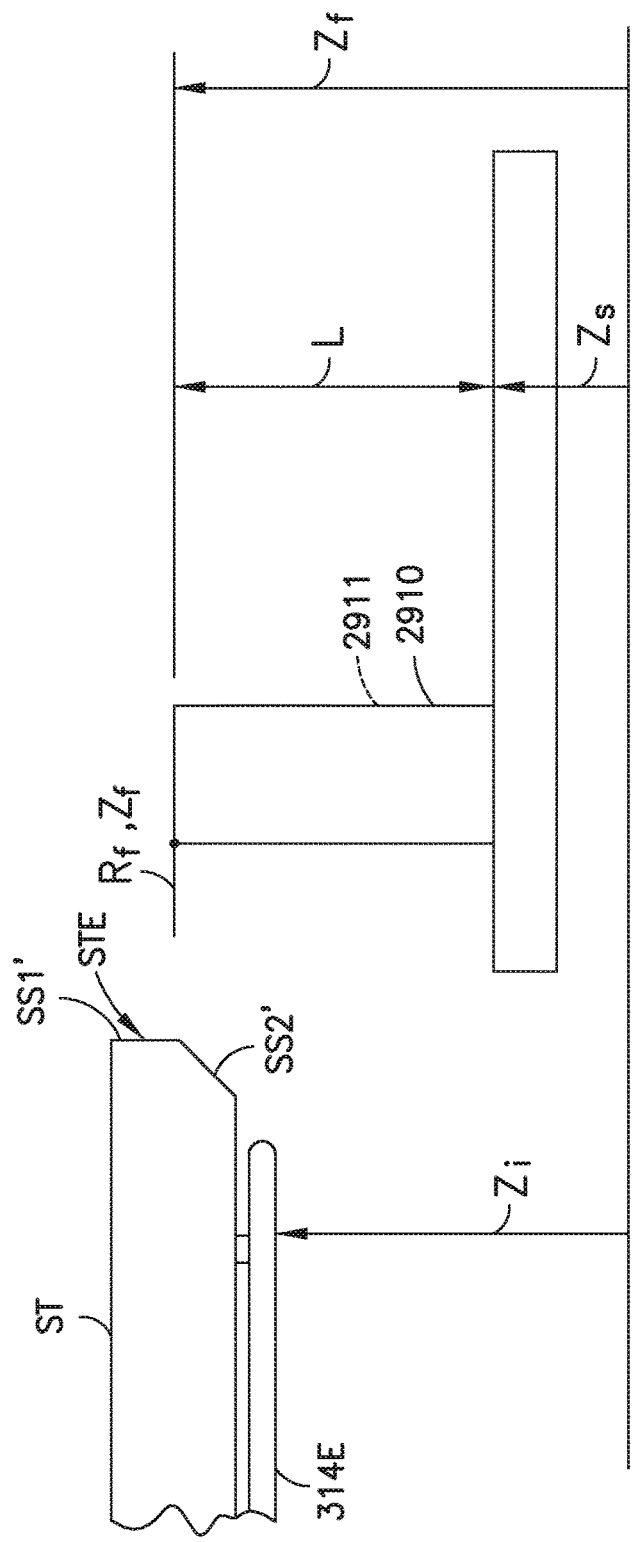
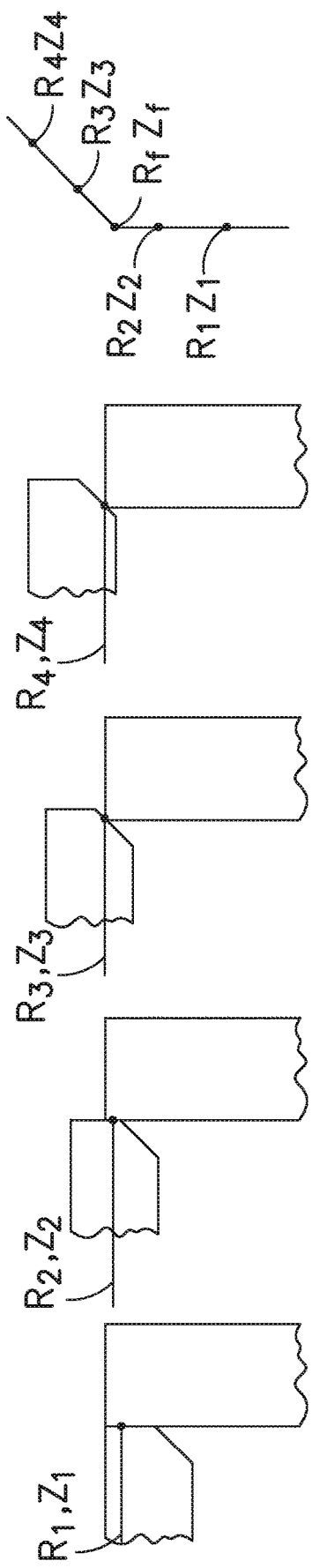
FIG.29A
FIG.29B
FIG.29C
FIG.29D
FIG.29E
FIG.29F

TOOL AUTO-TEACH METHOD AND APPARATUS

CROSS-REFERENCE TO RELATED APPLICATIONS

This application is a continuation of U.S. application Ser. No. 16/539,819, filed on Aug. 13, 2019, (now U.S. Pat. No. 10,770,325), which is a continuation of U.S. application Ser. No. 16/011,978, filed on Jun. 19, 2018 (now U.S. Pat. No. 10,381,252), which is a continuation of U.S. patent application Ser. No. 14/937,676, filed Nov. 10, 2015, (now U.S. Pat. No. 10,002,781), which claims priority from and benefit of U.S. provisional application No. 62/247,647, filed Oct. 28, 2015, U.S. provisional patent application No. 62/191,829, filed Jul. 13, 2015, U.S. provisional patent application No. 62/078,345, filed Nov. 11, 2014, and U.S. provisional patent application No. 62/077,775, filed Nov. 10, 2014, the disclosures of which are incorporated herein by reference in their entireties.

BACKGROUND

1. Field

The exemplary embodiments generally relate to substrate processing systems and, more particularly, to calibration and synchronization of components of the substrate processing systems.

2. Brief Description of Related Developments

Substrate processing equipment is typically capable of performing multiple operations on a substrate. The substrate processing equipment generally includes a transfer chamber and one or more process modules coupled to the transfer chamber. A substrate transport robot within the transfer chamber moves substrates among the process modules where different operations, such as sputtering, etching, coating, soaking, etc. are performed. Production processes used by, for example, semiconductor device manufacturers and materials producers often require precise positioning of substrates in the substrate processing equipment.

The precise position of the substrates is generally provided through teaching locations of the process modules to the substrate transport robot. Generally the teaching of the substrate transport robot includes detecting a position of the robot and/or substrate carried by the robot with dedicated teaching sensors added to the substrate processing equipment, utilizing instrumented substrates (e.g. including onboard, sensors or cameras) carried by the substrate transport robot, utilizing removable fixtures that are placed within the process modules or other substrate holding station of the substrate processing equipment, utilizing wafer centering sensors that are located within or externally accessible at the process modules, utilizing sensors (e.g. cameras) disposed external to the process modules, or by contacting a target within the process module with the substrate transport robot or an object carried by the substrate transport robot. These approaches to teaching locations within substrate processing equipment may require sensors being placed in a vacuum, may require changes to customer processing equipment and/or tooling, may not be suitable for use in vacuum environments or at high temperatures, may require sensor targets, mirrors or fixtures being placed within the processing equipment, may disrupt a vacuum environment of the substrate processing equipment, and/or may require software changes to the code embedded into the substrate transport robot's and/or processing system's controller.

It would be advantageous to automatically teach a substrate transport robot the substrate processing locations within processing equipment without disturbing an environment within the processing equipment or requiring additional instrumentation and/or modification to the substrate processing equipment.

BRIEF DESCRIPTION OF THE DRAWINGS

The foregoing aspects and other features of the disclosed embodiment are explained in the following description, taken in connection with the accompanying drawings, wherein:

FIGS. 2A-2E are schematic illustrations of transport arms in accordance with aspects of the disclosed embodiment;

FIGS. 5A-5E are schematic illustrations of portions of a substrate processing apparatus in accordance with aspects of the disclosed embodiment;

FIGS. 6 and 6A are schematic illustrations of a portion of a substrate processing apparatus in accordance with aspects of the disclosed embodiment;

FIGS. 11A and 11B are schematic illustrations for determining a station in accordance with aspects of the disclosed embodiment;

FIG. 13 is a plan view illustrating different configurations of a portion of the processing apparatus;

FIGS. 14A-14B respectively are schematic plan views of a substrate end effector having different configurations;

FIG. 16 is a schematic view of a portion of a substrate processing apparatus in accordance with aspects of the disclosed embodiment;

FIGS. 16A-16D are schematic illustrations of portions of a substrate processing apparatus in accordance with aspects of the disclosed embodiment;

FIGS. 29A-29F are schematic illustrations of an auto-teach process in accordance with aspects of the disclosed embodiment;

DETAILED DESCRIPTION

Figure 1A:
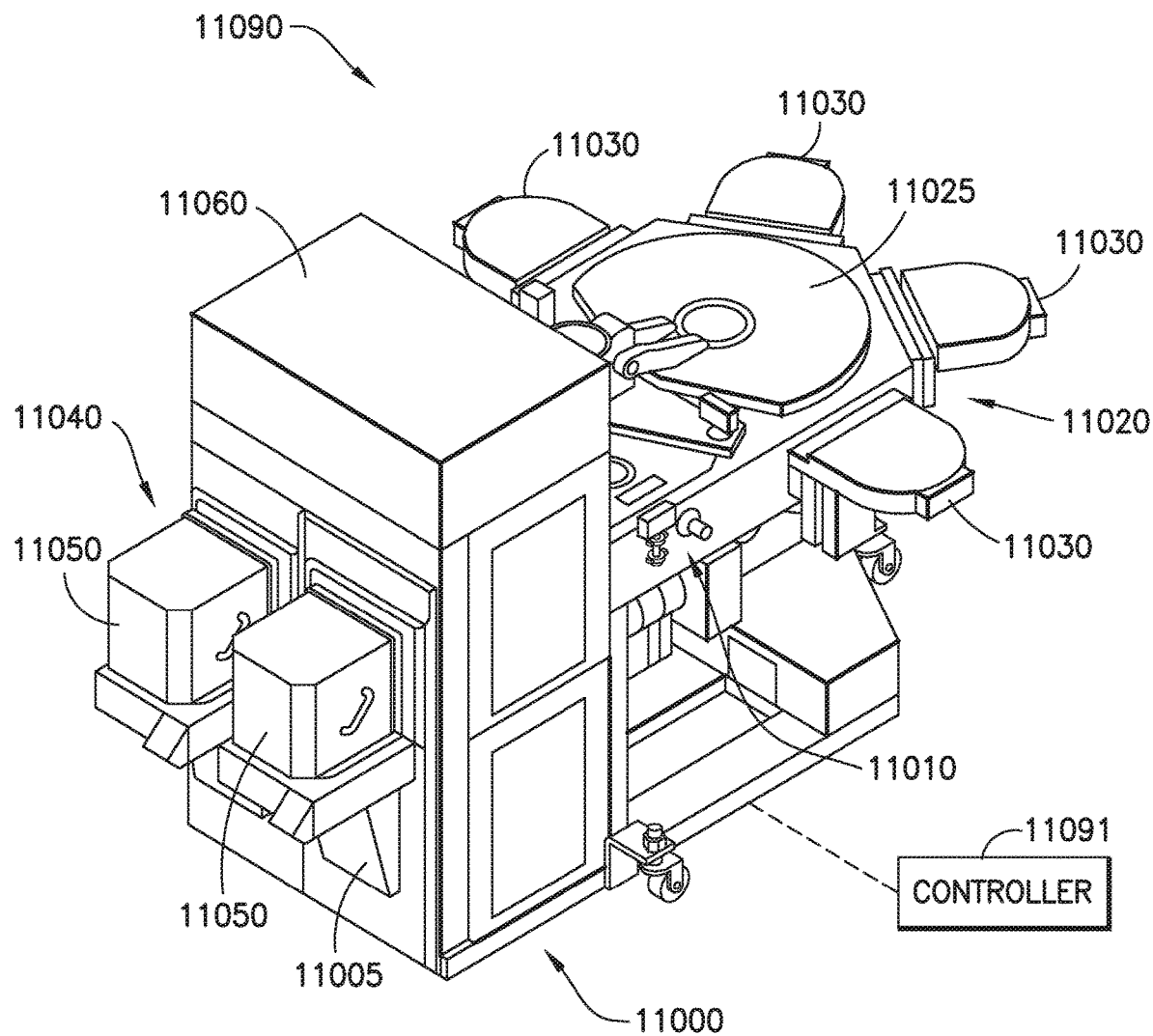
FIGS. 1A-1D are schematic illustrations of a substrate processing apparatus incorporating aspects of the disclosed embodiment.

Referring to FIGS. 1A-1D, there are shown schematic views of substrate processing apparatus or tools incorporating the aspects of the disclosed embodiment as will be further described herein. Although the aspects of the disclosed embodiment will be described with reference to the drawings, it should be understood that the aspects of the disclosed embodiment can be embodied in many forms. In addition, any suitable size, shape or type of elements or materials could be used.

As will be described in greater detail below, the aspects of the disclosed embodiment provide for the automatic (e.g. without operator intervention) location of substrate holding stations of a substrate processing apparatus and teaching a substrate transport apparatus the locations of the substrate holding stations. As used herein the term substrate holding station is a substrate holding location within a process module or any other suitable substrate holding location within the substrate processing apparatus such as, for example, a load port (or substrate cassette held thereon), a load lock, a buffer station, etc. The aspects of the disclosed embodiment leverage existing equipment and devices employed in the substrate processing apparatus such as substrate processing sensors. Substrate processing sensors as used herein are active wafer centering sensors (AWC), substrate aligners and/or other suitable substrate eccentricity (e.g. relative to a predetermined substrate holding location on an end effector) detection units used in the aligning and/or centering of substrates during substrate processing. In other words, there are substantially no additional instrumentation costs incurred by, for example, the customer after the initial purchase/configuration of the substrate processing apparatus when the automated teaching in accordance with the aspects of the disclosed embodiment is utilized.

The aspects of the disclosed embodiment may also be implemented substantially without software changes to the programming code embedded into the substrate transport apparatus and/or the substrate processing apparatus system controller. For example, the aspects of the disclosed embodiment may utilize existing commands associated with the substrate transport apparatus such as "pick and place" commands and/or "substrate alignment" commands. The aspects of the disclosed embodiments are also operational environment such as vacuum environment (as well as atmospheric environment e.g. inert gas, filtered clean air) compatible as there are no electronic components (e.g. cables, printed circuit boards, etc.) located within the processing environment. As may be realized, in an atmospheric processing environment the AWC centers may be located within the atmospheric processing environment. Accordingly, the aspects of the disclosed embodiment provide for decreased machine down time during the automatic teaching of the substrate transport apparatus substantially without disrupting the processing environment (e.g. vacuum or atmospheric) already established within the substrate processing apparatus (e.g. the substrate processing apparatus and the components thereof remain sealed or otherwise isolated from an external environment during the automatic teaching process).

Figure 1B:
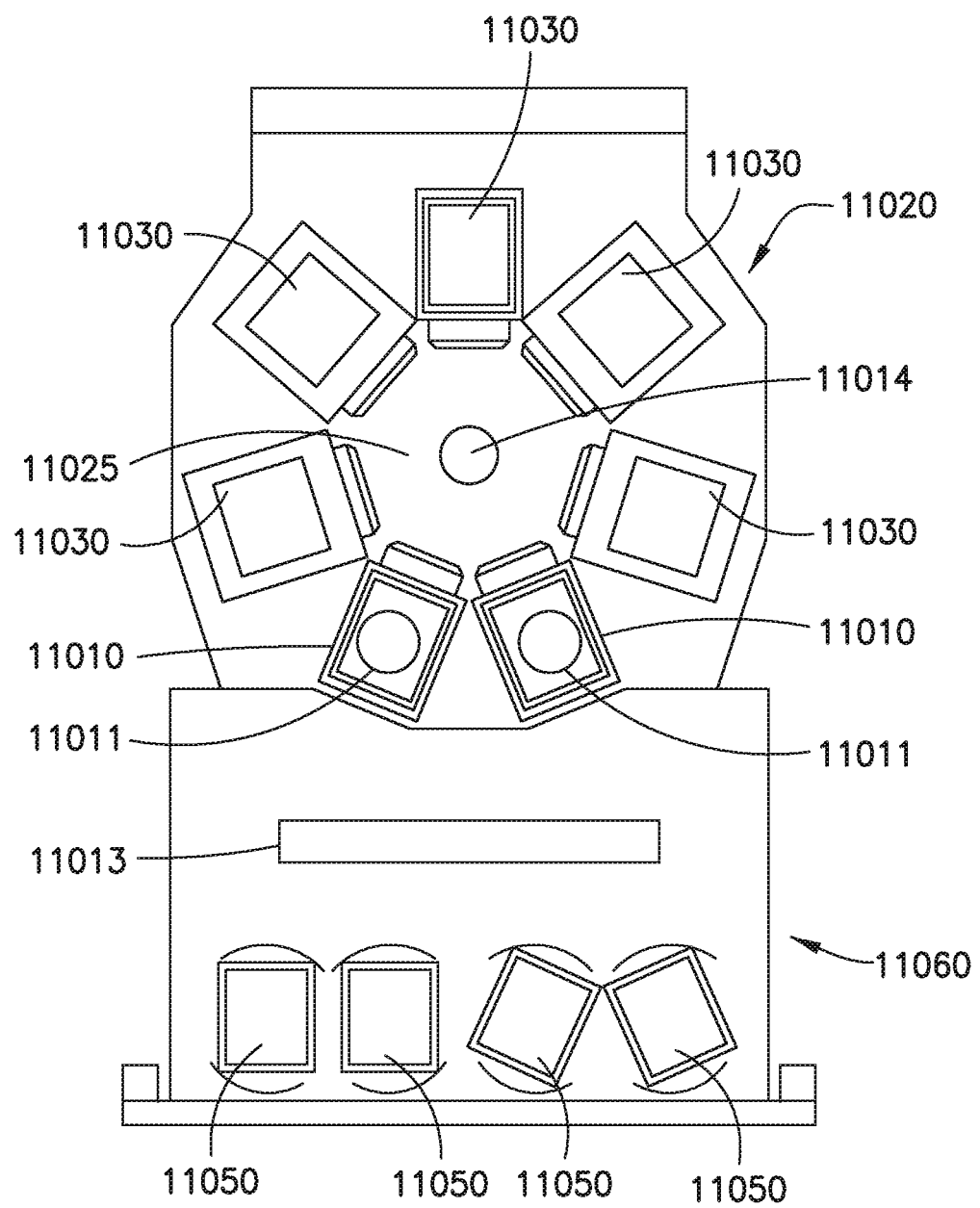

Referring to FIGS. 1A and 1B, a processing apparatus, such as for example a semiconductor tool station 11090 is shown in accordance with aspects of the disclosed embodiment. Although a semiconductor tool 11090 is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized. The controller 11091 includes any suitable memory and processor(s) that include non-transitory program code for operating the processing apparatus described herein to effect the automatic location of substrate holding stations of a substrate processing apparatus and teaching a substrate transport apparatus the locations of the substrate holding stations as described herein. For example, in one aspect the controller 11091 includes embedded pick/place commands (e.g. for the substrate transport apparatus to move the substrate transport apparatus and bias or tap the substrate so as to generate eccentricity as described herein) and/or embedded substrate locating commands (e.g. for determining an eccentricity between the substrate and end effector of the substrate transport apparatus). In one aspect, the controller is configured to move the substrate transport so that the substrate transport biases (or taps) the substrate supported on the end effector against a substrate station feature (as will be described in greater detail below) causing a change in eccentricity between the substrate and the end effector. The controller is configured to determine the change in eccentricity and determine the substrate station location based on at least the change in eccentricity between the substrate and the end effector. As may be realized, and as described herein, in one aspect, the substrate station is located inside and the auto-teaching described herein occurs in a process module having a vacuum pressure environment therein. In one aspect the vacuum pressure is a high vacuum. In one aspect, the auto-teaching described herein occurs within a substrate station feature located for example within a process module that is in a state of process security (e.g. for processing substrates). The state of process security for processing substrates is a condition of the process module wherein the process module is sealed in a cleanliness state ready for introducing process vacuum or atmosphere into the process module, or a state ready for introducing a production wafer into the process module.

In one aspect, the front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer or 450 mm wafer interfaces or any other suitable substrate interfaces such as for example larger or smaller wafers or flat panels for flat panel displays. Although two load port modules 11005 are shown in FIG. 1A, in other aspects any suitable number of load port modules may be incorporated into the front end 11000. The load port modules 11005 may be configured to receive substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. In one aspect the load ports 11040 allow the passage of substrates between the substrate cassettes 11050 and the mini-environment 11060.

In one aspect, the mini-environment 11060 generally includes any suitable transfer robot 11013 that incorporates one or more aspects of the disclosed embodiment described herein. In one aspect the robot 11013 may be a track mounted robot such as that described in, for example, U.S. Pat. No. 6,002,840, the disclosure of which is incorporated by reference herein in its entirety or in other aspects, any other suitable transport robot having any suitable configuration. The mini-environment 11060 may provide a controlled, clean zone for substrate transfer between multiple load port modules.

The vacuum load lock 11010 may be located between and connected to the mini-environment 11060 and the back end 11020. It is noted that the term vacuum as used herein may denote a high vacuum such as $10^{-5}$ Torr or below in which the substrates are processed. The load lock 11010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. In one aspect, the load lock 11010 includes an aligner 11011 for aligning a fiducial of the substrate to a desired position for processing. In other aspects, the vacuum load lock may be located in any suitable location of the processing apparatus and have any suitable configuration and/or metrology equipment.

The vacuum back end 11020 generally includes a transport chamber 11025, one or more processing station(s) or module(s) 11030 and any suitable transfer robot or apparatus 11014. The transfer robot 11014 will be described below and may be located within the transport chamber 11025 to transport substrates between the load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa. In one aspect the load port modules 11005 and load ports 11040 are substantially directly coupled to the vacuum back end 11020 so that a cassette 11050 mounted on the load port interfaces substantially directly (e.g. in one aspect at least the mini-environment 11060 is omitted while in other aspects the vacuum load lock 11010 is also omitted such that the cassette 11050 is pumped down to vacuum in a manner similar to that of the vacuum load lock 11010) with a vacuum environment of the transfer chamber 11025 and/or a processing vacuum of a process module 11030 (e.g. the processing vacuum and/or vacuum environment extends between and is common between the process module 11030 and the cassette 11050).

Figure 1C:
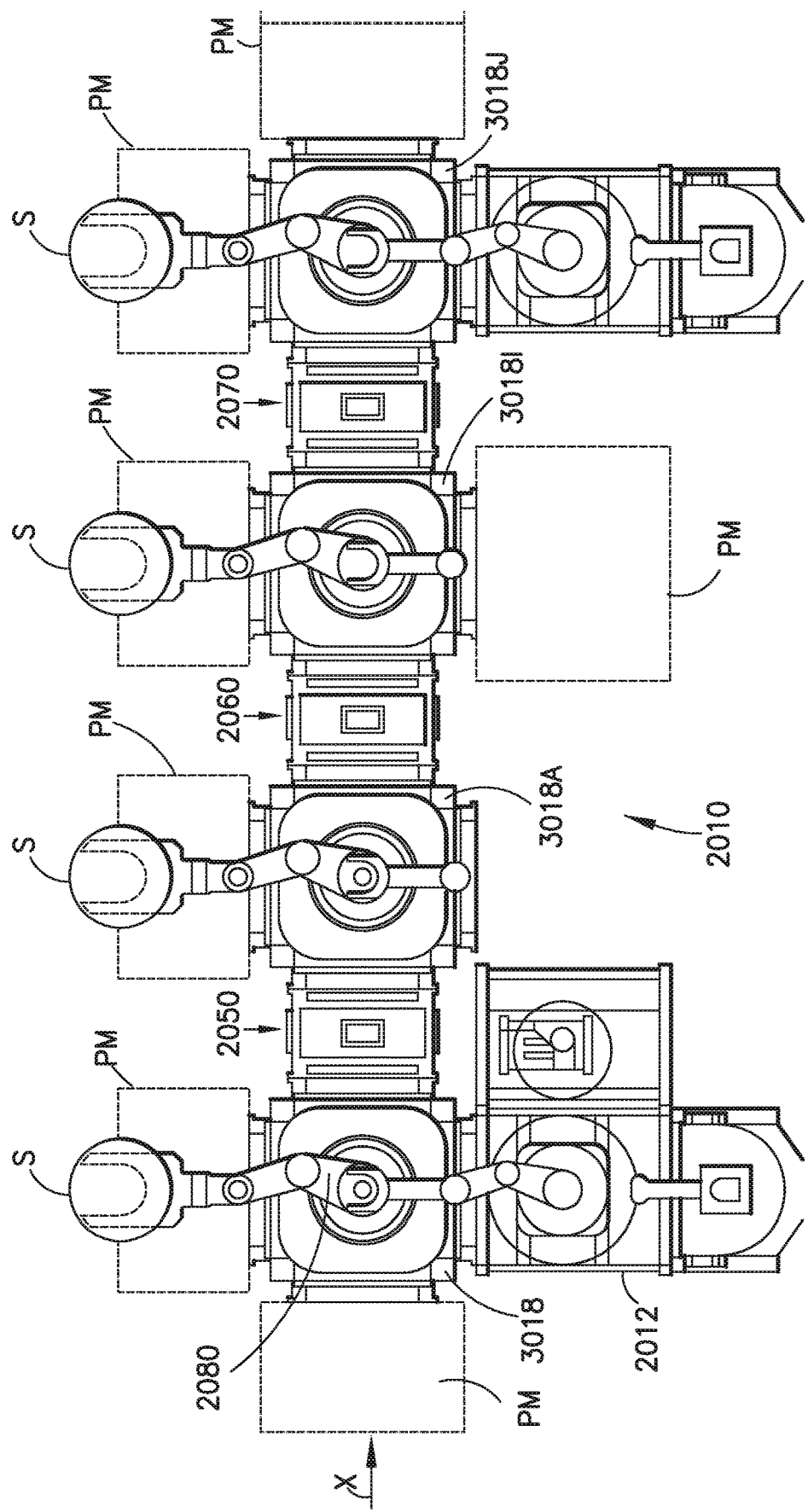

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM (which in one aspect are substantially similar to processing modules 11030 described above). As may be realized, each chamber module may be capable of holding an isolated or controlled atmosphere (e.g. N2, clean air, vacuum).

Figure 1D:
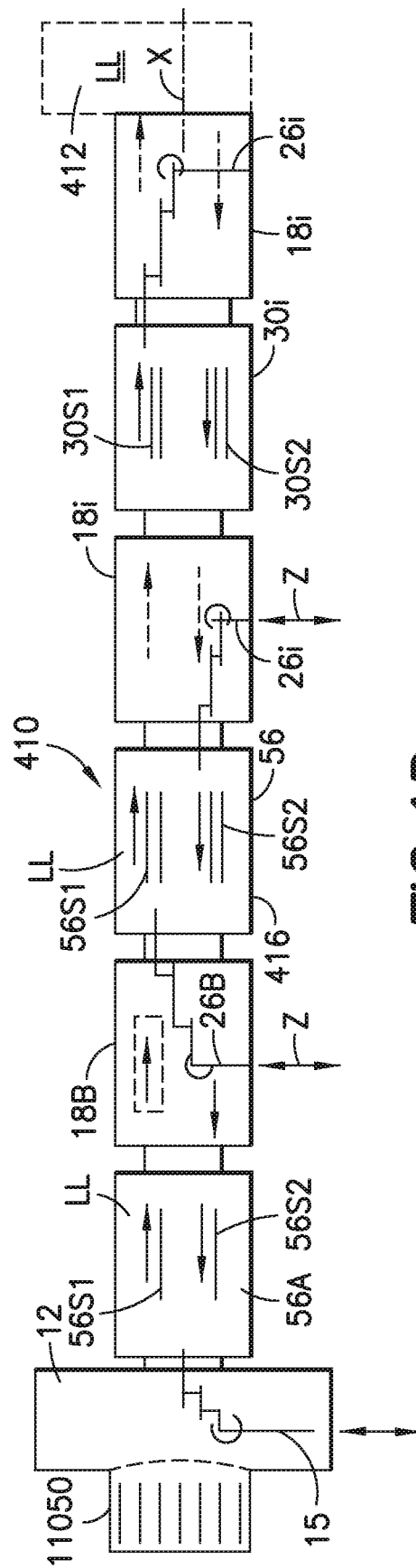

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18$i$. Each chamber module may be capable of holding an isolated or controlled atmosphere (e.g. N2, clean air, vacuum). As noted before, the configuration/arrangement of the transport chamber modules 18B, 18$i$, load lock modules 56A, 56 and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18$i$) may be configured to operate as a load lock.

Figure 2A:
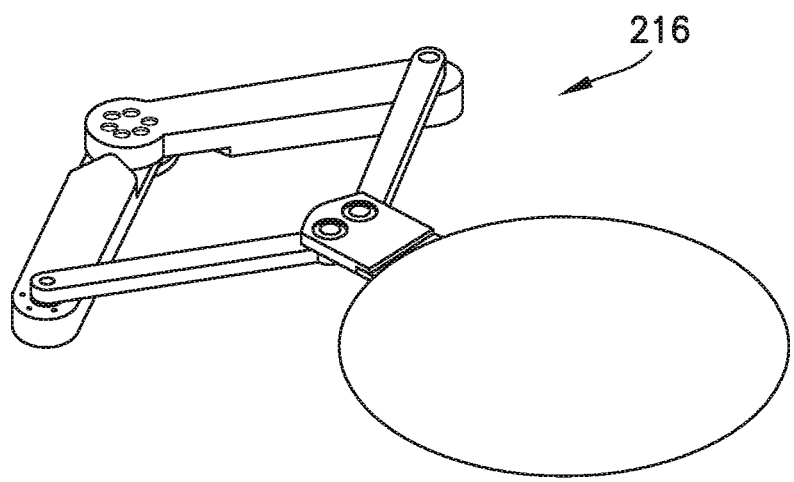
Figure 2B:
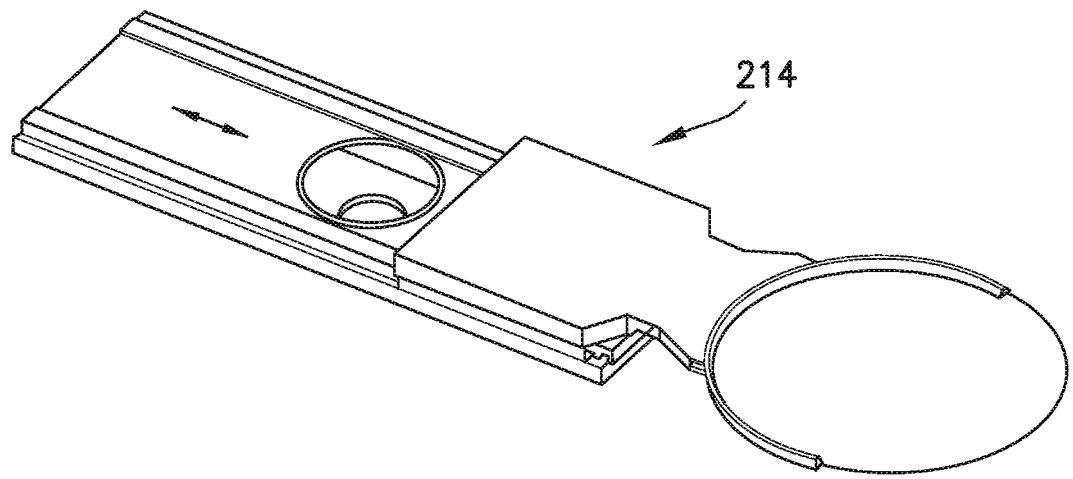
Figure 2C:
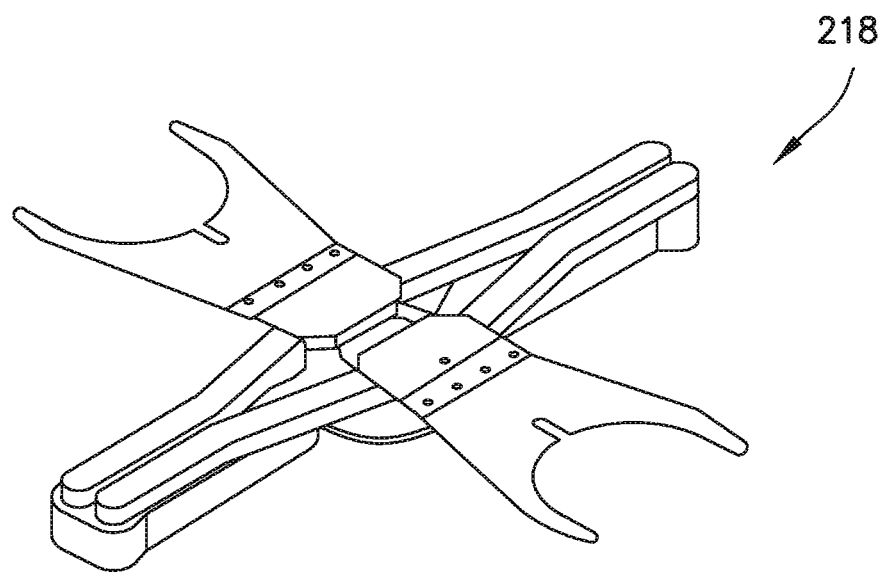
Figure 2D:
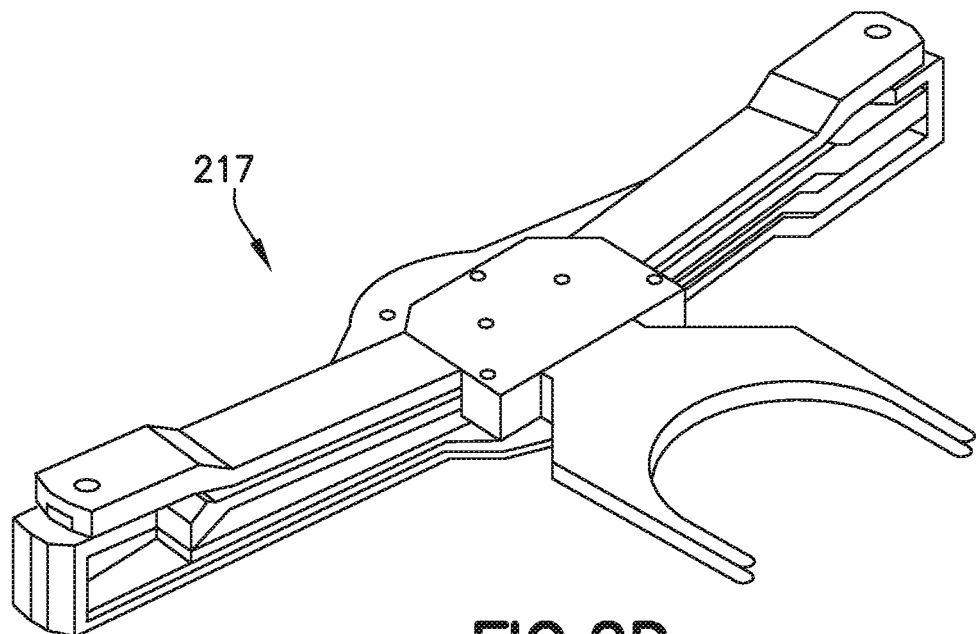

As also noted before, transport chamber modules 18B, 18$i$ have one or more corresponding transport apparatus 26B, 26$i$, which may include one or more aspects of the disclosed embodiment described herein, located therein. The transport apparatus 26B, 26$i$ of the respective transport chamber modules 18B, 18$i$ may cooperate to provide the linearly distributed workpiece transport system in the transport chamber. In this aspect, the transport apparatus 26B (which may be substantially similar to the transport apparatus 11013, 11014 of the cluster tool illustrated in FIGS. 1A and 1B) may have a general SCARA arm configuration (though in other aspects the transport arms may have any other desired arrangement such as, for example, a linearly sliding arm 214 as shown in FIG. 2B or other suitable arms having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm may be derived from a conventional SCARA (selective compliant articulated robot arm) type design, which includes an upper arm, a band-driven forearm and a band-constrained end-effector, or from a telescoping arm or any other suitable arm design. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2A) configuration, a leap frog arm 217 (FIG. 2D) configuration, a bi-symmetric arm 218 (FIG. 2C) configuration, etc. In another aspect, referring to FIG. 2E, the transfer arm 219 includes at least a first and second articulated arm 219A, 219B where each arm 219A, 219B includes an end effector 219E configured to hold at least two substrates S1, S2 side by side in a common transfer plane (each substrate holding location of the end effector 219E shares a common drive for picking and placing the substrates S1, S2) where the spacing DX between the substrates S1, S2 corresponds to a fixed spacing between side by side substrate holding locations. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties.

In the aspect of the disclosed embodiment shown in FIG. 1D, the arms of the transport apparatus 26B may be arranged to provide what may be referred to as fast swap arrangement allowing the transport to quickly swap wafers from a pick/place location as will also be described in further detail below. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about shoulder and elbow joints with Z axis motion). As seen in FIG. 1D, in this aspect the modules 56A, 56, 30$i$ may be located interstitially between transfer chamber modules 18B, 18$i$ and may define suitable processing modules, load lock(s) LL, buffer station(s), metrology station(s) or any other desired station(s). For example the interstitial modules, such as load locks 56A, 56 and workpiece station 30$i$, may each have stationary workpiece supports/shelves 56S1, 56S2, 30S1, 30S2 that may cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30$i$ with arm 26$i$ (in module 18$i$) and between station 30$i$ and station 412 with arm 26$i$ in module 18$i$. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates (the terms workpiece and substrates may be interchangeably used herein) to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 3:
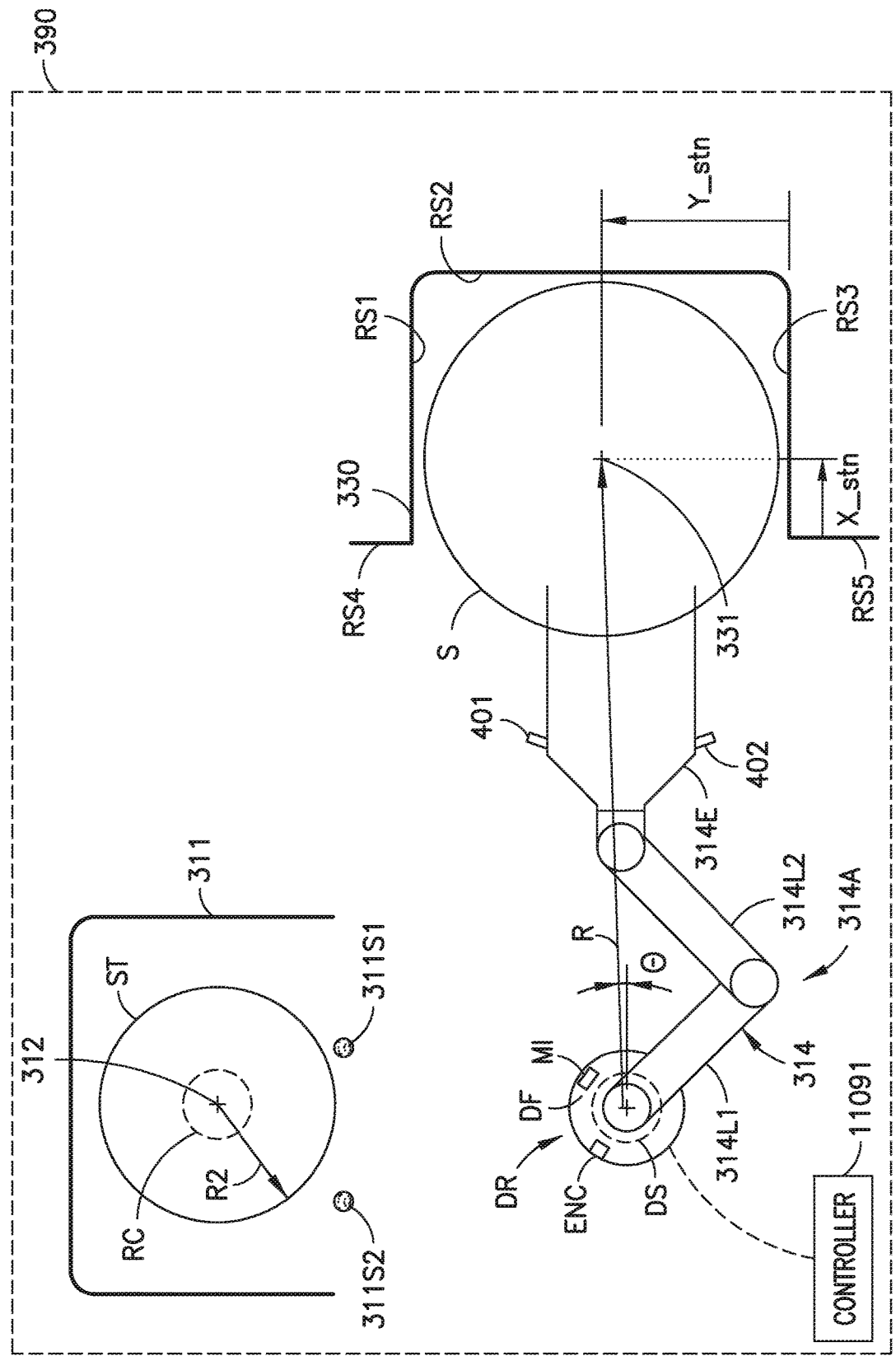
FIG. 3 is a schematic illustration of a portion of a substrate processing apparatus in accordance with aspects of the disclosed embodiment.

Referring now to FIG. 3, a schematic illustration of a portion of any suitable processing tool 390 is illustrated. Here the processing tool 390 is substantially similar to one or more of the processing tools described above. Here the processing tool includes at least one process module or station 330 (which is substantially similar to process modules 11030, PM described above) and at least one automatic wafer centering (AWC) station 311. The process module 330 is, in one aspect, a location within a vacuum environment of the processing tool 390 while in other aspects, the process module is a location within a controlled or isolated environment (e.g. an atmospheric environment) of the processing tool 390. The process module 330 includes or otherwise forms a substrate holding location 331. The substrate holding location 331 is located in a predetermined relationship with respect to one or more features of the process module 330 or any other suitable fixed location of the processing tool 390. In this aspect, for exemplary purposes, the fixed location corresponds to one or more reference surfaces RS1, RS2, RS3, RS4, RS5 of the process module 330. Here the substrate holding location 331 is disposed a distance Xstn from reference surface RS4, RS5 and a distance Ystn from reference surface RS3. The distances Xstn, Ystn represent process module coordinates where the aspects of the disclosed embodiment identify (or otherwise transform) these process module coordinates to transfer robot coordinates R, θ so that a substrate S (e.g. a production substrate) is placed by the transfer robot 314 (that is substantially similar to one or more of the transfer robots described above) at the substrate holding location 331. The term substrate is used herein for descriptive purposes and can have any construction. In some aspects the substrate is a silicon wafer or generally a wafer workpiece such as used for fabrication. In one aspect, the term substrate as used herein is not an article for material deposition (material is not deposited on the substrate) or wafer fabrication such as where the substrate is a non-fabrication substrate constructed of metal, plastic, glass, or an instrumentation substrate, etc. In other aspects, the substrate is a dummy wafer such as, for example, a carbon fiber dummy wafer. In one aspect, the dummy wafer may be any suitable finished article with a configuration similar to or representative of a process or teaching wafer as otherwise described herein. In some aspects, the substrate is selected to minimize particle generation upon contact with a reference surface. As seen in FIG. 13, the teaching substrate (or non-fabrication wafer-like article representing a fabrication wafer during teaching) may be selected from a number of different substrates. As may be seen from FIG. 13 that illustrates the substrate in different exemplary configurations 1302, 1304, 1306, 1308, 1310, 1312, in some aspects, the substrate is a different size (e.g. a smaller diameter) or a different shape than the production substrate. The teaching substrate ST can be any shape such as round, square, rectangular, oblong, irregular, etc. In some aspects, the teaching substrate ST or substrate S includes one or more integral projections p or fingers for making contact with reference surfaces of the tool. In other aspects, the teaching substrate ST or substrate S may be shaped to extend around one or more lift pins 1500-1502 in a manner similar to substrate 1550 illustrated in FIG. 15F to effect automatic wafer centering (AWC) and automatic teaching of substrate holding locations as described herein where at least one of the lift pins 1500-1502 forms a deterministic station feature similar to the deterministic station features 1610, 1611 described herein.

The at least one automatic wafer centering (AWC) station 311 includes any suitable sensors for determining, for example, at least an eccentricity of the substrate S relative to, for example, a predetermined location of the transfer robot end effector 314E. In one aspect the at least one AWC station 311 includes one or more sensors 311S1, 311S2 for detecting one or more of a leading edge and a trailing edge of the substrate S (and/or a teaching substrate ST as will be described below). The one or more sensors 311S1, 311S2 are any suitable sensors such as, for example, non-contact sensors (e.g. optical reflective sensors, through beam sensors, capacitive sensors, inductive sensors or any other suitable sensors), cameras and CCD arrays. As may be realized, while a pair (e.g. two) sensors 311S1, 311S2 are illustrated in FIG. 3 in other aspects the AWC station 311 includes any suitable number of sensors disposed in any suitable arrangement relative to each other and/or a substrate holding location 312 of the AWC station 311. In other aspects, the at least one AWC station 311 is configured to detect an alignment fiducial of the substrate S and includes a rotary chuck RC on which the substrate is placed (e.g. by the end effector 314E) for alignment of the fiducial and/or repositioning of the substrate S relative to the end effector 314E.

Figure 4:
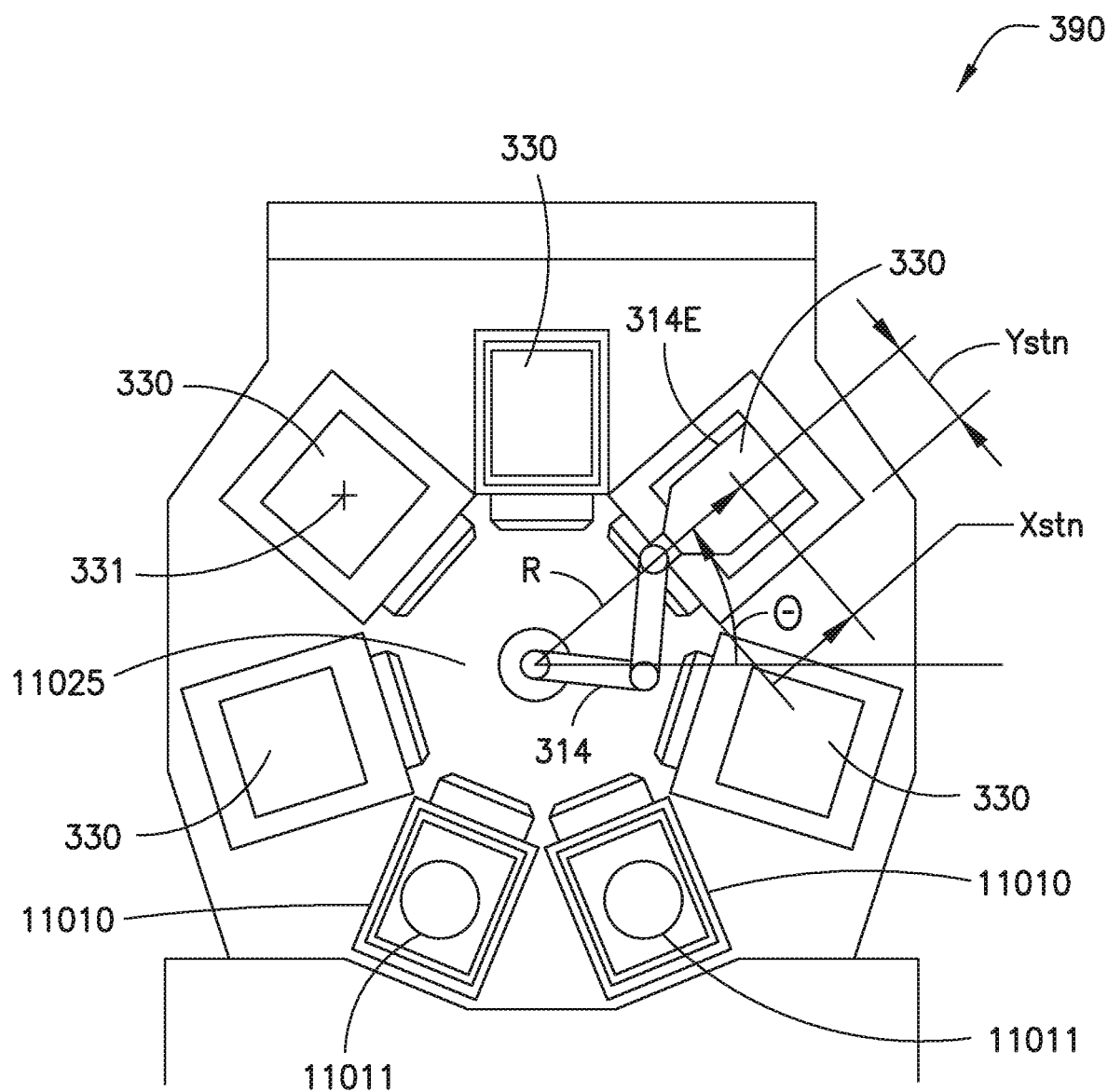
FIG. 4 is a schematic illustration of a portion of a substrate processing apparatus in accordance with aspects of the disclosed embodiment.

Referring now to FIGS. 3 and 4, an exemplary cluster processing tool layout is illustrated. The cluster processing tool is substantially similar to that illustrated in FIGS. 1A and 1B. While the aspects of the disclosed embodiment are described with respect to the cluster tool 390 it should be understood that the aspects of the disclosed embodiment described herein are equally applicable to the linear tools illustrated in FIGS. 1C and 1D. Generally, a position of the end effector 314E (e.g. in robot coordinates R, θ) is determined with, for example, feedback from suitable encoder(s) ENC of the transfer robot drive DR that are connected to drive shaft(s) DS that control movement of one or more of the arm links 314L1, 314L2 and end effector 314E of the transfer robot 314. In other aspects, the position of the end effector 314E is determined in any suitable manner with any suitable encoders/sensors disposed at any suitable location relative to the transfer robot 314.

For exemplary purposes, at least the process modules 330 are connected to the transfer chamber 11025 at about their respective nominal locations (e.g. the actual positon of the process modules 330 is determined as described herein) relative to the transfer robot 314. As may be realized, the nominal locations of at least the process modules 330 are known from, for example, CAD (computer aided drafting) models (or other suitable models) of the processing tool 390. In other aspects the locations of the process modules are known from as built measurements of the processing tool (or components thereof such as the process modules 330). The "robot home position" (e.g. the fully retracted position R of the transfer robot at a predetermined angle θ where R is substantially equal to a distance of 0 and θ is substantially equal to an angle of 0) is generally defined with a mechanical homing fixture between the robot arm(s) 314A and a robot drive flange DF. The drive flange DF generally includes a mechanical interface MI with precision locating features that position the robot home position at a known nominal location relative to the processing tool 390. In other aspects the robot home position is defined in any suitable manner. As such, initial or rough locations of at least each process module 330 in robot coordinates R, θ are provided to, for example, the controller 11091 based on the nominal locations (e.g. obtained from a model of the processing tool 390.

As may be realized the initial locations of the process modules 330 may not be accurate enough for the transfer robot 314 to pick or place a substrate S from a substrate holding location 331 of a process module 330. For example, errors due to mechanical tolerance in the robot homing fixture, encoder accuracy, motor/end effector compliance, arm link lengths, thermal expansion (or contraction) of transfer robot components and station components are some illustrative contributing factors for accuracy/positional errors. Referring to FIGS. 5A and 5B to compensate for the initial accuracy/position errors between the transfer robot positioning/coordinate system and the process module 330 locations, a smaller size substrate (e.g. teaching substrate ST) is employed to effect the automatic teaching of the disclosed embodiment. For example, the substrate S has a first size (radius R1) while the teaching substrate ST has a second size (radius R2) where radius R2 is smaller than radius R1 by any suitable amount so that the teaching substrate ST is capable of being detected by, for example, the sensors 311S1, 311S2 (or any other suitable sensors) of the AWC station 311. In one aspect the substrate S is a 300 mm wafer while the teaching substrate is a 200 mm wafer while in other aspects the substrate S and teaching substrate ST have any suitable sizes relative to each other. As can be seen in FIGS. 5A and 5B greater clearance is provided between the teaching substrate ST and, for example, walls/surfaces RS1, RS2, RS3 of the process module 330 (see FIG. 5B) than between the substrate S and the surfaces RS1, RS2, RS3 of the process module 330 (cee FIG. 5A). As may be realized, the smaller size of the teaching substrate ST (compared to the substrate S) allows the transfer robot 314 to insert the teaching substrate ST into the workspace domain of the process module 330 without interference (e.g. considering the accuracy errors between the robot coordinate system and the process module location noted above) between the teaching substrate ST and the surfaces RS1, RS2, RS3 due to, for example, the larger clearances provided by the smaller teaching substrate ST.

Figure 7:
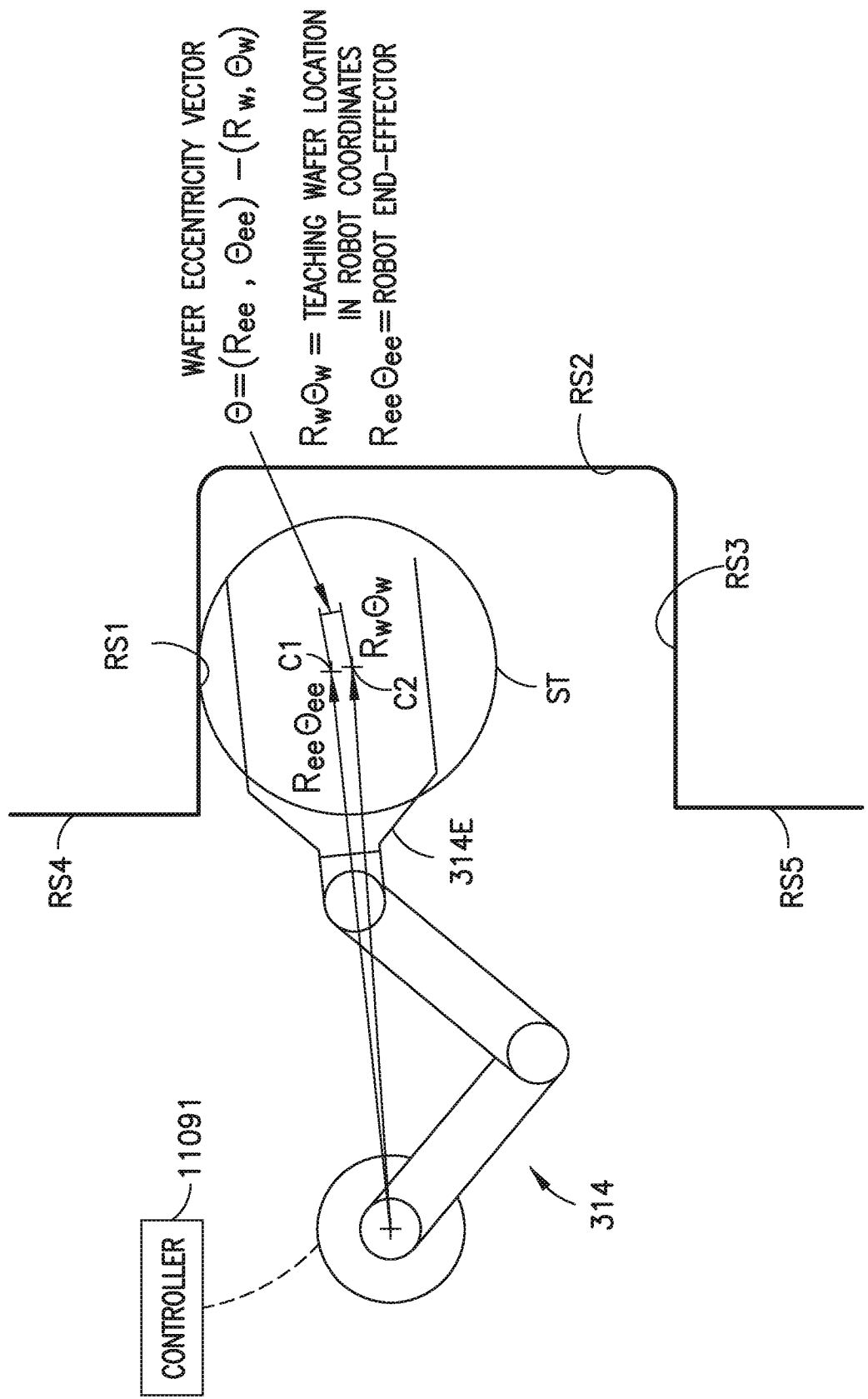
FIG. 7 is a schematic illustration of a portion of a substrate processing apparatus in accordance with aspects of the disclosed embodiment.
Figure 9:
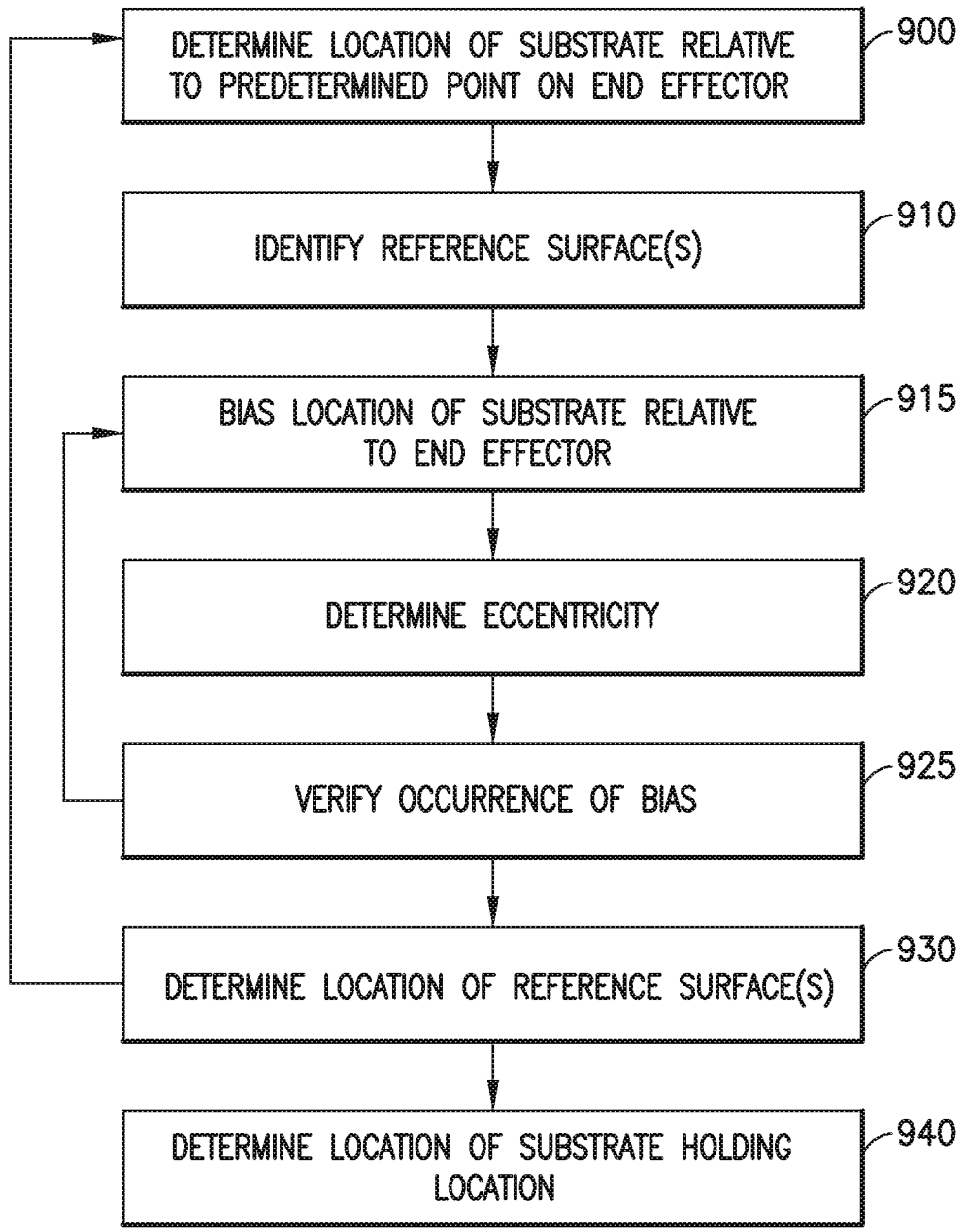
FIGS. 9 and 10 are flow charts of auto-teach processes in accordance with aspects of the disclosed embodiment.

Referring now to FIGS. 6 and 7 the automatic (e.g. without operator intervention) location or teaching of substrate holding stations will be described in accordance with aspects of the disclosed embodiment. To effect the automatic location of substrate holding stations the teaching substrate ST, it's center being identified, for example, by location C2 on the end effector 314E (whose center location is represented by location C1) of the transfer robot 314 with, for example, the AWC station 311 (or any other suitable alignment station) (FIG. 9, Block 900). In some aspects an initial offset may be induced between C1 and C2 locations. In one aspect the location C1 substantially corresponds to, for example a predetermined initial point on the end effector 314E (such as a center or any other suitable location including an offset) that has a known relationship with a center C2 of the teaching substrate (ST) of the end effector 314E having coordinates $R_{ee}$, $\theta_{ee}$ in the transfer robot coordinate system R, θ (e.g. transfer robot reference frame). The coordinates $R_{ee}$, $\theta_{ee}$ are, in one aspect obtained from transfer robot encoder feedback while in other aspects the coordinates $R_{ee}$, $\theta_{ee}$ are obtained in any suitable manner. In other aspects, with respect to the alignment between the teaching substrate ST and the end effector 314E, all that is needed is placement of the teaching substrate ST on the end effector 314E so that the teaching substrate ST is within a detection range of the AWC sensors 311S1, 311S2 (or within the range of the sensors of any other suitable alignment station). The position of the AWC sensors may be previously known, or the transfer robot may perform a base line pass with the teaching substrate to establish a reference datum (AWC sensor) position.

A location of one or more of the reference surfaces RS1-RS5 of the process module 330 are identified for determining the location of the substrate holding location 331 of the process module (FIG. 9, Block 910). As may be realized, each of the reference surfaces RS1-RS5 has a known location (e.g. from CAD models or as built measurements) relative to the substrate holding location 331 which allows for the determination of the substrate holding location coordinates Xstn, Ystn. For example, if a location and/or orientation of any non-parallel pair of reference surfaces RS1-RS5 is known, then the location of the substrate holding location 331 coordinates Xstn, Ystn can be determined relative to the non-parallel pair of reference surfaces RS1-RS5. In the identification of the one or more reference surfaces RS1-RS5 the transfer robot 314 moves the teaching substrate ST relative to a first one of the non-parallel pair of reference surfaces, such as for example, reference surface RS1, so as to induce a small mechanical interference between the teaching substrate ST and the first reference surface RS1 (FIG. 9, Block 915). This small mechanical interference is effected by instructing, such as with controller 11091, the transfer arm 314 to move the end effector in such a way so that the teaching substrate ST lightly taps (e.g. at reduced velocity or in order to minimize impact force) or otherwise engages the first reference surface RS1. Here the teaching substrate ST is biased by the reference surface RS1 so as to move relative to the end effector 314E on which the teaching substrate ST is carried to create a variance between location C1 and the resulting location C2 (e.g. a location of the center of the teaching substrate ST after the biased movement–a contact point) which has coordinates $R_w$, $\theta_w$ in the transfer robot coordinate system R, θ.

As may be realized, the location C2 of the teaching substrate ST, after being biased by the reference surface RS1, relative to the end effector coordinates $R_{ee}$, $\theta_{ee}$ is not known from the transfer robot encoder feedback. As such, an eccentricity vector $e=(R_{ee}, \theta_{ee})-(R_w, \theta_w)$ is measured by, for example moving the substrate to the AWC station 311 or any other suitable alignment station (FIG. 9, Block 920). As may be realized, the location of the teaching substrate ST at the second location or contact point C2 ($R_w$, $\theta_w$) is known as ($R_w$, $\theta_w$)=($R_{ee}$, $\theta_{ee}$)-e. In one aspect, it is determined whether contact was made between the reference surface RS1 and the teaching substrate ST (FIG. 9, Block 925). For example, a comparison is made between an eccentricity vector $e_{bf}$ before teaching substrate contact with the reference surface RS1 and an eccentricity vector $e_{af}$ after teaching substrate contact with the reference surface RS1. In one aspect, the eccentricity vector $e_{bf}$ is measured when the teaching substrate ST is substantially centered on the end effector 314E (see FIG. 9, Block 900) while in other aspects the eccentricity $e_{bf}$ is measured at any suitable time before the teaching substrate ST contacts the reference surface RS1. As may be realized, the eccentricity vector $e_{af}$ is measured after an attempt to make contact between teaching substrate ST and the reference surface RS1. The condition to detect contact is defined as $(e_{af}-e_{bf})$>tolerance where the tolerance is the acceptable predetermined eccentricity measurement tolerance/error (or any other suitable substrate) on the end effector 314E. If the condition to detect contact is not met another attempt to establish contact between the teaching substrate ST and the same reference surface RS1 at the same location $R_{ee}$, $\theta_{ee}$ is performed (see FIG. 9, Blocks 915-925) and continues to be repeated until contact is established at that location $R_{ee}$, $\theta_{ee}$. Once contact is established the location of the reference surface RS1 at the point $R_{ee}$, $\theta_{ee}$ is determined (FIG. 9, Block 930) based on, for example, a known diameter/radius of the teaching substrate, the eccentricity vector e and the end effector coordinates $R_{ee}$, $\theta_{ee}$.

As may be realized, to determine the coordinates Xstn, Ystn of the substrate holding location 331 in robot coordinates R, e a location and/or orientation of a second reference surface RS1-RS5 is determined in a manner substantially similar to that described above (FIG. 9, Block 900-930) where the second reference surface RS1-RS5 is oriented to cross or intersect (e.g. substantially perpendicular) to the first reference surface RS1-RS5. As an example, in the above scenario the first reference surface is reference surface RS1 which allows one or more of the reference surfaces RS2, RS4, RS5 to serve as the second reference surface. Determining the location of two intersecting reference surfaces provides the location of a station reference point SRP1, SRP2, SRP3, SRP4 (e.g. an intersection between the two reference surfaces which may be offset from (see reference lines RL1, RL2, RL3, RL4, RL5) an actual intersection of the two reference surfaces by an amount equal to the teaching substrate ST radius R2) that has a known relationship with the substrate holding location Xstn, Ystn (in process module coordinates) such that the location of the substrate holding location Xstn, Ystn in robot coordinates R, θ is determined in any suitable manner (FIG. 9, Block 940). For exemplary purposes only, depending on the determined station reference point SRP1, SRP2, SRP3, SRP4 the incremental distances ΔX, ΔY (e.g. in the process module coordinate system, determined from the known relationship between the substrate holding location 331 and the reference points SRP1-SRP4, see FIG. 8) are added to or subtracted from the coordinates of the determined station reference point SRP1 ($X_{SRP12}$, $Y_{SRP14}$), SRP2 ($X_{SRP12}$, $Y_{SRP23}$), SRP3 ($X_{SRP34}$, $Y_{SRP23}$), SRP4 ($X_{SRP34}$, $Y_{SRP14}$).

Figure 8:
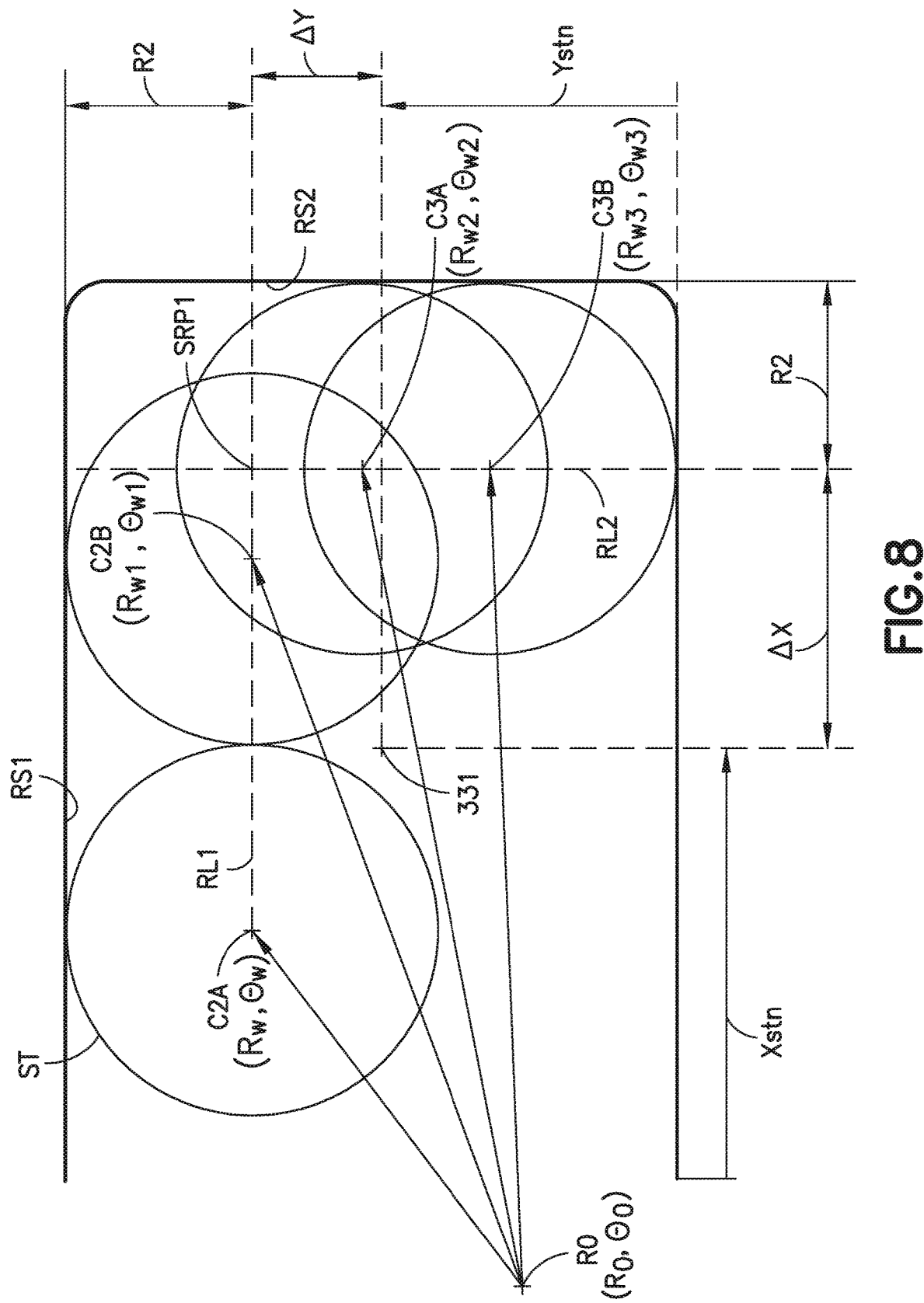
FIG. 8 is a schematic illustration of a portion of a substrate processing apparatus in accordance with aspects of the disclosed embodiment.
Figure 10:
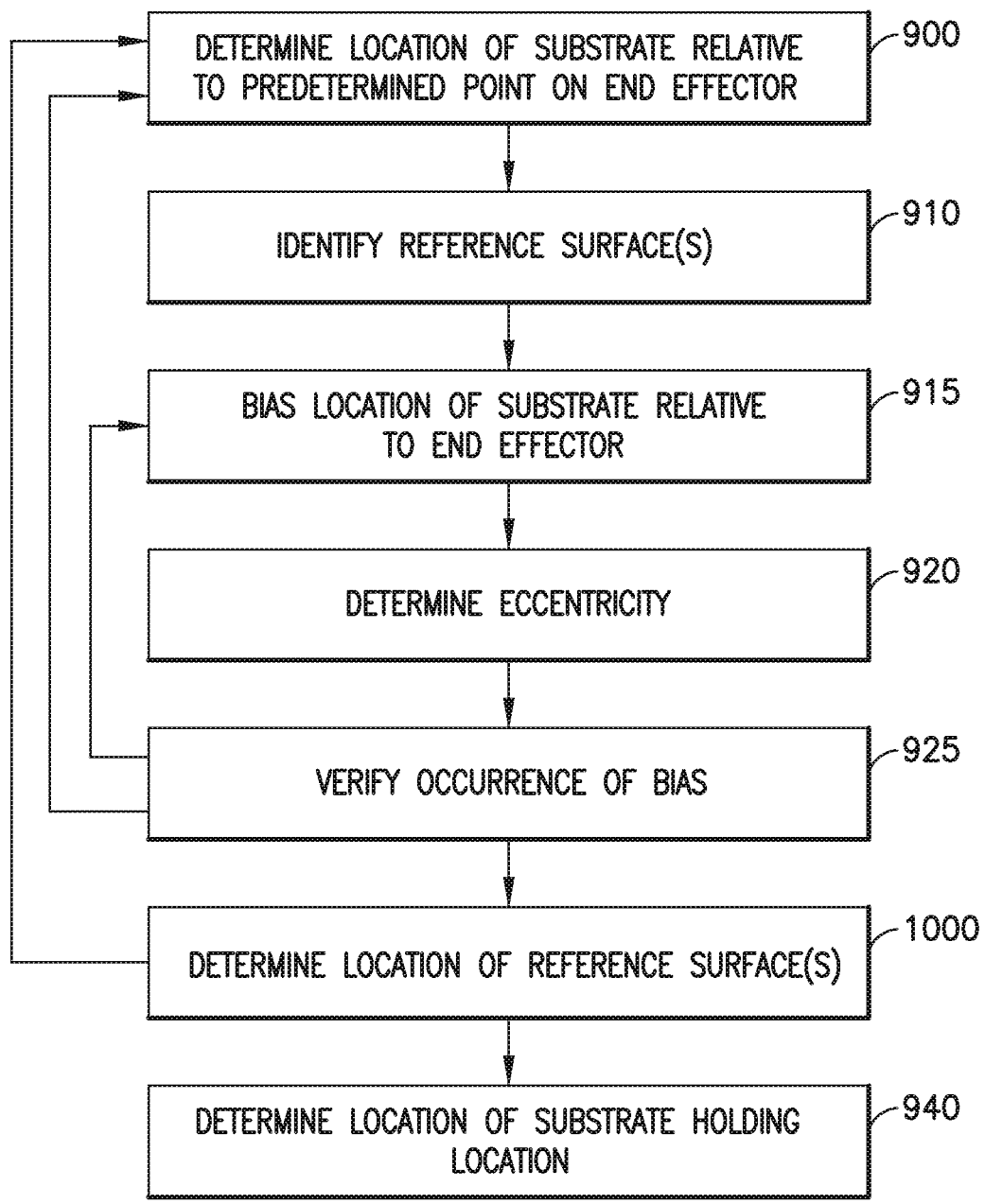

As may be realized, in one aspect one or more contact points along a common reference surface are used to determine the location of the common reference surface. Referring now to FIG. 8, the reference surface RS1 is determined by identifying two or more contact points C2A (having coordinates $R_W$, $\theta_W$), C2B (having coordinates $R_{W1}$, $\theta_{W1}$). For example, a first contact point C2A is identified with respect to reference surface RS1 in a manner substantially similar to that described above (FIG. 10, Blocks 900-925) and at least a second contact point C2B is also identified with respect to reference surface RS1 in a manner substantially similar to that described above (FIG. 10, Blocks 900-925). Once the two or more contact points C2A, C2B are established, a reference line or contour RL1 is calculated based on the coordinates of the two or more contact points C2A, C2B and a location and orientation of the reference surface RS1 is established (FIG. 10, Block 1000). As may be realized, the contact points C2A, C2B establish a respective reference line or contour RL1 that is substantially parallel to and offset from (e.g. by a distance substantially equal to a radius R2 of the teaching substrate ST) the reference surface RS1 (which is common to the contact points C2A, C2B). In one aspect the reference line or contour RL1 is calculated with a Least-squares Fit using a measured sample larger than 2 or in any other suitable manner. The location and orientation of the reference surface RS1 is determined in any suitable manner from the location and orientation of the reference line RL1 and the known radius R2 of the teaching substrate ST.

In a manner similar to that described above the location and orientation of a second reference surface RS1-RS5 (substantially perpendicular to the first reference surface) is determined to establish one or more of the station reference points SRP1-SRP3. As an example, in the above scenario the first reference surface is reference surface RS1 which allows one or more of the reference surfaces RS2, RS4, RS5 to serve as the second reference surface. As an example, the reference surface RS2 is determined by identifying two or more contact points C3A (having coordinates $R_{W2}$, $\theta_{W2}$), C3B (having coordinates $R_{W3}$, $\theta_{W3}$). For example, a first contact point C3A is identified with respect to reference surface RS2 in a manner substantially similar to that described above (FIG. 10, Blocks 900-925) and at least a second contact point C3B is also identified with respect to reference surface RS2 in a manner substantially similar to that described above (FIG. 10, Blocks 900-925). Once the two or more contact points C3A, C3B are established, a reference line or contour RL2 is calculated based on the coordinates of the two or more contact points C3A, C3B and a location and orientation of the reference surface RS2 is established (FIG. 10, Block 1000). As may be realized, the contact points C3A, C3B establish a respective reference line or contour RL2 that is substantially parallel to and offset from (e.g. by a distance substantially equal to a radius R2 of the teaching substrate ST) the reference surface RS2 (which is common to the contact points C3A, C3B). In one aspect the reference line or contour RL2 is calculated with a Least-squares Fit using a measured sample larger than 2 or in any other suitable manner. The location and orientation of the reference surface RS2 is determined in any suitable manner from the location and orientation of the reference line RL2 and the known radius R2 of the teaching substrate ST.

As described above, determining the location of two perpendicular reference surfaces or reference lines RL1-RL5 provides the location of a station reference point SRP1, SRP2, SRP3, SRP4 (e.g. an intersection between the two reference surfaces which may be offset (see e.g. reference lines RL1, RL2) from an actual intersection of the two reference surfaces by an amount equal to the teaching substrate ST radius R2) that has a known relationship (e.g. from CAD models or as built measurement) with the substrate holding location Xstn, Ystn (in process module coordinates) such that the location of the substrate holding location Xstn, Ystn in robot coordinates R, θ is determined in any suitable manner (FIG. 10, Block 940). For exemplary purposes only, depending on the determined station reference point SRP1, SRP2, SRP3, SRP4 the incremental distances ΔX, ΔY (e.g. in the process module coordinate system, determined from the known relationship between the substrate holding location 331 and the reference points SRP1-SRP4) are added to or subtracted from the coordinates of the determined station reference point SRP1 ($X_{SRP12}$, $Y_{SRP14}$), SRP2 ($X_{SRP12}$, $Y_{SRP23}$), SRP3 ($X_{SRP34}$, $Y_{SRP23}$), SRP4 ($X_{SRP34}$, $Y_{SRP14}$) (see FIG. 6A).

As may be realized, the determined location of the substrate holding location 331 in process module coordinates X, Y is translated to transfer robot coordinates R, θ in any suitable manner. For example, the location of each of the station reference points SRP1-SRP4 are known in process module coordinates from for example, a CAD model of the processing tool 390. As such, the location of the substrate holding location Xstn, Ystn is known relative to each of the station reference points SRP1-SRP4. The reference lines RL1-RL5 (and the corresponding station reference points SRP1-SRP4) allow for the identification of the transformation between the transfer robot coordinates system R, θ (and the tool coordinate system) and the process module coordinate system X, Y given the teaching substrate radius R2.

In one aspect the locations of two or more reference surfaces are determined and compared to determine the parallelism (e.g. of side reference surface RS1 with side reference surface RS3, of front reference surface RS4 and/or RS5 with back reference surface RS2 and/or of front reference surface RS4 with front reference surface RS5) and/or perpendicularity of the references surfaces (e.g. of side reference surfaces RS1 and/or RS3 with one or more of front reference surface RS4, RS5 and back reference surface RS2). In addition, the location determination of two or more reference surfaces provides for the validation/confirmation of the substrate holding location 331. For example, the location of the substrate holding location 331 is determined in a first calculation/determination from reference surfaces RS1 and RS2 as described above and verified in a second calculation/determination by determining the location of the substrate holding location 331 using, for example, reference surfaces RS3 and RS5 in a manner substantially similar to that described above. As will be described below, in one aspect, the results of the first and second calculations/determinations are merged or otherwise averaged to define the location of the substrate holding location 331 (or any other suitable station features of the process module 330) based on the known dimensional relationships between the reference surfaces and the substrate holding location 331 (or other suitable station features).

Figure 5E:
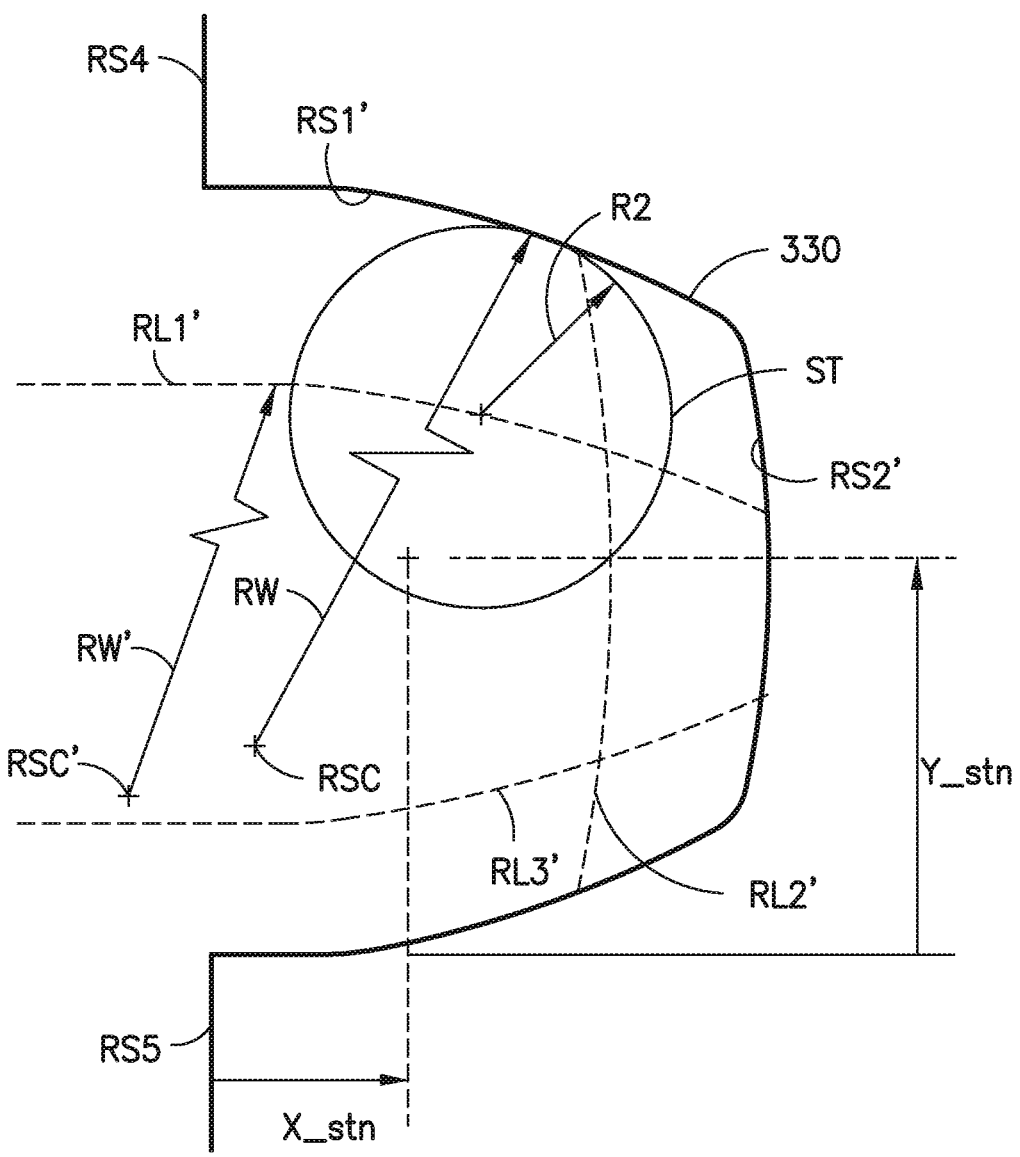

As may be realized, the reference surfaces of the process module 330 are described herein as the side, front and back walls of the process module 330 however, in other aspects the reference surfaces are teaching features of the walls such as contoured position deterministic features RS1F1, RS1F2, RS2F1, RS2F2, RS3F1, RS3F2, etc. (see FIG. 5B—e.g. such as one or more shapes of or on the wall, one or more pins, one or more protrusions, etc.) that cause a deterministic eccentricity vector e (e.g. the vector direction and magnitude when starting from predetermined initial substrate locations is constant and does not vary with a contact angle between the teaching substrate and surface) and the eccentricity vector e is determinative or defines the shape of the wall when, for example, the teaching substrate ST taps the contoured position deterministic features. For example, referring to FIG. 5C, the wall 330W of the process module 330 (which may be a side, front or back wall) is shaped so as to provide contoured position deterministic (e.g. contact with a dimensionally known substrate, from a known position on the end effector, produces a deterministic position relative to contoured features) features F1, F2 which are in the form of one or more pairs of protrusions. FIG. 5D, for exemplary purposes, illustrates the wall 330W having contoured position deterministic features F1, F2 which are in the form of one or more pin couples (e.g. two pins form each features F1, F2). As may be realized, the contoured position deterministic features F1, F2 are in a known position with respect to the wall 330W on which they are located and/or in a known location with the substrate holding location 331. As such, when the teaching substrate ST is brought into contact with one or more contoured position deterministic feature F1, F2 (in a manner substantially similar to that described above) the eccentricity vector e remains constant relative to the one or more contoured position deterministic feature F1, F2 while the angularity of the eccentricity vector e changes relative to the end effector 314E as the teaching substrate ST is moved (through contact with the one or more contoured position deterministic feature F1, F2) relative to the end effector. For example, when the teaching substrate taps the contoured position deterministic features F1, F2 the eccentricity vector e1, e2 is measured by, for example, the AWC station 311. The eccentricity vector e1, e2 is used to determine the location of the end effector relative to the teaching substrate ST and the wall(s) 330W for determining the location of the substrate holding location 331 as described herein. As may be realized, the contoured position deterministic features F1, F2 are, in one aspect, integrated or inherent in the configuration of the process module 330 structure (e.g. part of the walls 330W) or, in other aspects, the contoured position deterministic features are added to process module PM structure. As may also be realized, the contoured position deterministic features F1, F2 are positioned so as not to interfere with the transfer of substrates S to and from the process module 330 or with the processes performed within the process module 330.

Referring also to FIG. 5E, the walls of the process module 330 are contoured so as to define a non-deterministic curved wall or surface (e.g. the radius R2 of the substrate ST is smaller than the radius RW of the wall such that the location of the substrate upon contacting the wall lacks a predetermined relation with the substrate holding location Xstn, Ystn) where each curved wall RS1', RS2', RS3' has a respective radius RW and a center point RSC, shown with respect to wall RS1' for exemplary purposes only. Each center point RSC has a predetermined spatial relationship with respect to the substrate holding location Xstn, Ystn such that when the center point RSC is determined the location of the substrate holding location Xstn, Ystn is also known. In one aspect, the center point RSC is determined in a manner substantially similar to that described above, such as by determining more than one point along one or more walls RS1', RS2', RS3' to determine one or more reference lines RL1', RL2', RL3' (that are, e.g., similar to reference lines RL1, RL2, RL3, RL4 in FIG. 6). The reference lines RL1', RL2', RL3' have radii RW' that correspond to the respective radii RW of the walls RS1', RS2', RS3' and as such the center point RSC' of the reference lines RL1', RL2', RL3' has a known predetermined relation with the respective center point RSC of the wall RS1', RS2', RS3'. In one aspect, because each curved wall RS1', RS2', RS3' (and the respective reference line RL1', RL2', RL3') provides a center point RSC, RSC' that is in a known relationship with the substrate holding location Xstn, Ystn, once the center point (either RSC or RSC') is determined for one of the walls RS1', RS2', RS3' the location of the substrate holding location Xstn, Ystn can be determined. In other aspects, the center point RSC, RSC' for subsequent walls is determined to, for example, verify the location of the substrate holding location Xstn, Ystn.

Figure 11B:
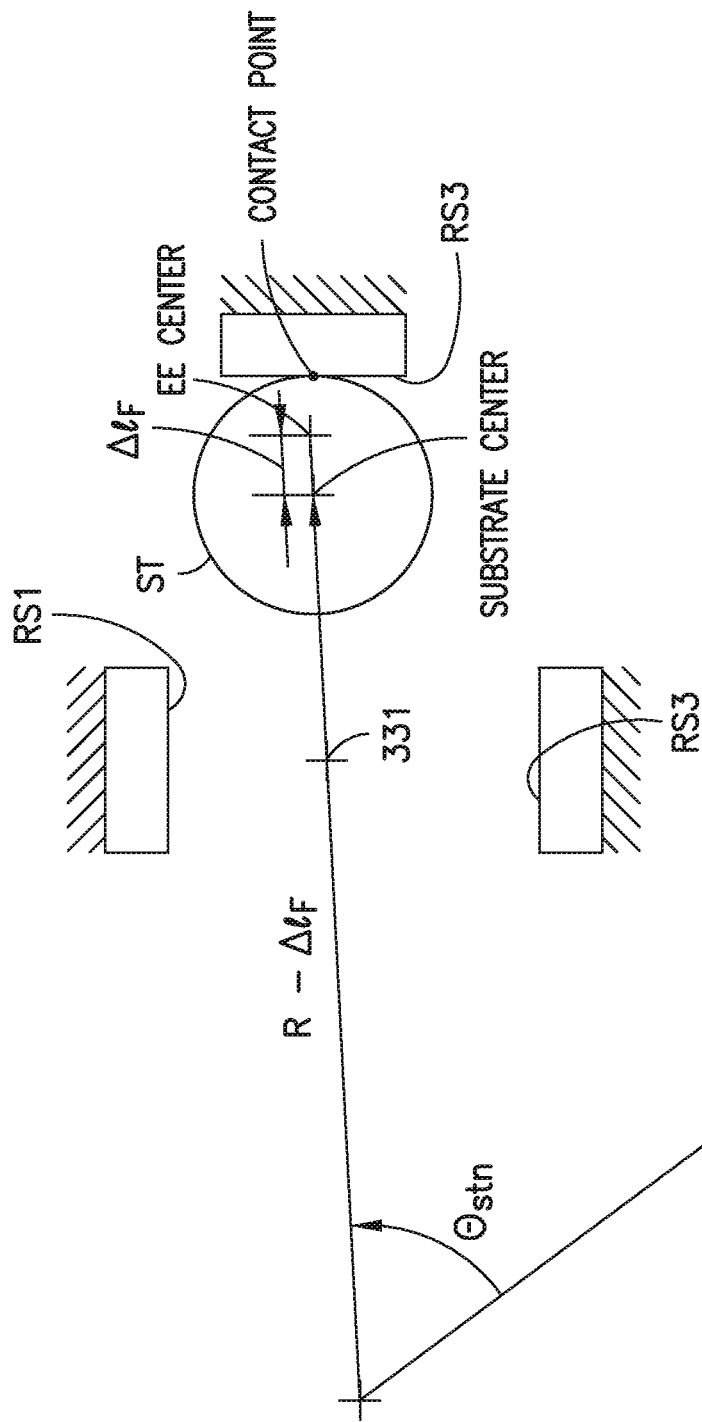
Figure 12:
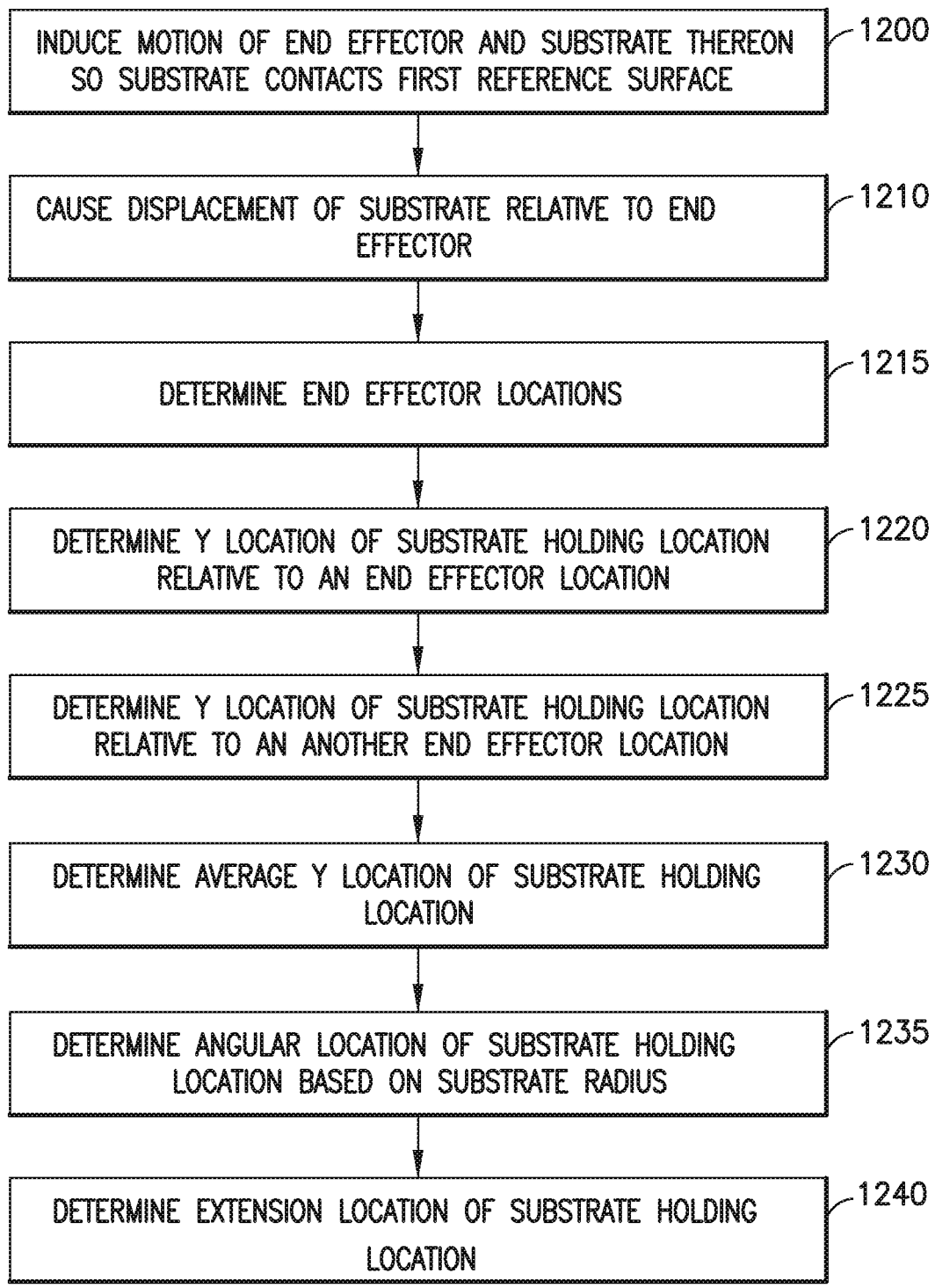
FIG. 12 is a flow chart of an auto-teach process in accordance with aspects of the disclosed embodiment.

Referring now to FIGS. 11 and 11A-11B, an exemplary auto-teach calculation will be described in accordance with one or more aspects of the disclosed embodiment. In the exemplary auto-teach calculation described herein the substrate holding location 331 will be determined with the teaching substrate ST with respect to reference surfaces RS1, RS2, RS3 where at least the θ location of the substrate holding location is determined without reliance on the known relational dimensions of the process module 330 where the result of the position determination of the substrate holding location 331 is verified. As can be seen in the figures points $R_1$, $θ_1$ and $R_2$, $θ_2$ are illustrated the wafer center locations at the contact point with reference surfaces RS1 and RS2, respectively. Locations $R_1$, $θ_1$ and $R_2$, $θ_2$ can be determined as described by the method in FIG. 12. The auto-teach calculation is, in one aspect, divided into a theta auto-teach portion and a radial auto-teach portion where end effector 314E (see e.g. FIG. 3) and hence teaching substrate ST (or any other suitable substrate) motion is induced (FIG. 12, Block 1200) to purposely establish contact between the teaching substrate ST and the reference surface(s), thereby causing the teaching substrate ST to slide or otherwise move relative to the end effector 314E (FIG. 12, Block 1210). The location of the angular location $θ_{ST}$ of the substrate holding location 331 can be determined (FIG. 12, Block 1235) by averaging the angular locations of each contact point $θ_1$ and $θ_2$ as in:

$$θ_{STN} = \left[\frac{θ_1 + θ_2}{2}\right] \quad [1]$$

The radial location $R_{STN}$ of the substrate holding location 331 is determined (FIG. 12, Block 1240) using $θ_{STN}$ where the transfer robot 314 is rotated so that an axis of extension/retraction of the end effector is along a direction corresponding to $e_{STN}$ as can be seen in FIG. 11E can be determined based on the radius of the teaching substrate. Here end effector 314E (and teaching substrate ST) motion is induced generally in the X direction to purposely establish contact between the teaching substrate ST and the reference surface RS3, thereby causing the teaching substrate ST to slide or otherwise be displaced by an amount $Δl_F$ relative to the end effector 314E. The radial contact between the teaching substrate ST and the reference surface RS3 occurs at a radial extension of $R-Δl_F$, where $Δl_F$ is the displacement (as determined by AWC station 311 and/or by any suitable sensors mounted on the end effector or any other eccentricity measuring method (aligner perhaps)) of the teaching substrate ST relative to the end effector 314E at an angle of extension/retraction of $θ_{STN}$ and where R is chosen to assure contact of the teaching substrate ST with the reference surface RS3 so that the origin of the distance X is determined. It is noted that point 3 (e.g. $R_3$, $θ_3$) in FIGS. 11A and 11B corresponds to the location $(R-Δl_F)$, $θ_{STN}$. As such, the extension location $R_{STN}$ of the substrate holding location 331 is determined based on the radius r of the teaching substrate ST with the following equation $$R_{STN} = X - r \quad [2]$$

Figure 15A:
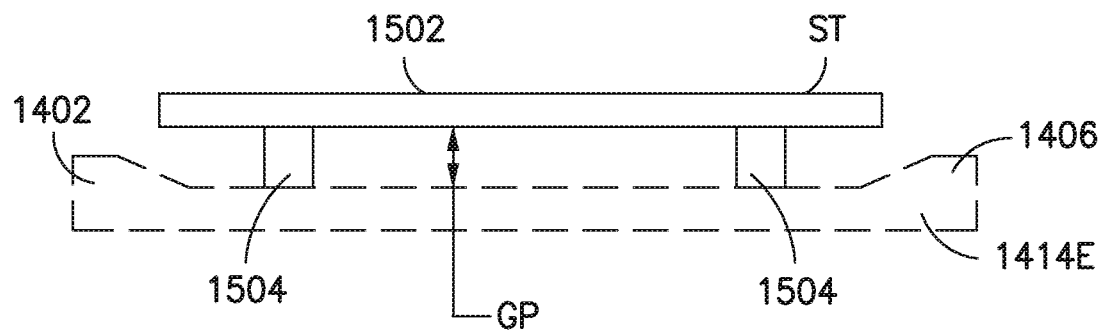
FIGS. 15A-15F are schematic elevation and perspective views respectively illustrating different features of the teaching substrate in relation to the end effector pursuant to aspects of the disclosed embodiment.
Figure 15B:
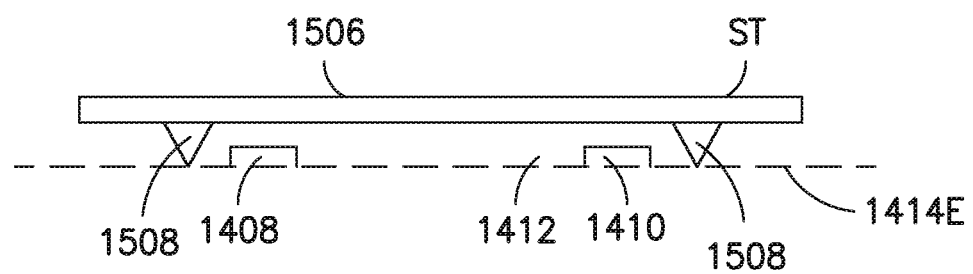
Figure 15C:
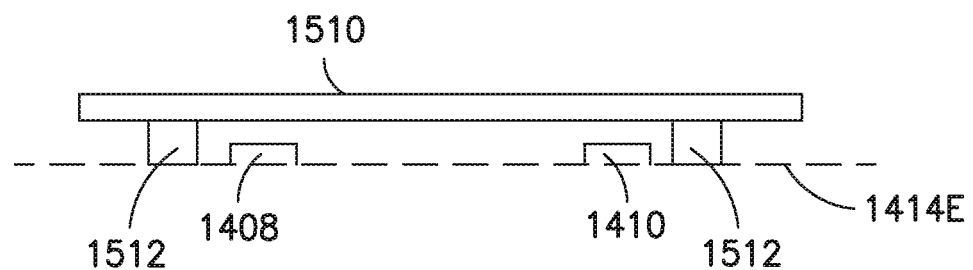
Figure 15D:
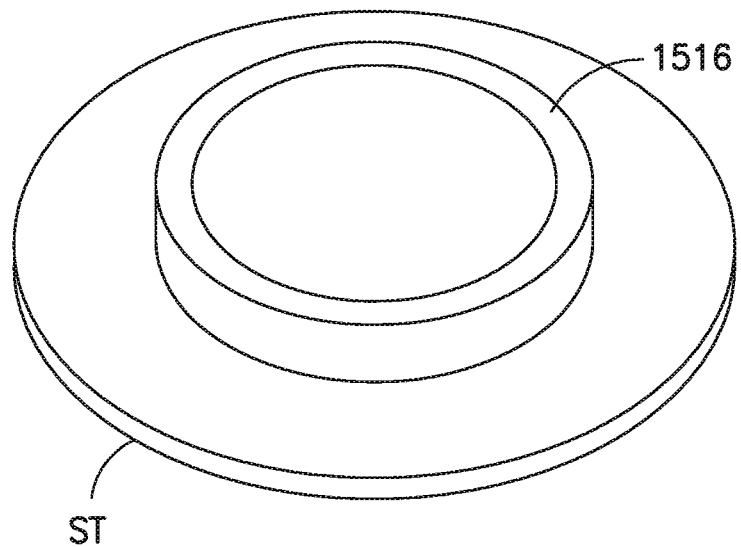
Figure 15E:
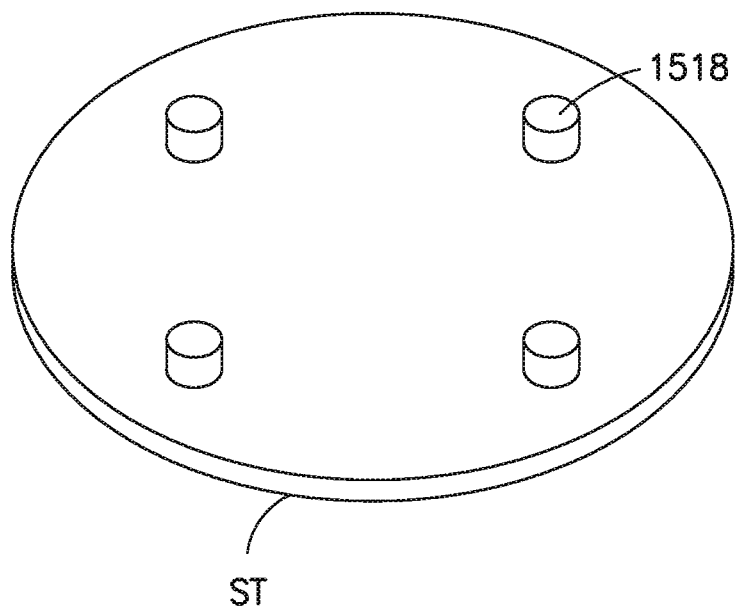
Figure 15F:
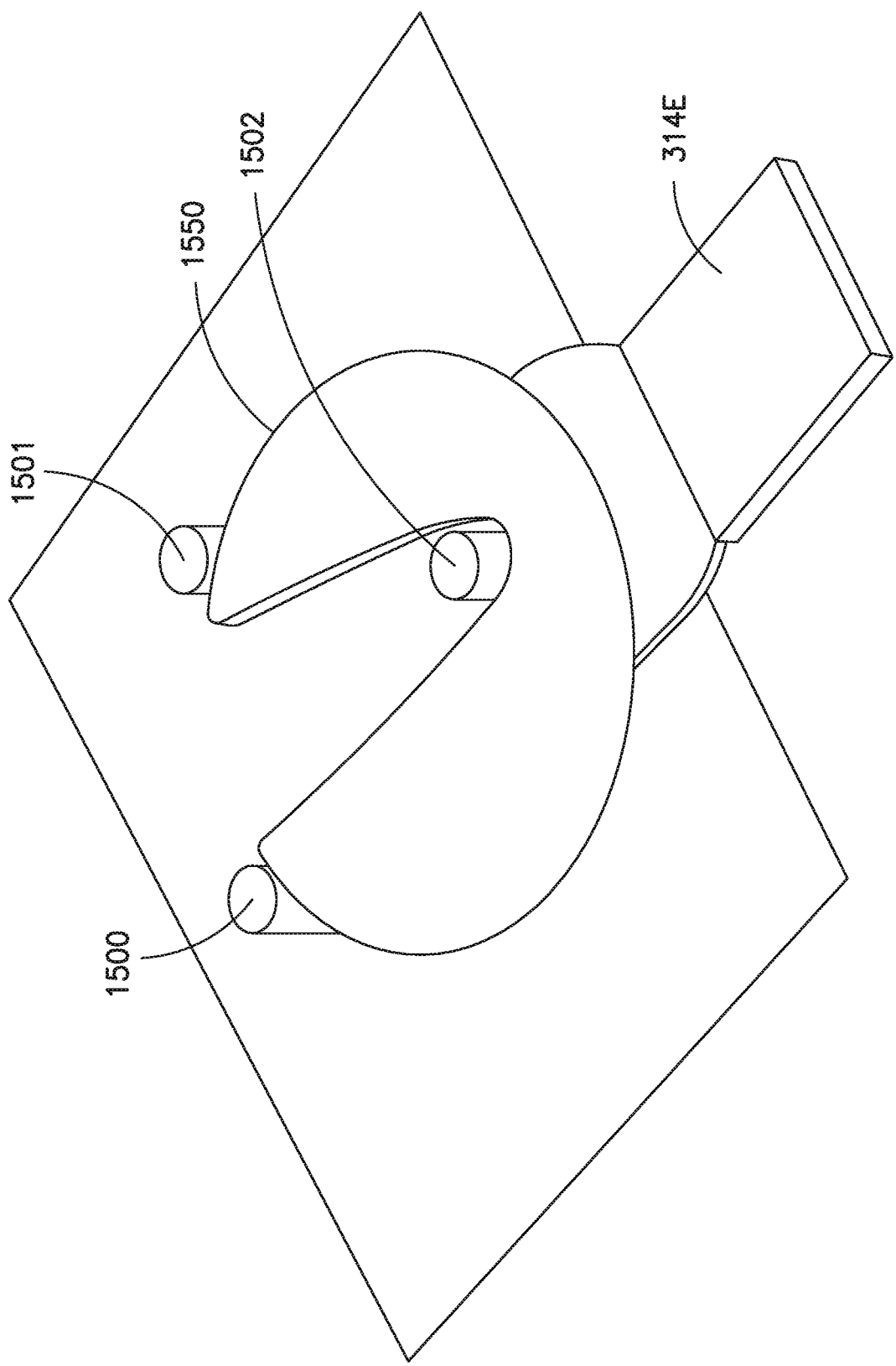

Referring now also to FIGS. 14A-14B, there is shown respective plan views of an end effector 1414E, 1414E' such as may be included in the substrate transport apparatus or robot 314 (see FIG. 3) of the processing apparatus as previously described. As may be realized, the end effector 1414E, 1414E' may include a suitable chuck 1414C, 1414C' (e.g. a passive ease gripping chuck 1414C, with substrate ease gripping features 1402-1406, a representative example of which is shown in FIG. 14A). In accordance with another aspect, the end effector 1414E' may have substrate engagement pads 1408-1412, disposed to engage a backside of the substrates, handled by the robot during production, as illustrated in FIG. 14B. In accordance with one aspect of the disclosed embodiment, the teaching substrate ST, has effector offset features that position the teaching substrate ST on the end effector with a vertical offset or gap GP formed between the substrate ST and chuck 1414C, 1414C' of the end effector 1414E, 1414E'. This is illustrated in FIGS. 15A-15C, which show respective views of the teaching substrate ST seated on the end effector 1414E, 1414E' in accordance with different aspects. The bottom of the teaching substrate ST (FIGS. 15A-15C illustrate different representations of the teaching substrate 1502, 1506, 1510) has projection 1504, 1508, 1512 configured to engage the end effector, and stably support the teaching substrate ST thereon, without engagement between the teaching substrate ST and chuck features of the end effector. This facilitates slip between the teaching substrate and end effector, unrestrained by the substrate retention features of the chuck 1414C, 1414C'. The offset features or projection of the teaching substrate may be configured to minimize engagement forces/bias (e.g. friction) between teaching substrate and end effector (e.g. projection 1504, 1508, 1512 in FIGS. 15A-15B. As seen from FIGS. 15D-15E, showing bottom perspective views of teaching substrates ST, the projection features 1516, 1518 may be suitably distributed on the teaching substrate so that gripping forces are evenly distributed on the projections resulting in uniform slip 108 in a single linear direction between substrate and end effector. The projection may be integrally formed with the substrate, or added thereto. In other aspects, the chuck on the end effector may be modified to resolve the engagement feature with the teaching substrate.

Referring now to FIG. 16, a station auto-teach process will be described in accordance with an aspect of the present disclosure. In one aspect at least two deterministic station features 1610, 1611 are located in a known relation relative to a substrate holding location $X_{stn}$, $Y_{stn}$ to effect auto-teaching the substrate holding location $X_{stn}$, $Y_{stn}$ in situ to the substrate holding station such as the portion of processing tool 1600 as described herein. The portion of the processing tool 1600 is, in one aspect, substantially similar to process modules 11030, PM described above. In this aspect, the portion of a processing tool 1600 includes two chambers 1601, 1602 where each chamber 1601, 1602 includes stacked substrate holding supports 1620A, 1620B corresponding to respective substrate holding locations (e.g. located one above the other at $X_{stn}$, $Y_{stn}$). In other aspects, each chamber 1601, 1602 includes more or less than two substrate holding supports. In this aspect each substrate holding support 1620A, 1620B is a split support having a portion 1620A1, 1620B1 on one side of the chamber 1601 and a portion 1620A2, 1620B2 on an opposing side of the chamber 1601 where a passage is disposed between the portions 1620A1, 1620A2 and 1620B1, 1620B2 to, for example, allow an end effector to pass between the portions 1620A1, 1620A2 and 1620B1, 1620B2. In other aspects, the substrate holding supports are a continuous support spanning between opposing sides of the chamber 1601, 1602. Here the substrate holding supports 1620A, 1620B are edge gripping supports configured to grip an edge of a substrate placed on the respective substrate holding supports 1620A, 1620B while in other aspects one or more of the substrate holding supports 1620A, 1620B includes substrate lift pins, such as lift pins 1500-1502 illustrated in FIG. 15F for supporting a substrate.

In one aspect, the deterministic station features 1610, 1611 are connected to a substrate holding support, such as the bottom-most substrate holding support 1620B and are located outside of a substrate transfer path (e.g. for picking and placing substrates to and from the substrate holding supports 1620A, 1620A) while being within a range of motion of a substrate transport apparatus that picks and places the substrates from and to the substrate holding supports 1620A, 1620B. In one aspect, the deterministic station features 1610, 1611 are integrally formed with the substrate holding support 1620B while in other aspects the deterministic station features 1610, 1611 are coupled to the substrate holding support in any suitable manner. In one aspect, the deterministic station features 1610, 1611 are removable for replacement of the deterministic station features 1610, 1611. Referring also to FIGS. 16A-16D the deterministic station features 1610, 1611 have any suitable shape which when contacted by, for example, the substrate S or teaching substrate ST locates a center of the substrate S or teaching substrate ST in a known location. For example, the deterministic station features 1610, 1611 deterministically define a predetermined position of the substrate S or teaching substrate ST in contact with the deterministic station features 1610, 1611, which predetermined position has a predetermined relation with and identifies the substrate holding location $X_{stn}$, $Y_{stn}$ (e.g. of the substrate holding station).

In one aspect, the deterministic station features 1610, 1611 are round pins as illustrated in FIG. 16A while in other aspects the as shown in FIGS. 16B and 16C, the deterministic station features 1610A, 1611A and 1610B, 1611B are discontinuous curved contact surfaces. In still other aspects, the deterministic station features 1610C form a continuous contact surface configured to contact the edge of the substrate S or teaching substrate ST at two points for defining the predetermined position of the substrate S or teaching substrate ST. The deterministic station features 1610, 1611 are placed (e.g. spaced apart) on the substrate holding support 1620B and/or configured so as to contact a curved edge of the substrate S or teaching substrate ST where the substrate is in a predetermined orientation relative to an end effector 314E of a substrate transport apparatus, such as transfer robot 314, so that a flat or notch on the substrate S, or teaching substrate ST is located, for example, between the deterministic station features 1610, 1611. In other aspects, such as where the deterministic station features form curved surfaces as shown in FIGS. 16B-16D the substrate, such as teaching substrate ST includes pins 1650, 1651 that contact the curved surfaces for defining the predetermined position of the teaching substrate ST with the pins 1650, 1651 of the teaching substrate ST in contact with the deterministic station features, which predetermined position has a predetermined relation with and identifies the substrate holding location $X_{stn}$, $Y_{stn}$ (e.g. the substrate holding station).

Figure 17A:
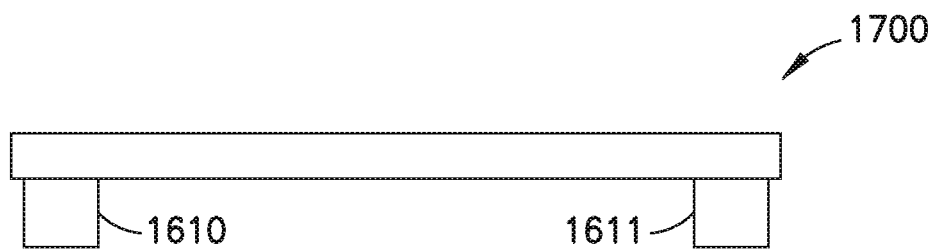
FIGS. 17A-17C are schematic views of a station auto-teach fixture in accordance with aspects of the disclosed embodiment.
Figure 17B:
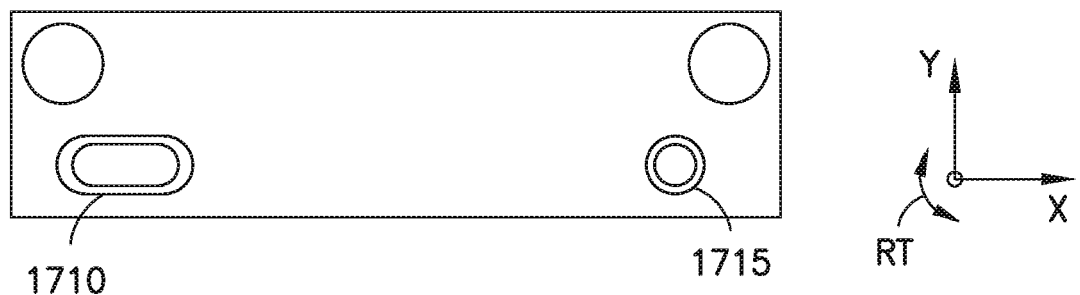
Figure 17C:
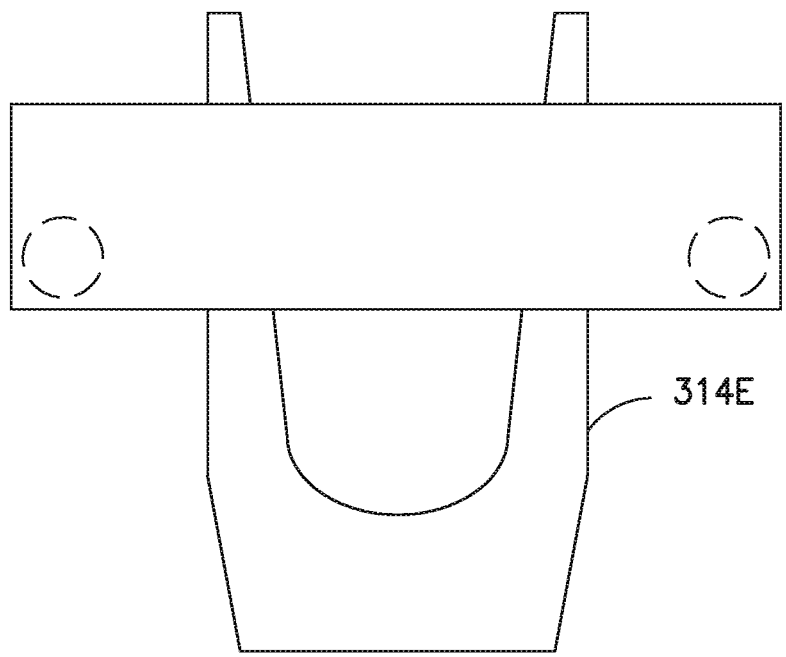

In another aspect, referring to FIGS. 17A-17C, the deterministic station features 1610, 1611 are disposed on or are integrally formed with an alignment fixture 1700 that can be picked and placed to and from a substrate holding station by, for example, end effector 314E of the substrate transfer robot 314. In this aspect, the alignment fixture is transported to and from the substrate holding station by the substrate transfer robot 314 while maintaining the integrity of the processing environment within the substrate holding station (and any transfer chamber the alignment fixture moves through—e.g. a frame of the substrate holding station does not have to be opened for placement of the alignment fixture thereby exposing the interior of the substrate holding station to, for example, an atmospheric environment). In one aspect the alignment fixture 1700 includes kinematic alignment features, such as for example, at least one slot 1710 and recess 1715 that locate and fix the alignment fixture 1700 in a predetermined position relative to the substrate holding station. For example, in one aspect, the substrate holding station includes substrate lift pins, such as lift pins 1500-1502 illustrated in FIG. 15F, on which a substrate is supported. At least two of the lift pins 1500-1502 engage the at least one slot 1710 and recess 1715 for kinematically locating the alignment fixture 1700. As an example, one lift pin 1500-1502 engages the recess 1715 to fix the alignment fixture in, for example, the X and Y axes and at least one other lift pin 1500-1502 engages the at least one slot 1710 to fix the alignment fixture in rotation RT so that the deterministic station features 1610, 1611 have a predetermined location relative to the substrate holding location $X_{stn}$, $Y_{stn}$ of the substrate holding station.

Referring now to FIGS. 18A, 18B, 19 and 20, in one aspect, the deterministic station features 1610, 1611 are provided on or otherwise fixed to a substrate holding station, as described above. The deterministic station features 1610, 1611 are shaped to deterministically define a predetermined position of the substrate S, ST in contact with the deterministic station features 1610, 1611, which predetermined position has a predetermined relation with and identifies the substrate holding location $X_{stn}$, $Y_{stn}$ of the substrate holding station. In this aspect teaching of the substrate holding location $X_{stn}$, $Y_{stn}$ in situ to the substrate holding station is effected by iterative contact (e.g. bumping or touching where the iterative contact may be referred to as bump touch) between the substrate S, ST and the deterministic station features 1610, 1611 rather than through a determination of a set of datum features (such as a wall of the substrate station that has a non-unique or substantially infinite solution relative to the substrate holding location $X_{stn}$, $Y_{stn}$ when contacted by the substrate S, ST). In this aspect a unique solution with respect to the position of the substrate holding location $X_{stn}$, $Y_{stn}$ is algebraically defined from deterministic characteristics (e.g. corners, radii, etc. as described with respect to, for example, FIGS. 16A-16D) of the deterministic station features 1610, 1611 in combination with, for example, the shape of the substrate S, ST.

As described above, the deterministic station features 1610, 1611 are located in a known position relative to the substrate holding location $X_{stn}$, $Y_{stn}$ of the substrate holding station. A substrate, such as teaching substrate ST or substrate S in contact with the deterministic station features 1610, 1611 has a center WC that is a known distance from each of the deterministic station features 1610, 1611. For example, the center WC of the substrate ST, S is a distance RD (e.g. equal to the radius of the substrate ST, S) away from the deterministic station features 1610, 1611. As the distance RD is known and the relationship between the locations $X_{P1}$, $Y_{P1}$ and $X_{P2}$, $Y_{P2}$ of the deterministic station features 1610, 1611 is known relative to the substrate holding location $X_{stn}$, $Y_{stn}$ the location of the wafer center WC relative to the substrate holding location $X_{stn}$, $Y_{stn}$ is also known. In one aspect, as will be described in greater detail below, a substrate transport apparatus, such as those described above, is controlled by any suitable controller, such as controller 11091, to transport a substrate S, ST on at least one end effector of the substrate transport apparatus so that the substrate S, ST iteratively approaches the deterministic station features 1610, 1611 until the substrate S, ST contacts both of the deterministic station features 1610, 1611. In each iteration, the substrate transport apparatus approaches the deterministic station features 1610, 1611 and the eccentricity e of the substrate S, ST is measured in any suitable manner, such as with automatic wafer centering sensors disposed in or around the substrate holding station, such as the portion of the processing tool 1600 illustrated in FIG. 16. In one aspect, each process module or station 330, such as the portion of the processing tool 1600, includes one or more sensors 311S1, 311S2 as described above for detecting one or more of a leading edge and a trailing edge of the substrate S to effect automatic wafer centering so that automatic wafer centering measurements are taken at each station as the substrate S, ST is moved into and out of the process module or station 330. In other aspects, there is a common automatic wafer centering, such as automatic wafer centering (AWC) station 311, for more than one process module or station 330. Suitable examples of automatic wafer centering can be found in, for example, U.S. Pat. Nos. 6,990,430, 7,859,685, 7,925,378, 7,894,657, 8,125,652, 8,253,948, 8,270,702, 8,634,633 and 8,934,706 as well as U.S. patent application Ser. No. 14/325,702 filed on Jul. 8, 2014 the disclosure of which are incorporated herein by reference in their entireties. In other aspects, any suitable substrate aligner may be used to determine the eccentricity of the substrate S, ST such as for example, a rotary aligner that is disposed within the substrate holding station or integral with the end effector 314E.

The iterative process is repeated until the wafer eccentricity e converges to a value within a predetermined tolerance such as for example, an automated wafer centering sensor measurement/signal processing noise or, for example, about ±150 μm (e.g. the eccentricity e reaches a steady state or a common eccentricity with substantially no change, subject to the predetermined tolerance, between iterations) where the eccentricity e from the iterative touching/contact with the deterministic station features 1610, 1611 identifies the substrate holding location $X_{stn}$, $Y_{stn}$.

In one aspect, at least one substrate S, ST is substantially centered at a respective location EC on the end effector 314E of the transfer robot 314 in a manner similar to that described above, such as with station 311 or with automatic wafer centering sensors located at or around the portion of the processing tool 1600. In one aspect, the transfer robot 314 carries at least one substrate S, ST on at least one end effector 314E and iteratively moves the at least one substrate towards the deterministic station features 1610, 1611 as illustrated by stage 1 of the automatic teaching process in FIG. 20 (FIG. 21, Block 2100). In one aspect the substrate transfer robot 314 moves the at least one substrate S, ST towards the deterministic station features 1610, 1611 from a common direction 1816. In one aspect, the common direction 1816 is a substantially straight line path while in other aspects the common direction 1816 is a curved path. After each iteration the eccentricity e of the at least one substrate S, ST is measured, as described above, relative to the end effector 314E (e.g. to confirm the eccentricity of the substrate relative to, for example, a transport apparatus coordinate system) (FIG. 21, Block 2105). In one aspect, where it is determined that the eccentricity has not changed from one iteration to the next, such as prior to contact with one or more of the deterministic station features 1610, 1611, the substrate S, ST may remain on the end effector 314E at the previously centered location on the end effector 314E. In other aspects, where it is determined that the eccentricity has changed from one iteration to the next, such as after contact with one or more of the deterministic station features 1610, 1611, the substrate S, ST may be repositioned on the end effector 314E in any suitable manner, such as that described above, so that the center of the substrate WC is substantially coincident with an end effector reference point EC (e.g. a robot position) at the start of each iteration so that the substrate is in a known relation to the end effector 314E.

Figure 20:
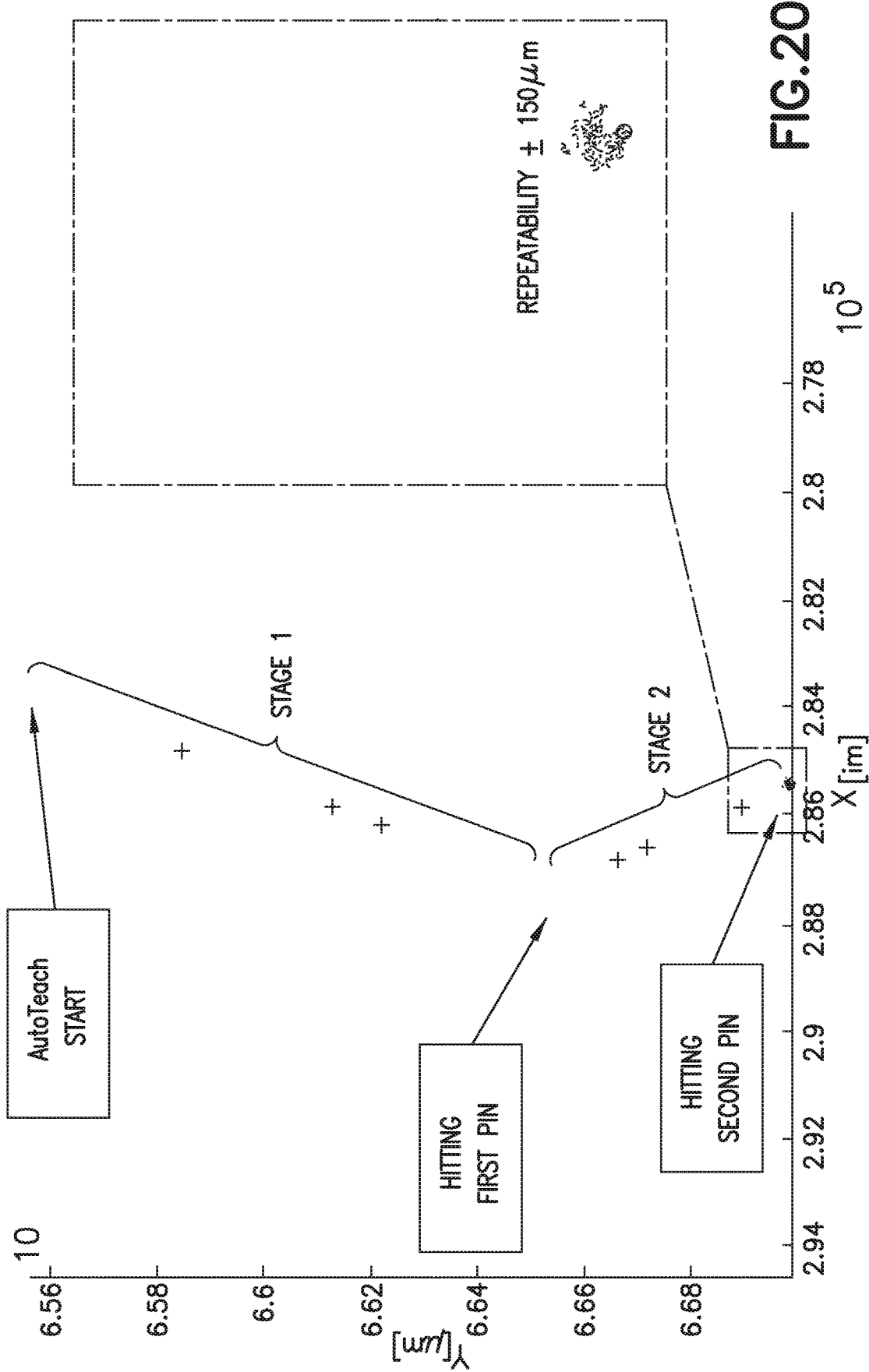
FIG. 20 is a graph illustrating an auto-teach process in accordance with aspects of the disclosed embodiment.
Figure 21:
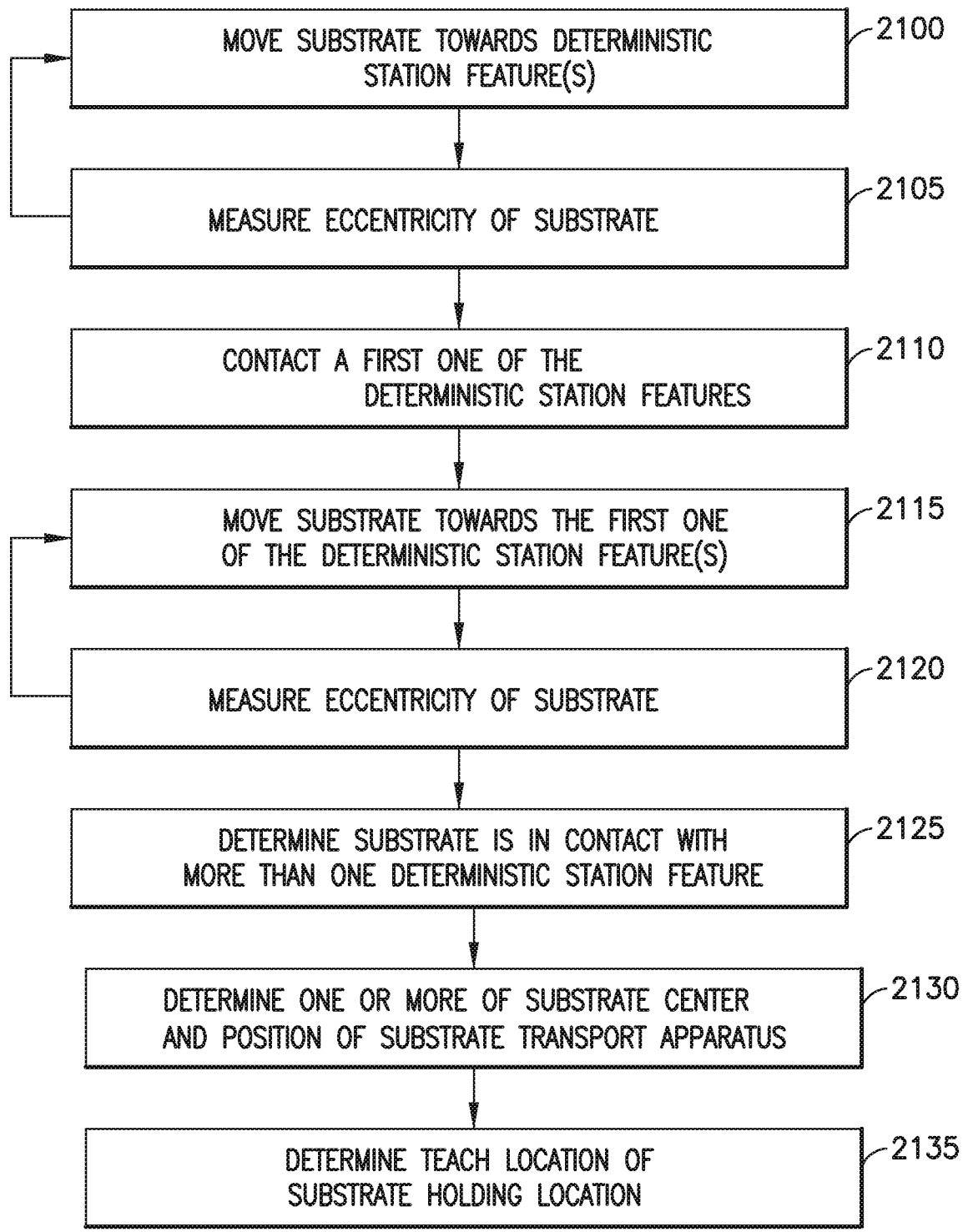
FIG. 21 is a flow chart of an auto-teach process in accordance with aspects of the disclosed embodiment.

The location of the substrate transfer robot 314, such as the end effector reference point EC and/or the location of the substrate S, ST is tracked for each iterative move (FIG. 20 illustrates the iterative locations of the substrate center WC), in any suitable manner, such as by as controller 11091 connected to at least the substrate transfer robot 314. Blocks 2100, 2105 of FIG. 21 are repeated until a first one of the deterministic station features 1610, 1611 is contacted (FIG. 21, Block 2110) as determined by, for example, an initial change in eccentricity e which is reflected in FIG. 20 at the transition from stage 1 to stage 2 of the automatic teaching process. It should be understood that the eccentricity e is generated or induced between the end effector 314E and the substrate S, ST as the end effector 314E continues to move after the substrate S, ST contacts one or more of the deterministic station features 1610, 1611. The first one of the deterministic station features 1610, 1611 is iteratively contacted (FIG. 21, Block 2115) and the eccentricity e of the substrate S, ST is determined after each iteration (FIG. 21, Block 2120) until the eccentricity e converges to within a predetermined range, such as for example, about ±150 μm or to within the measurement/signal noise of the automatic wafer centering sensor, such as sensors 311S1, 311S2. Once the determined eccentricity e of the substrate S, ST is within the predetermined range (e.g. the eccentricity resolves to the common eccentricity) the substrate is determined to be in contact with both of the deterministic station features 1610, 1611 (FIG. 21, Block 2125). It should be understood that while two determinist station features are described herein in other aspects there may be more than two deterministic station features arranged for simultaneous contact with the substrate S, ST.

Figure 18A:
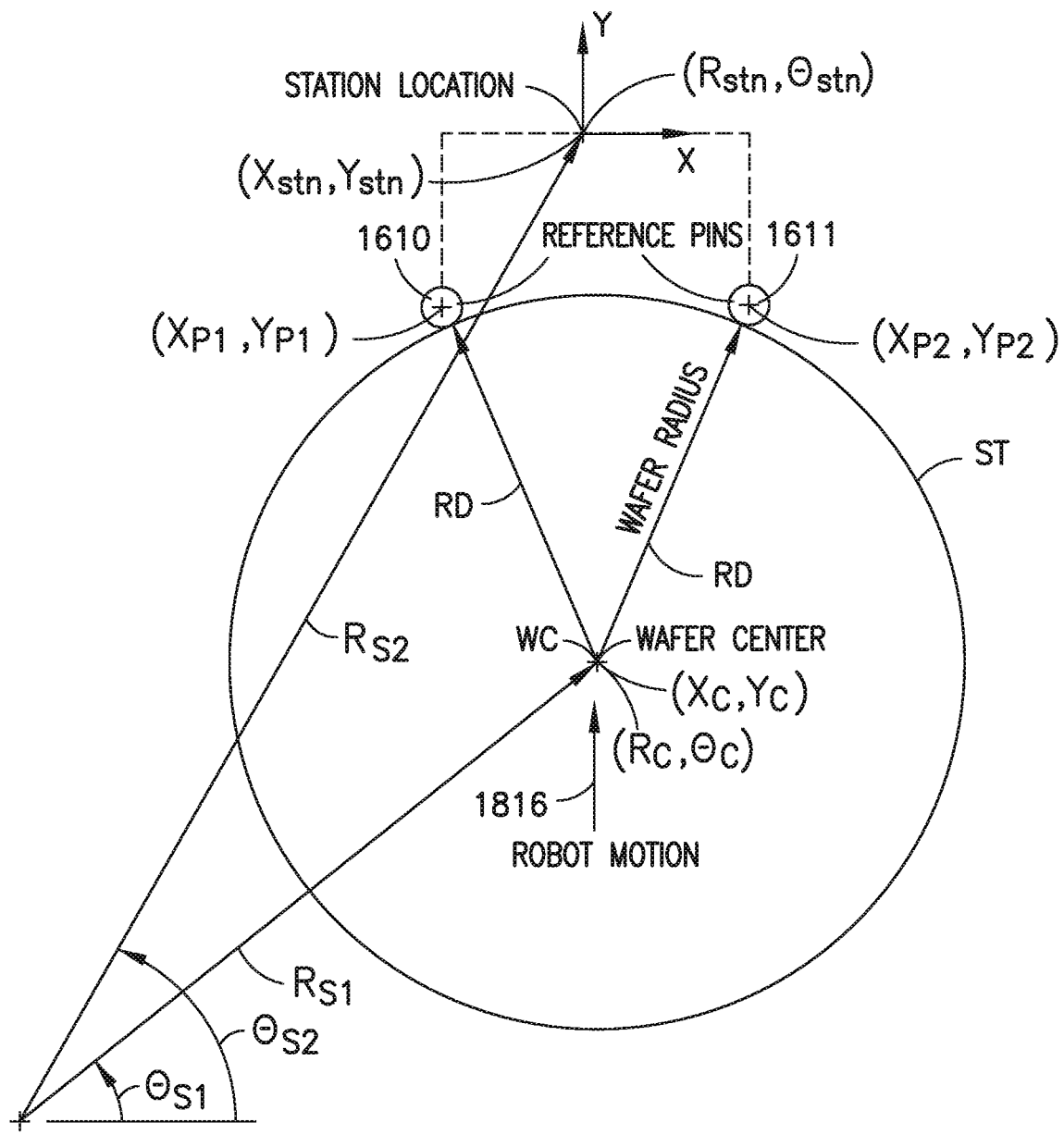
FIGS. 18A and 18B are schematic illustrations of a deterministic relationship between a substrate and a substrate holding location in accordance with aspects of the disclosed embodiment.
Figure 18B:
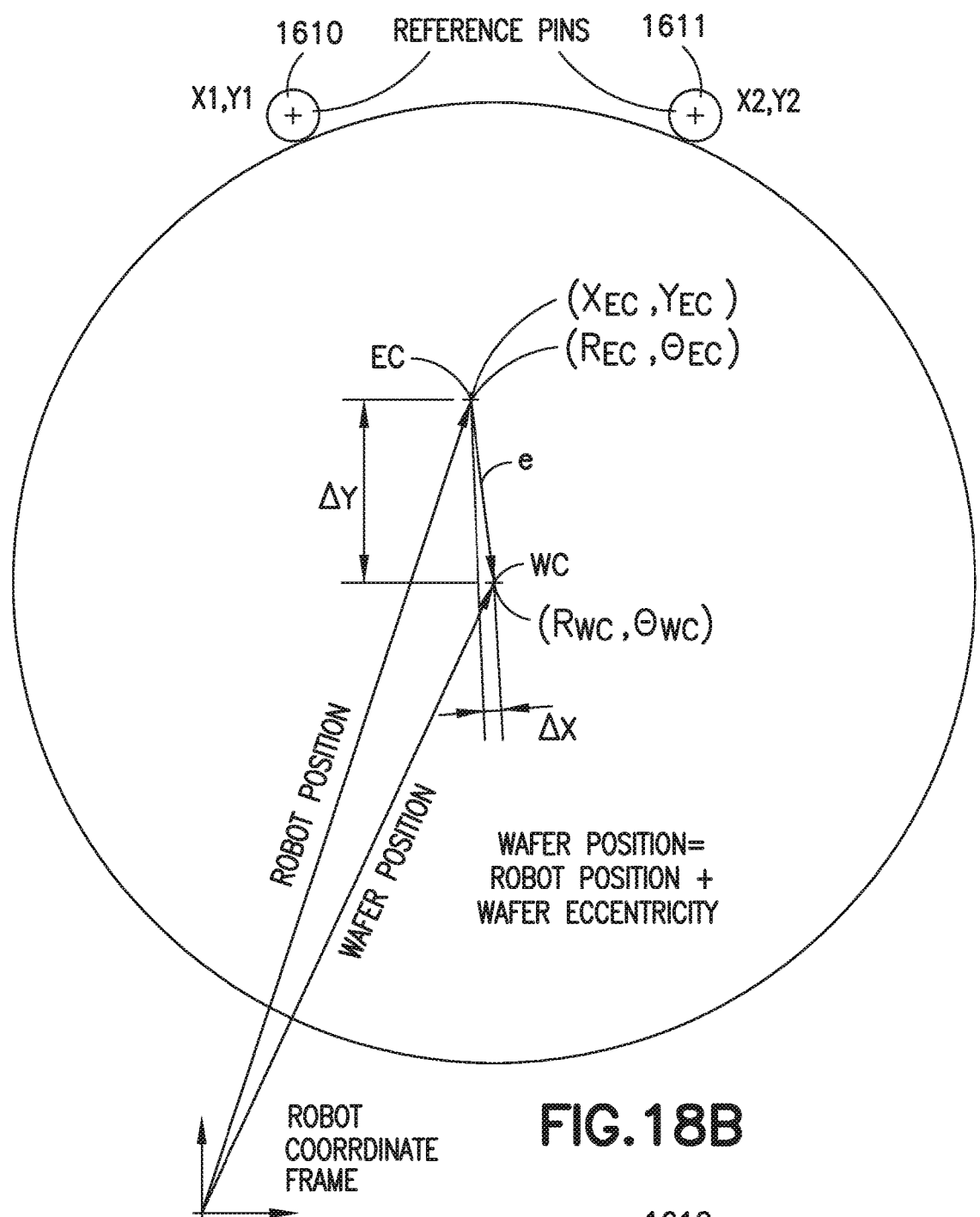
Figure 19:
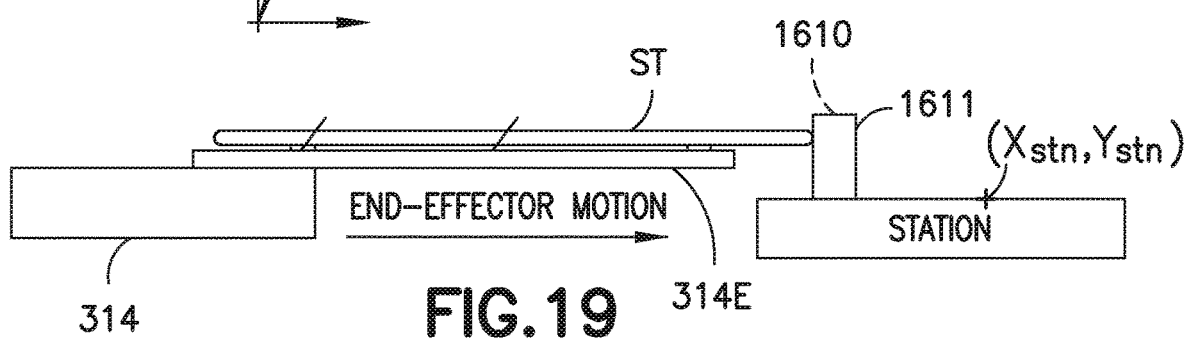
FIG. 19 is a schematic illustration of a portion of a substrate processing apparatus in accordance with aspects of the disclosed embodiment.

Referring to FIGS. 18A and 18B one or more of the center WC of the substrate S, ST and the position EC of the substrate transfer robot 314 are determined in the transport apparatus coordinate system based on the common eccentricity (FIG. 21, Block 2130). For example, the center position of the wafer WC is substantially equal to the robot position EC plus the eccentricity e. As such, the centered position Xc, Yc of the substrate transport apparatus reference point EC can be determined from the following equation:

$$(Xc, Yc) = (X_{EC}, Y_{EC}) - (\Delta X, \Delta Y) \quad [3]$$

where ΔX, ΔY is the common eccentricity and Xec, Yec is the location of the end effector reference point EC in the X,Y coordinate frame of, for example, the substrate holding station (see FIG. 18A). In one aspect, the position of the end effector reference point EC can be determined in a manner substantially similar to that described in U.S. Pat. Nos. 7,925,378 and 6,990,430, previously incorporated herein by reference. The location of the end effector reference point EC corresponding to Xc, Yc is translated to transfer robot coordinates R, θ in any suitable manner for determining the teach location $R_{stn}$, $\theta_{stn}$ (corresponding to the substrate holding location $X_{stn}$, $Y_{stn}$) (FIG. 21, Block 2135) and because there is a predetermined relationship between the deterministic station features 1610, 1611 and the station holding location $$(R_{sm}, \theta_{sm}) = (Rc, \theta c) + (\Delta R, \Delta \theta) \quad [4]$$

where Rc, θc corresponds to Xc, Yc in the substrate transport coordinate system, ΔR is the difference between the transport apparatus radial extension values RS2 and RS1 (e.g. ΔR=RS2−RS1) and Δθ is the difference between the transport apparatus rotation values θS1 and θS2 (e.g. Δθ=θS2−θS1).

While the automatic teaching of the station holding location is described above with respect to a single end effector, it should be understood that the above-described automatic station holding location teaching process is applicable to end effectors having multiple substrates holders where the multiple substrate holders share a common drive axis. For example, referring again to FIG. 2E, each end effector 219E has, e.g., two substrate holders that hold substrates S, ST in a side by side arrangement. The respective articulated arm 219A, 219B is controlled by, for example, controller 11091 so as to move the substrates S, ST into their respective processing stations (which in one aspect are each similar to those described above) so that each substrate S, ST is iteratively moved toward the respective deterministic station features 1610, 1611 in a common direction, as described above, with at least one common drive of the substrate transport apparatus. The eccentricity e is tracked for each respective substrate held by the end effector 219E and the location of the station holding location for each substrate S, ST is determined in a manner that is substantially similar to that described above with respect to FIG. 21.

Figure 22A:
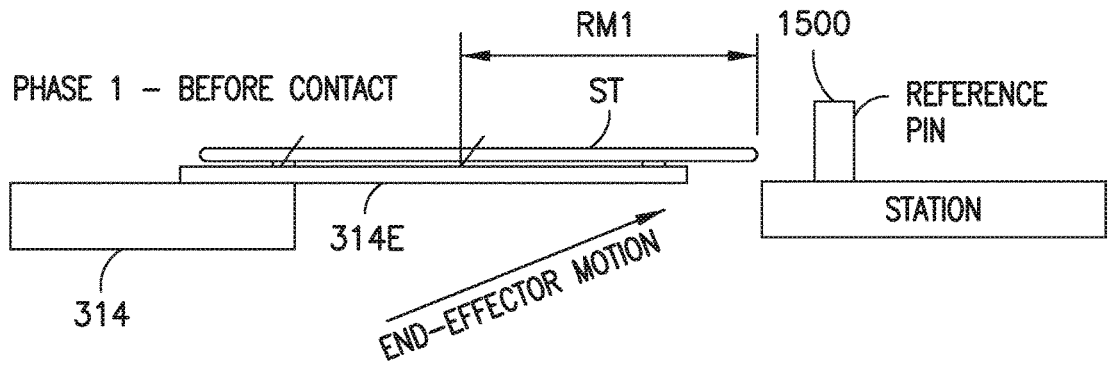
FIGS. 22A-22C are schematic illustrations of an auto-teach process in accordance with aspects of the disclosed embodiment.
Figure 22B:
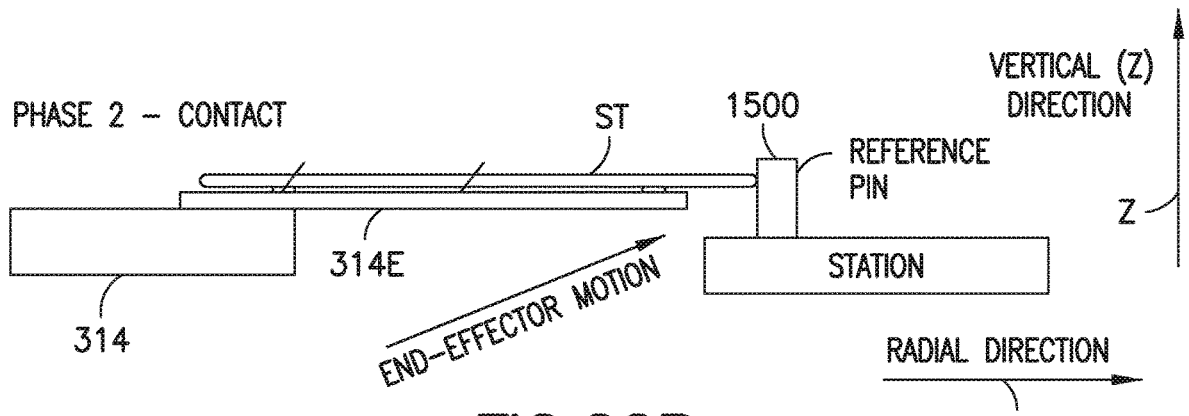
Figure 22C:
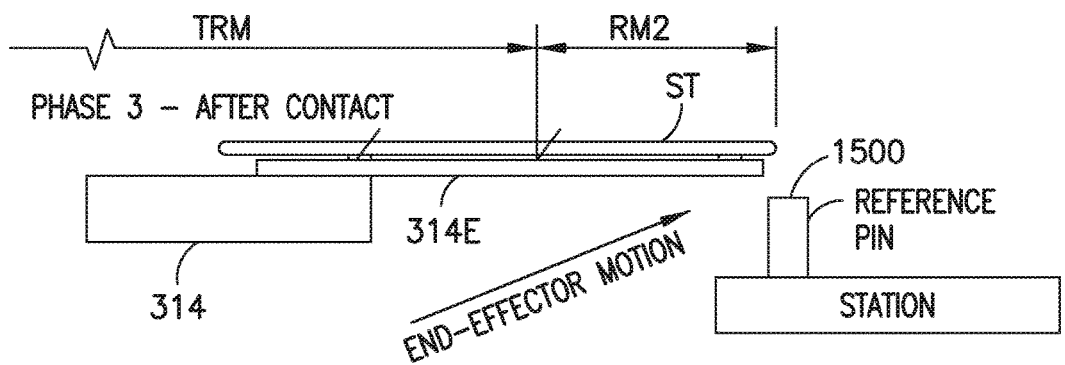
Figure 23:
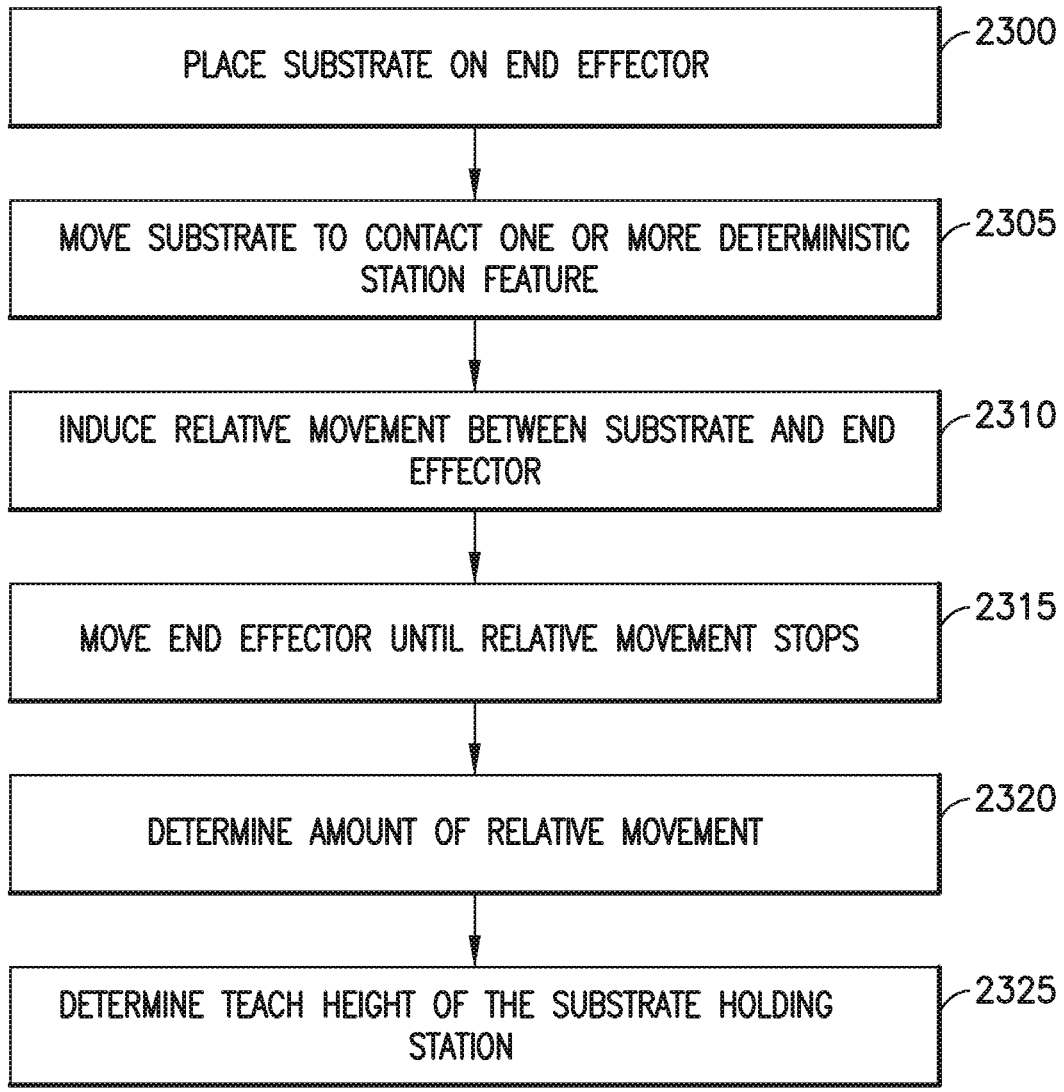
FIG. 23 is a flow chart of an auto-teach process in accordance with aspects of the disclosed embodiment.

Referring to FIGS. 22A-22C the vertical or Z coordinate of the substrate holding station such as the portion of processing tool 1600 may be determined or taught in a manner substantially similar to that described herein where the substrate transfer robot 314 is controlled by, for example, controller 11091 to move the substrate S, ST into contact with one or more of the deterministic station features 1610, 1611 or one or more lift pins, such as lift pins 1500-1502, of the substrate station while also moving the substrate S, ST in the Z direction. In this aspect, the substrate S, ST is placed on the end effector 314E of the substrate transfer robot 314 so that the substrate S, ST has a known relationship relative to the end effector 314E (FIG. 23, Block 2300). In one aspect, for example, the substrate transfer robot 314 is controlled to move the substrate S, ST in a combined radial R and Z axis move so that the substrate S, ST contacts one or more of the deterministic station features 1610, 1611 or one or more of the lift pins 1500-1502 (FIG. 23, Block 2305). The substrate transfer robot 314 continues the combined radial R and Z axis move to induce movement of the substrate S, ST (which is in contact with the one or more of the deterministic station features 1610, 1611 or one or more of the lift pins 1500-1502) relative to the end effector (FIG. 23, Block 2310). The substrate S, ST is lifted by substrate transfer robot 314 so that the substrate S, ST travels vertically past a top of the one or more of the deterministic station features 1610, 1611 or one or more of the lift pins 1500-1502 at which point the substrate S, ST stops moving relative to the end effector as the end effector continues to move in the combined radial R and Z directions (FIG. 23, Block 2315). The relative movement ΔRM between the end effector 314E and the substrate S, ST along the radial R direction (e.g. ΔRM=RM1−RM2) is determined in any suitable manner, such as by the automatic wafer centering sensors described above where ΔRM is compared to the total radial motion TRM of the end effector 314E to determine where the substrate S, ST stopped moving relative to the end effector 314E (FIG. 23, Block 2320). It is noted that the movement of the substrate transfer robot 314 end effector 314E in the combined radial R and Z directions is coordinated by, for example, the controller such that the Z height of the end effector 314E is known for any given radial position of the end effector 314E so that the Z height of the top of the one or more of the deterministic station features 1610, 1611 or one or more of the lift pins 1500-1502 (and thus the teach height of the substrate holding station) is determined from the difference between the total radial movement TRM and the relative movement ΔRM (FIG. 23, Block 2325). As may be realized, the Z coordinate of the substrate holding station is taught with respect to the substrate holding station reference frame (e.g. it is dependent on a location determination of a feature of the substrate holding station itself). As such, the resolution of the taught Z coordinate of the substrate holding station is independent of the as built variances of the arm/end effector configuration. Examples of the as built variances include arm drop or sag, end effector level, tilt and/or twist. It is noted that the as built variances are present and are substantially constant during the teaching of the substrate holding station X, Y and Z coordinates and are in effect cancelled.

Figure 27A:
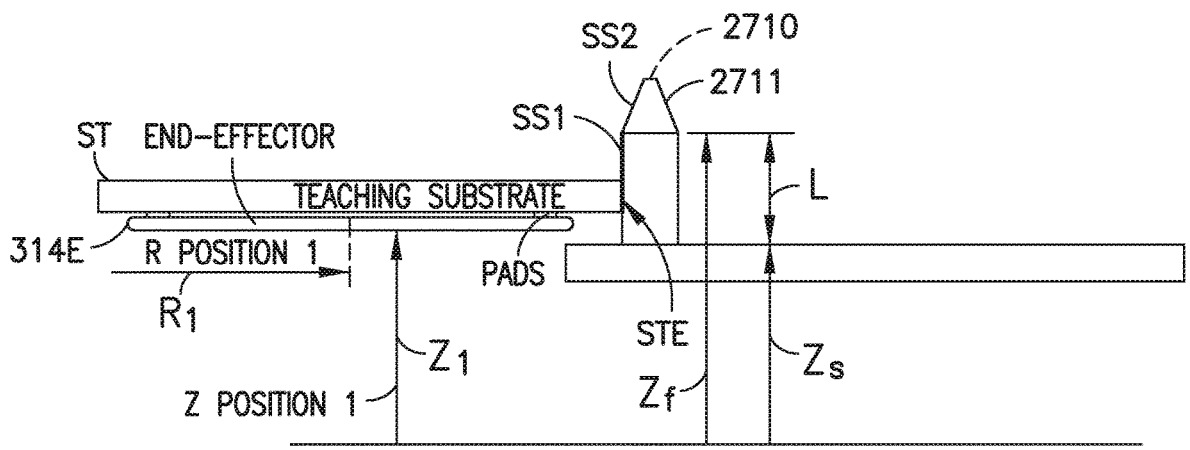
FIGS. 27A-27C are schematic illustrations of an auto-teach process in accordance with aspects of the disclosed embodiment.
Figure 27B:
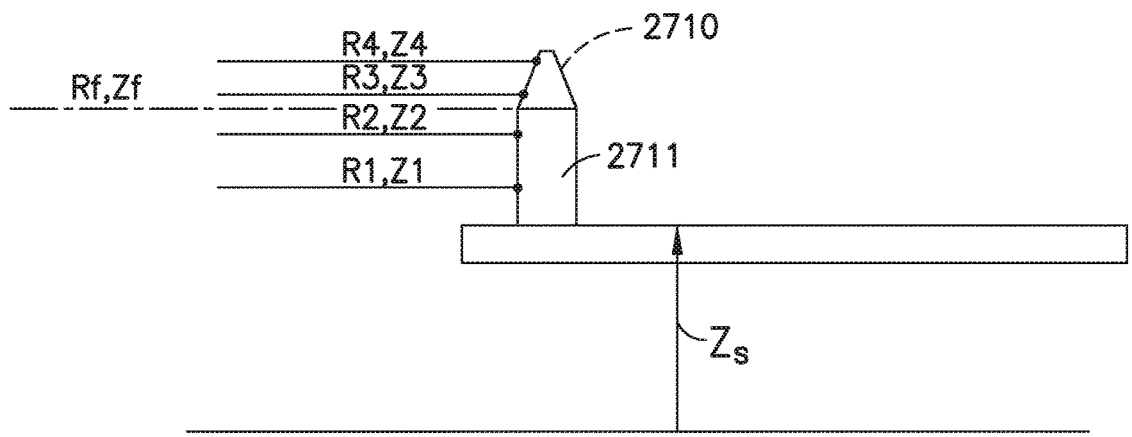
Figure 27C:
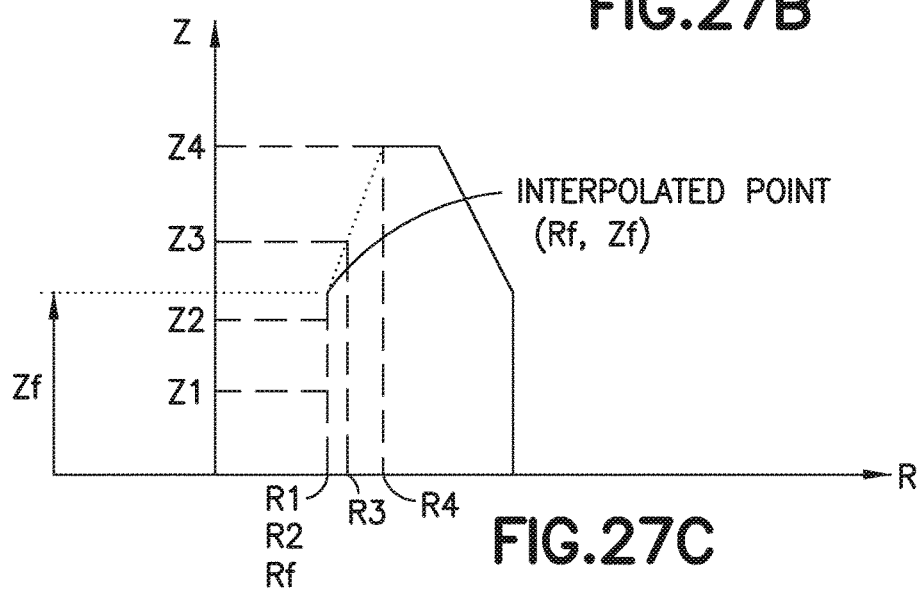

Referring to FIGS. 27A-27C the vertical or Z coordinate of the substrate holding station such as the portion of processing tool 1600 may be determined in a manner substantially similar to that described herein where the substrate transfer robot 314 is controlled by, for example, controller 11091 to move the substrate S, ST into contact with one or more of the deterministic station features/lift pins 2710, 2711 (which may be substantially similar to the deterministic station features/lift pins 1710, 1711, 1501-1502, 1610, 1611 described above) of the substrate station at one or more heights in the Z direction. In this aspect, the substrate S, ST includes a substantially flat peripheral surface STE and the free end of the deterministic station features 2710, 2711 is tapered (e.g. includes a first surface SS1 and a second surface SS2 that are angled relative to each other). In other aspects the substrate S, ST may include a contoured or rounded peripheral surface as shown in, e.g., FIGS. 22A-22C. The peripheral surface STE of the substrate S, ST is configured so that the substrate S, ST contacts the deterministic station feature(s) 2710, 2711 at a predetermined, known location on the substrate (e.g. top or bottom edge of the substantially flat peripheral surface STE or on a tangent of the rounded peripheral surface). The differences in where the substantially flat peripheral surface STE and the rounded peripheral surface contact the deterministic station features 2710, 2711 are accounted for in the algorithm(s) present in or used by the controller 11091 to determine the radial position R1, R2, R3, R4 of the end effector 314E. Registration, of contact and station location (X, Y and Z) thereof, by the controller is effected by detecting post-contact eccentricity of the substrate S, ST in a manner similar to that described before, and as further noted below.

Figure 28:
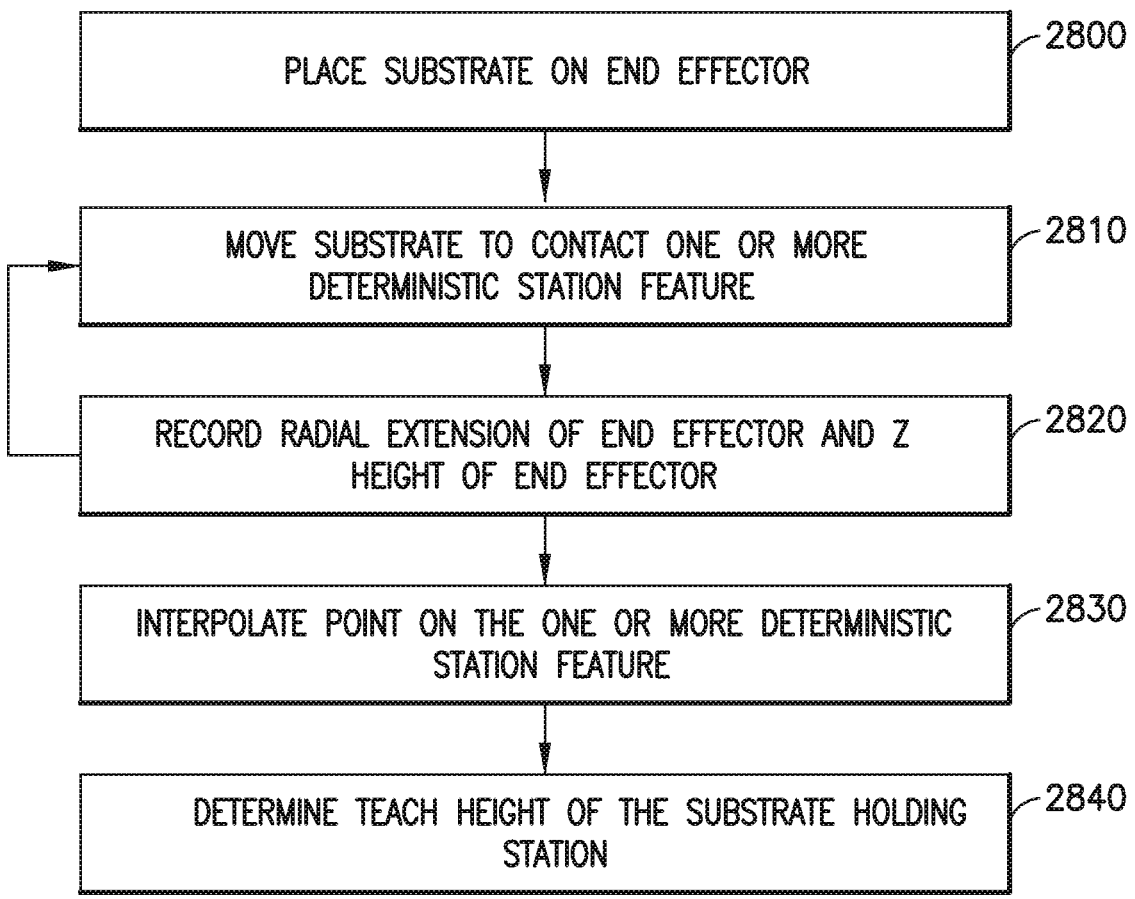
FIG. 28 is a flow chart of an auto-teach process in accordance with aspects of the disclosed embodiment.

In this aspect, the substrate S, ST is placed on the end effector 314E of the substrate transfer robot 314 in any suitable manner so that the substrate S, ST has a known relationship relative to the end effector 314E (FIG. 28, Block 2800). In one aspect, for example, the substrate transfer robot 314 is controlled to move the substrate S, ST in a radial R move (that is initiated, for example, from a known position of the substrate S, ST, such as the determined or known station location, or known substrate location, and for an R distance known, or resolved if initially unknown, to bring the substrate into contact with a predetermined deterministic station feature to 2710 causing substrate eccentricity resolved to determine contact location) at a first Z axis height so that the substrate S, ST contacts one or more of the deterministic station features 2710, 2711 (FIG. 28, Block 2810). The radial extension R1 and height Z1 of the end effector 314E are recorded (FIG. 28, Block 2820) by, for example, controller 11091 to effect a determination of the substrate holding station height Zs as will be described below. The substrate transfer robot 314 is controlled to iteratively move the substrate S, ST in a radial move R1, R2, R3, R4 at another varying Z axis heights so that the substrate S, ST contacts (determined as described above) one or more of the deterministic station features 2710, 2711 (FIG. 28, Block 2810). The radial extension R2 and height Z2 of the end effector 314E are recorded (FIG. 28, Block 2820) by, for example, controller 11091 to effect a determination of the substrate holding station height Zs as will be described below. Blocks 2810-2820 of FIG. 28 are iteratively repeated so as to establish at least two points on each of the side surfaces SS1, SS2 of one or more of the deterministic station features 2710, 2711 so as to enable, for example, the controller 11091 to interpolate the location and orientation of the side surfaces SS1, SS2 and determine an intersection between the side surfaces SS1, SS2 (FIG. 28, Block 2830). In one aspect, the intersection between the side surfaces SS1, SS2 is located at the intersection height Zf relative to a reference frame of the substrate holding station (or any other suitable reference frame, such as of the transfer robot 314). It is noted that the distance or height L between the intersection height Zf and the substrate holding station teach height Zs is known.

As can be seen in FIG. 27C the Z heights Z1-Z4 and the radial extension positions R1-R4 iteratively obtained in blocks 2810-2820 of FIG. 28 are used by, for example, the controller 11091 to interpolate the location of the intersection point Rf, Zf of the intersection between the side surfaces SS1, SS2. The teach height Zs of the substrate holding station is determined (FIG. 28, Block 2840) from Zs=Zf−L, where L is a known value as described above.

Referring to FIGS. 29A-29F, in another aspect the deterministic station features 2910, 2911 (which may be substantially similar to those deterministic station features and/or lift pins described above) have a free end that is substantially flat while the peripheral surface STE of the substrate S, ST includes a first surface SS1' and second surface SS2' that are angled relative to each other. In a manner substantially similar to that described above, the substrate S, ST is placed on the end effector 314E of the substrate transfer robot 314 in any suitable manner so that the substrate S, ST has a known relationship relative to the end effector 314E (FIG. 28, Block 2800). In one aspect, for example, the substrate transfer robot 314 is controlled to move the substrate S, ST in a radial R move at multiple Z heights Zi for determining the teach height Zs of the substrate holding station. For example, the substrate transfer robot 314 is controlled to move the substrate in a radial move R1 at a first Z axis height Z1 so that the substrate S, ST contacts one or more of the deterministic station features 2910, 2911 (FIG. 28, Block 2810). The radial extension R1 and height Z1 of the end effector 314E are recorded (FIG. 28, Block 2820) by, for example, controller 11091 to effect a determination of the station height Zs as will be described below. The substrate transfer robot 314 is controlled to move the substrate S, ST in a radial move R2 at another Z axis height Z2 so that the substrate S, ST contacts the one or more of the deterministic station features 2910, 2911 (FIG. 28, Block 2810). The radial extension R2 and height Z2 of the end effector 314E are recorded (FIG. 28, Block 2820) by, for example, controller 11091 to effect a determination of the station height Zs as will be described below. Blocks 2810-2820 of FIG. 28 are iteratively repeated so as to establish at least two points on each of the side surfaces SS1', SS2' of the substrate S, ST so as to enable, for example, the controller 11091 to interpolate the location and orientation of the side surfaces SS1', SS2' as illustrated in FIG. 29F and determine an intersection Rf, Zf between the side surfaces SS1', SS2' (FIG. 28, Block 2830). In one aspect, the intersection between the side surfaces SS1', SS2' corresponds to the height Zf of the deterministic station features 2910, 2911. As described above, the distance or height L between the intersection height Zf and the substrate holding station teach height Zs is known such that the teach height Zs of the substrate holding station can be determined from Zs=Zf−L as described above with respect to block 2840 of FIG. 28.

Figure 30:
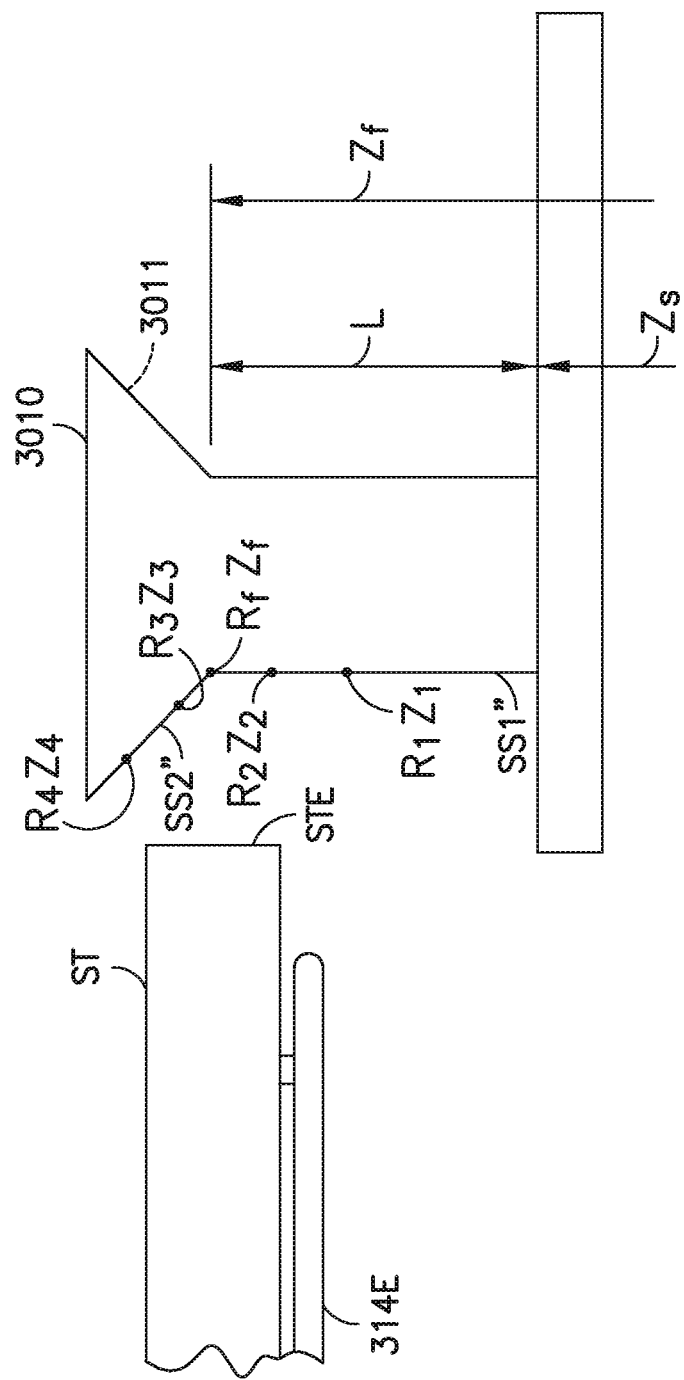
FIG. 30 is a schematic illustration of a substrate/teaching substrate and deterministic stations features for an auto-teach process in accordance with aspects of the disclosed embodiment.

Referring now to FIG. 30 the one or more deterministic station feature 3010, 3011, which may be substantially similar to those deterministic station features and/or lift pins described above, includes a flared free end (as opposed to the tapered free end illustrated in FIGS. 27A and 27B). In this aspect the taught height Zs of the substrate holding station is determined in a manner substantially similar to that described above with respect to FIG. 28. For example, the substrate transfer robot 314 is controlled to move the substrate S, ST radially at various Z heights to determine at least the locations R1, Z1-R4, Z4 (e.g. at least two points on each surface SS1", SS2" of the deterministic station features 3010, 3011) so that the intersection Rf, Zf of the surfaces SS1", SS2" can be interpolated or calculated by the controller 11091 in any suitable manner where the substrate station teach height Zs is determined from Zs=Zf−L as described above.

Figure 31A:
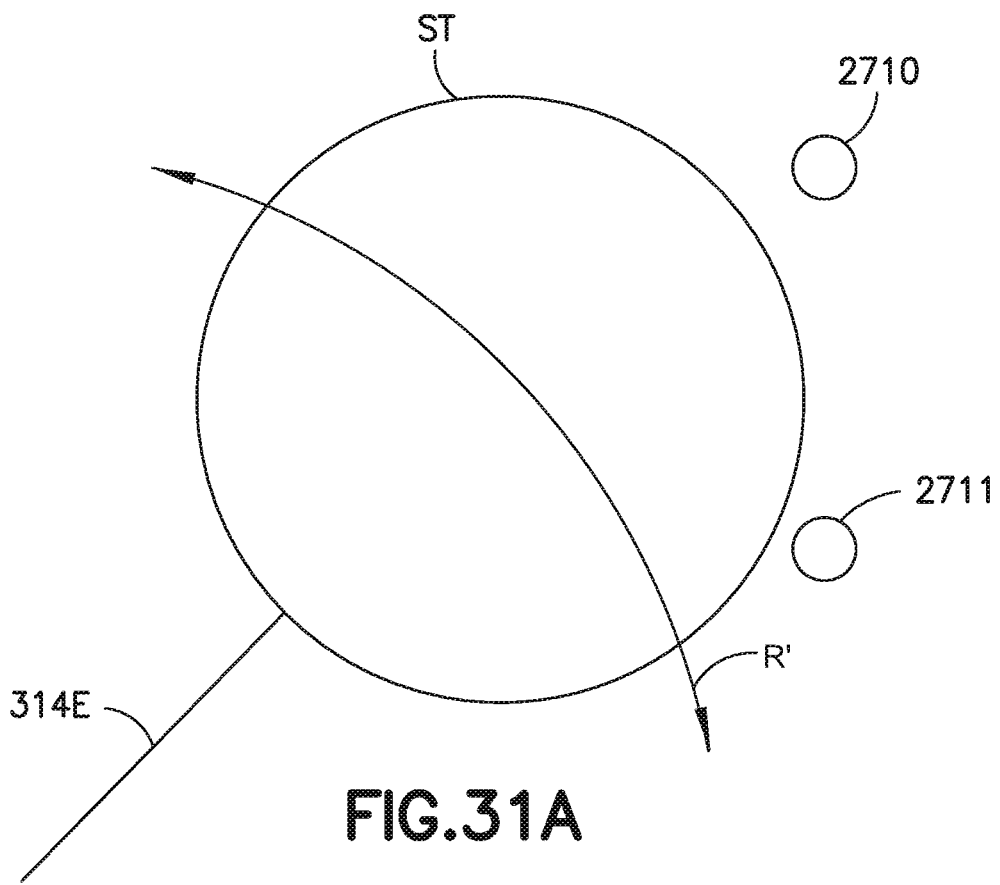
FIGS. 31A and 31B are schematic illustrations of an auto-teach process in accordance with aspects of the disclosed embodiment.
Figure 31B:
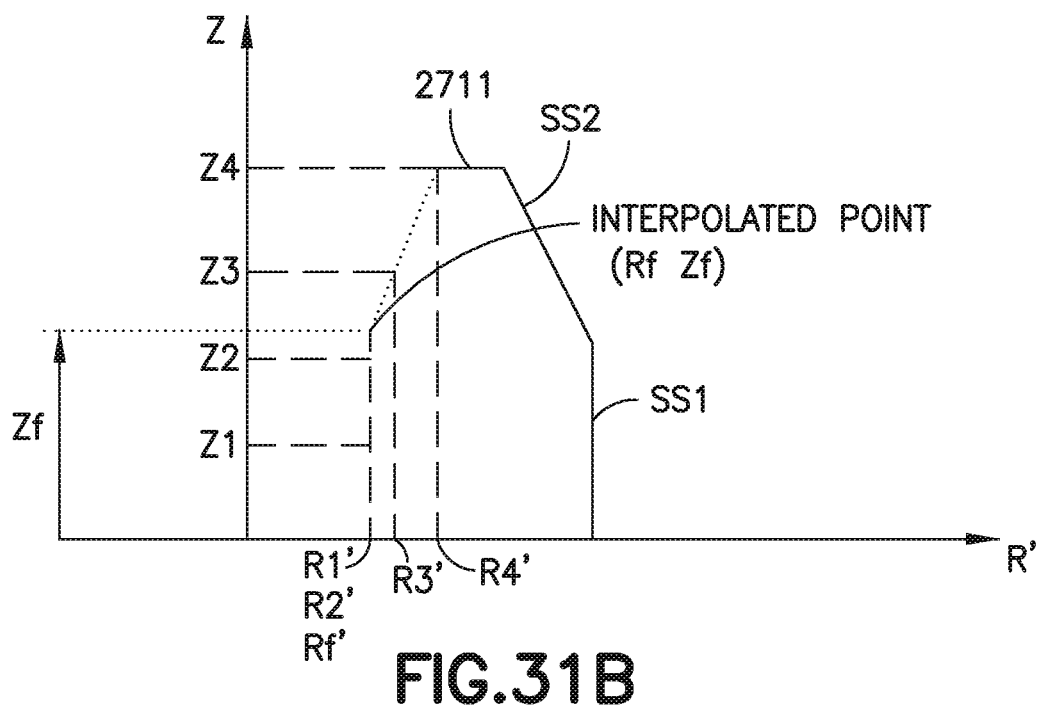
Figure 32:
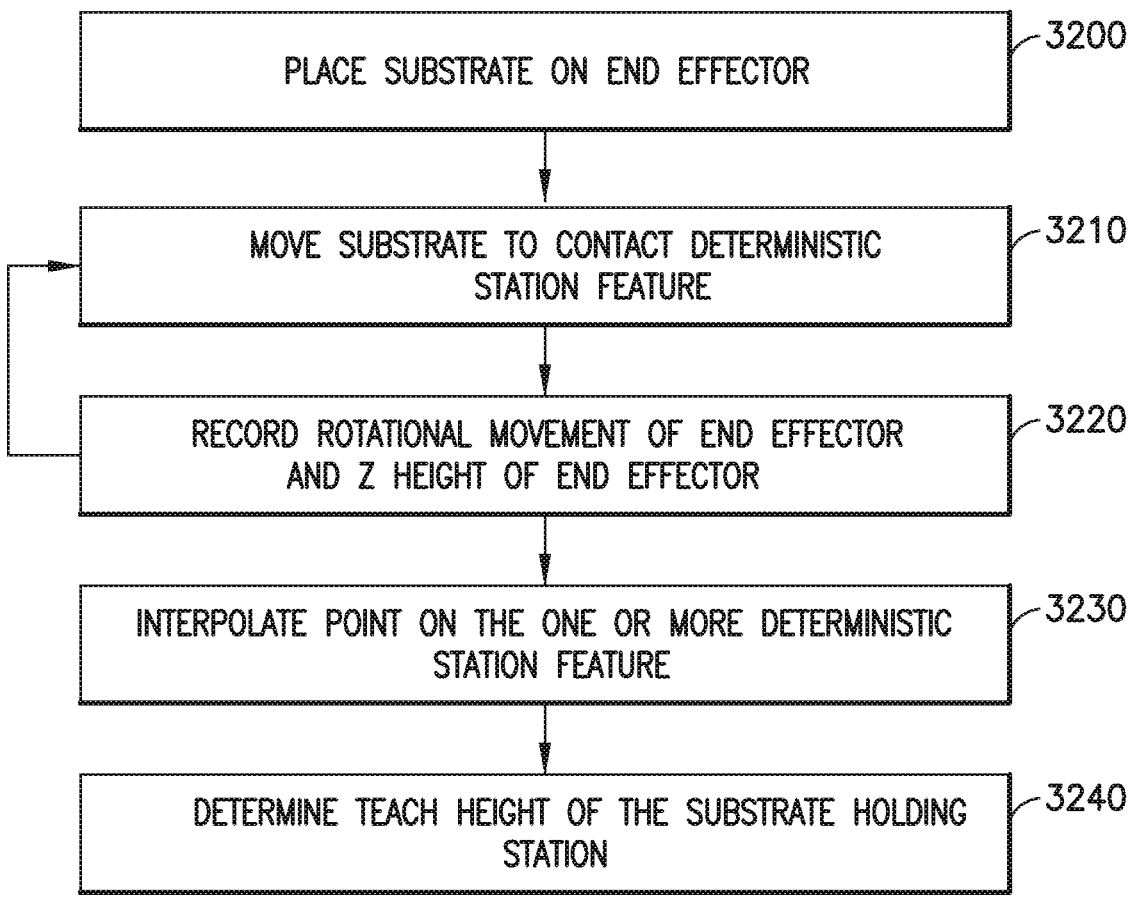
FIG. 32 is a flow chart of an auto-teach process in accordance with aspects of the disclosed embodiment.

As may be realized, the teach height Zs of the substrate holding station may be determined or established after the X, Y location of the substrate holding station has been determined/taught, while in other aspects the teach height Zs of the substrate holding station may be determined prior to the determination of the X, Y location of the substrate holding station. For example, while the above describes the determination of the teach height Zs using one or more deterministic station features (e.g. such as two deterministic station features), in other aspects a single deterministic station feature, such as deterministic station feature 2711 (or any other suitable deterministic station feature or lift pin) may be used to establish the teach height Zs. Referring to FIGS. 31A and 31B the substrate S, ST is placed on the end effector 314E of the substrate transfer robot 314 in any suitable manner so that the substrate S, ST has a known relationship relative to the end effector 314E (FIG. 32, Block 3200). In one aspect, for example, the substrate transfer robot 314 is controlled to move the substrate S, ST along an arc R' (e.g. such as by rotating the end effector about a wrist joint of the transfer robot or in any other suitable manner) at multiple Z heights for determining the teach height Zs of the substrate holding station. For example, the substrate transfer robot 314 is controlled to move the substrate along arc R' at a first Z axis height Z1 so that the substrate S, ST contacts but one of the deterministic station features 2711 (FIG. 32, Block 3210). The rotational movement R1' and height Z1 of the end effector 314E are recorded (FIG. 32, Block 3220) by, for example, controller 11091 to effect a determination of the station height Zs as will be described below. As may be realized, after recording the rotational movement R1' and height Z1 the substrate may be returned to a position at which the rotational movement of the substrate started (e.g. in effect a home position for the rotational movement) to provide for a base location or position from which to measure the rotational movement of the substrate ST. The substrate transfer robot 314 is controlled to move the substrate S, ST in a rotational movement R2' at another Z axis height Z2 so that the substrate S, ST contacts but one of the deterministic station features 2711 (FIG. 32, Block 3210). The rotational movement R2' and height Z2 of the end effector 314E are recorded (FIG. 32, Block 3220) by, for example, controller 11091 to effect a determination of the station height Zs as will be described below. Blocks 3210-3220 of FIG. 32 are iteratively repeated so as to establish at least two points on each of the side surfaces SS1, SS2 of the deterministic station feature 2711 so as to enable, for example, the controller 11091 to interpolate the location and orientation of the side surfaces SS1, SS2 as illustrated in FIG. 31B and determine an intersection Rf', Zf between the side surfaces SS1, SS2 (FIG. 32, Block 3230). In one aspect, the intersection between the side surfaces SS1, SS2 corresponds to the height Zf of the deterministic station feature 2711. As described above, the distance or height L between the intersection height Zf and the substrate holding station teach height Zs is known such that the teach height Zs of the substrate holding station can be determined (FIG. 32, Block 3240) from Zs=Zf−L as described above with respect to block 2840 of FIG. 28.

In one aspect the station auto-teach processes described herein are performed at substrate processing temperatures of about 200° C. to about 850° C. In other aspects, the station auto-teach processes described herein are performed at temperatures below about 200° C. or above about 850° C. In one aspect, the position of the location C1 on the end effector 314E of the transfer robot 314 is adjusted to compensate for thermal expansion or contraction in any suitable manner for determining the eccentricity of the substrate S, ST in the station auto-teach processes described herein. For example, any suitable static detection sensors, such as for example, sensors 311S1, 311S2 disposed adjacent, for example, any suitable substrate processing module/station detect edges of the substrate S, ST and/or datum features 401, 402 (FIG. 3) of the end effector 314E as the end effector 314E moves into and out of the substrate processing module/station. Signals from the sensors 311S1, 311S2 corresponding to the detection of the substrate edges and/or end effector datum features are received by, for example, controller 11091 and the controller 11091 controls the transfer robot 314 to adjust the position of the location C1 on the end effector 314E based on the sensor signals to compensate for the thermal expansion and/or contraction of the transfer robot 314 in a manner substantially similar to that described in U.S. provisional patent application No. 62/191,863 entitled "ON THE FLY AUTOMATIC WAFER CENTERING METHOD AND APPARATUS" filed on Jul. 13, 2015, the disclosure of which is incorporated herein by reference in its entirety.

Figure 24A:
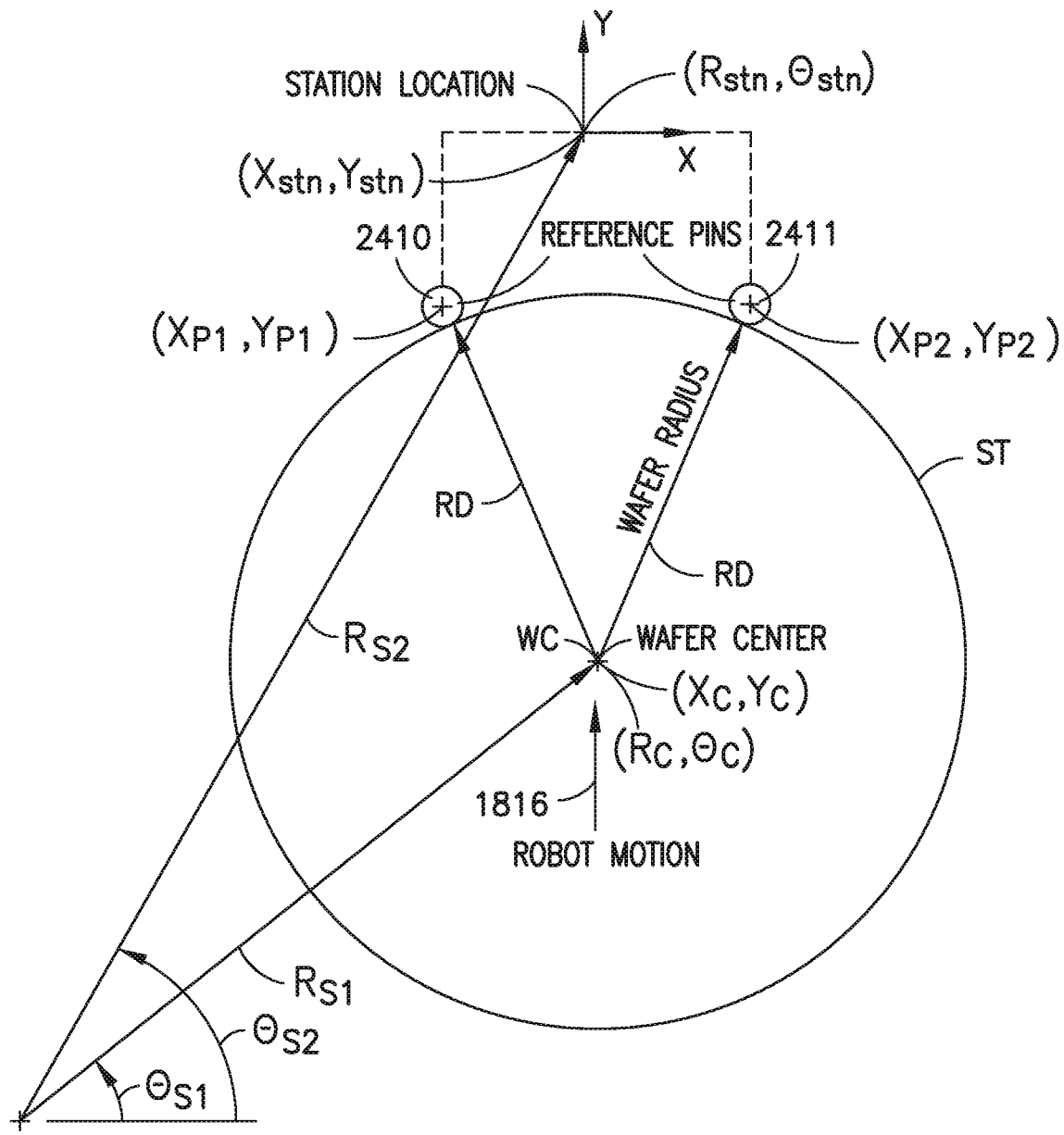
FIGS. 24A-24B are schematic illustrations of a deterministic relationship between a substrate and a substrate holding location in accordance with aspects of the disclosed embodiment.
Figure 24B:
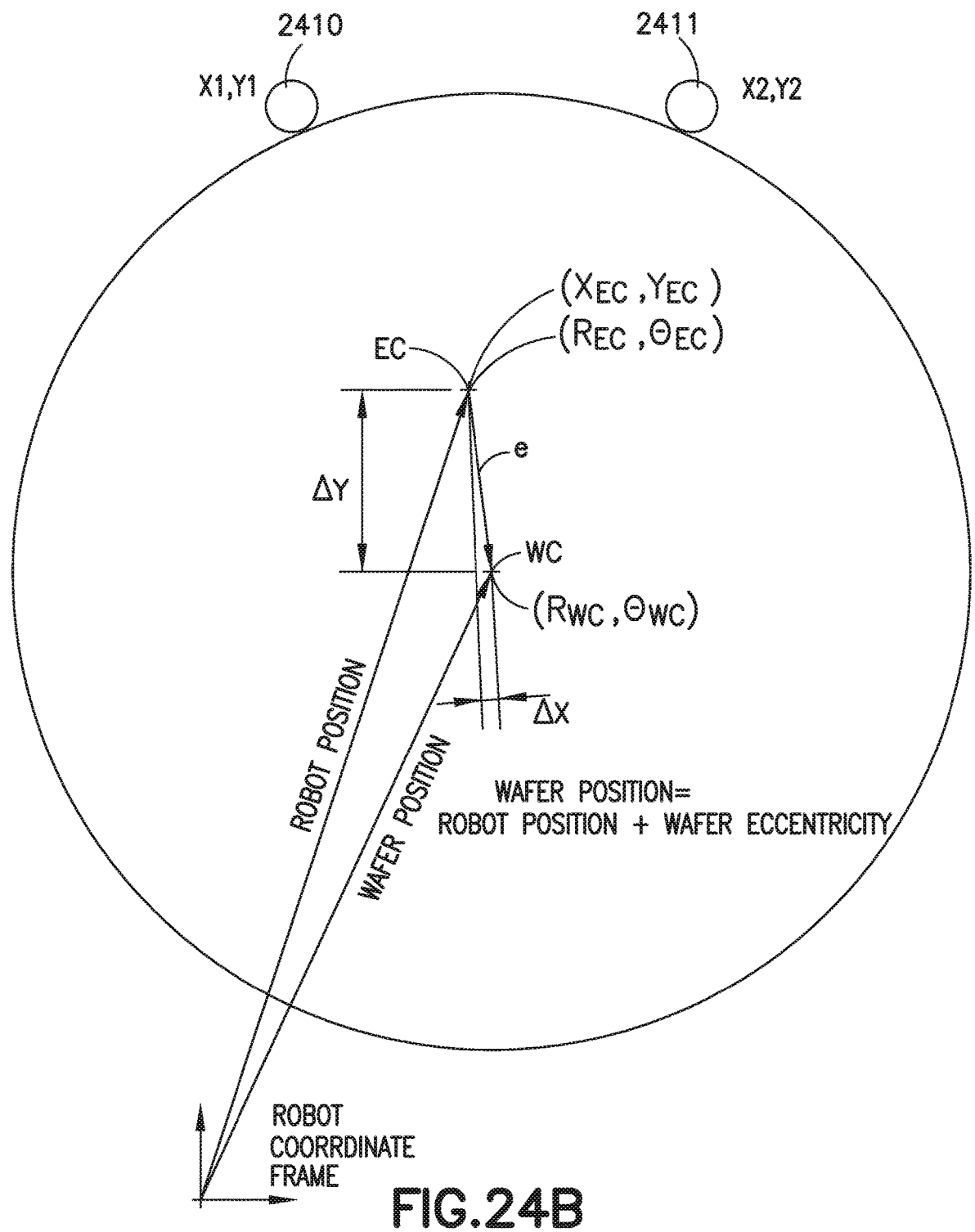
Figure 25:
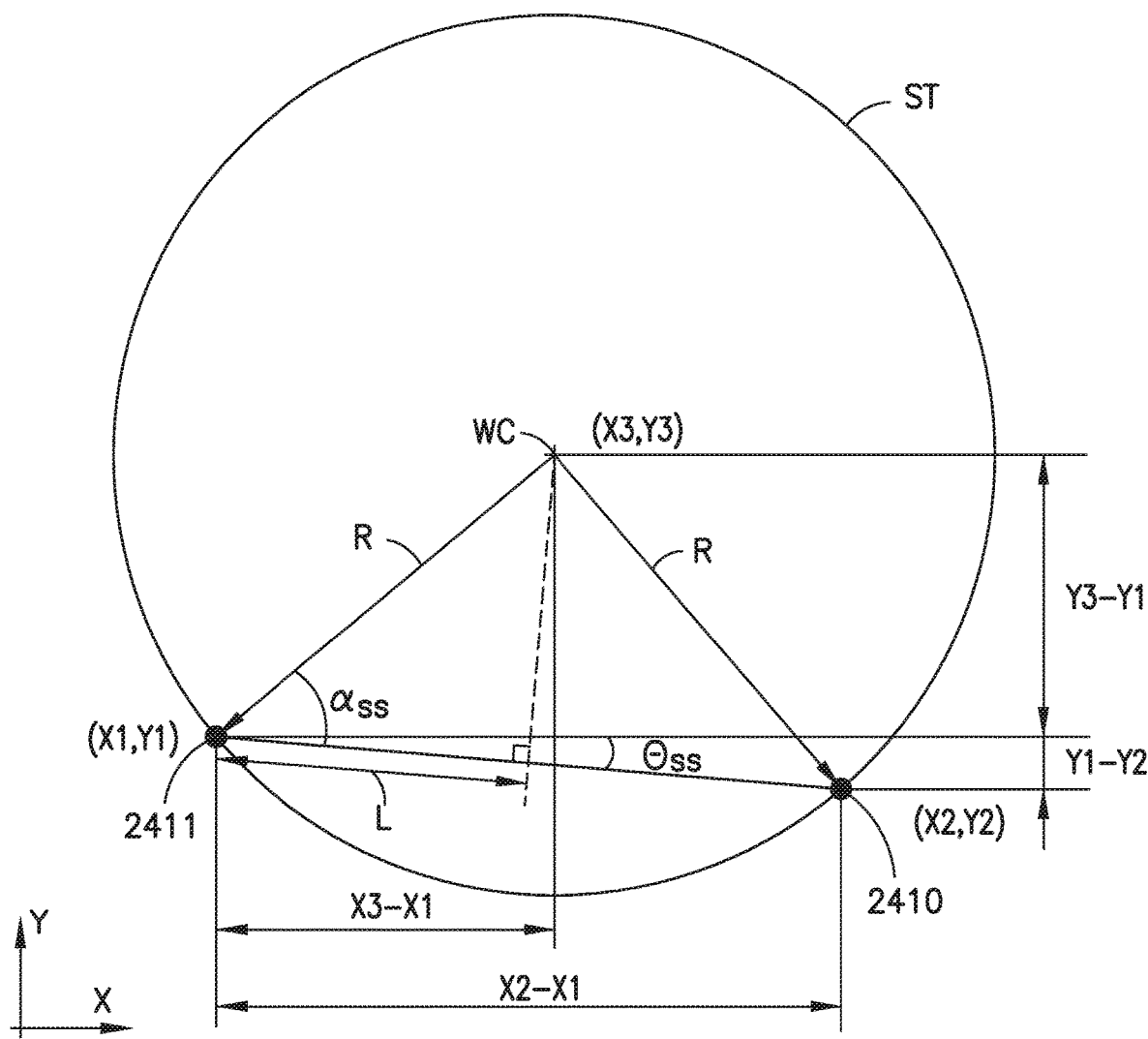
FIG. 25 is a schematic illustration of a portion of a substrate processing apparatus in accordance with aspects of the disclosed embodiment.

In one aspect, referring to FIGS. 24A, 24B and 25 the substrate holding location $X_{stn}$, $Y_{stn}$ is taught with static or fixed sensors 2410, 2411 rather than the contact deterministic station features 1610, 1611 described above. In this aspect, the location of each sensor 2410, 2411 has a predetermined spatial relationship with the substrate holding location $X_{stn}$, $Y_{stn}$. The center of the wafer S, ST can be found with the sensors 2410, 2411 using the following equations:

$$L = \frac{\sqrt{(Y2-Y1)^2 + (X2-X1)^2}}{2} \quad [5]$$

$$\theta_{SS} = \tan^{-1}\left(\frac{Y2-Y1}{X2-X1}\right) \quad [6]$$

$$\alpha_{SS} = \cos^{-1}\left(\frac{L}{R}\right) \quad [7]$$

$$X3 - X1 = R\cos(\alpha_{SS} - \theta_{SS}) \rightarrow X3 = X1 + R\cos(\alpha_{SS} - \theta_{SS}) \quad [8]$$

$$Y3 - Y1 = R\sin(\alpha_{SS} - \theta_{SS}) \rightarrow Y3 = Y1 + R\sin(\alpha_{SS} - \theta_{SS}) \quad [9]$$

Figure 26:
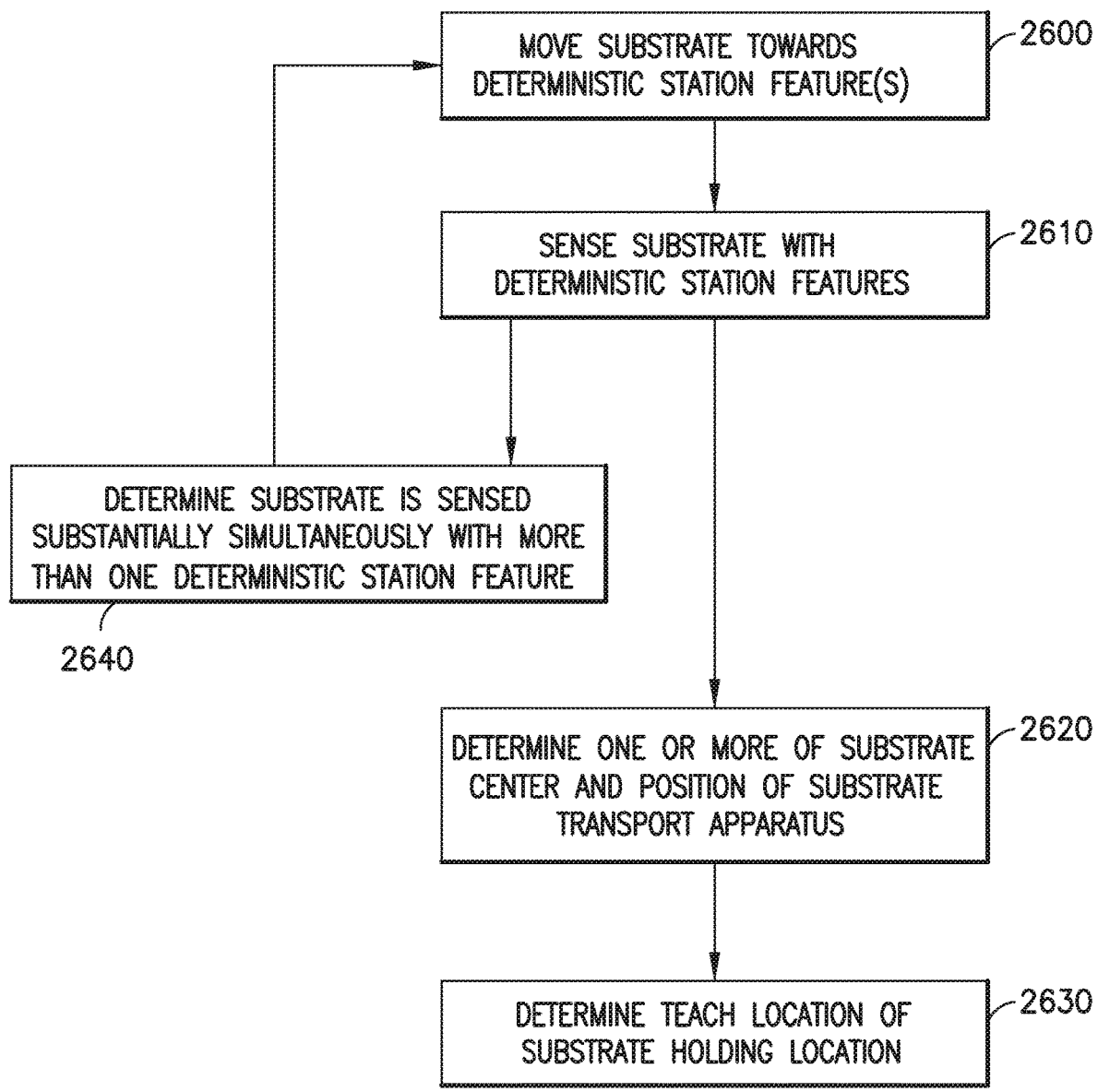
FIG. 26 is a flow chart of an auto-teach process in accordance with aspects of the disclosed embodiment.

In a manner substantially similar to that described above, one or more of the center WC of the wafer S, ST and the position EC of the substrate transfer robot 314 are determined in the transport apparatus coordinate system. In one aspect, the wafer S, ST is centered on the end effector so that there is substantially zero eccentricity between the wafer center WC and the end effector center EC. In this aspect, the wafer S, ST is moved by the end effector towards the deterministic station features, which in this aspect are sensors 2410, 2411. (FIG. 26, Block 2600). The wafer S, ST is sensed with the sensors (FIG. 26, Block 2610) and the determination of one or more of the wafer center WC and the position of the substrate transport apparatus is determined (FIG. 26, Block 2620). As may be realized, because the location of the sensors 2410, 2411 relative to the substrate holding location $X_{stn}$, $Y_{stn}$ is known and because the wafer center WC is substantially coincident with the end effector center EC the location of the substrate holding station is also known relative to the end effector center EC and is taught to the substrate transport apparatus where sensing the wafer S, ST effects registration of the end effector center EC (i.e. the position of the substrate transport apparatus) relative to the substrate holding location $X_{stn}$, $Y_{stn}$ (FIG. 26, Block 2630).

In other aspects, there may be eccentricity e between the wafer S, ST and the end effector center EC. Here for example, as described above with respect to FIGS. 18A, 18B and 21, the center position of the wafer WC is substantially equal to the robot position EC plus the eccentricity e. To find the eccentricity e and the center of the end effector EC, the respective articulated arm 219A, 219B is controlled by, for example, controller 11091 so as to move the substrates S, ST into their respective processing stations (which in one aspect are each similar to those described above) so that each substrate S, ST is iteratively moved toward the respective sensors 2410, 2411 in a common direction, as described above, with at least one common drive of the substrate transport apparatus. The eccentricity e is tracked for each respective substrate held by the end effector 219E and the location of the station holding location for each substrate S, ST is determined in a manner that is substantially similar to that described above with respect to FIG. 21 however, the contact deterministic station features 1610, 1611 are replaced with the non-contact deterministic station features 2410, 2411. For example, there is substantially zero eccentricity e between the wafer S, ST and the end effector center EC when it is determined that the sensors 2410, 2411 substantially simultaneously sense the wafer S, ST and the eccentricity is within a predetermined tolerance as described above (FIG. 26, Block 2640).

In accordance with one or more aspects of the disclosed embodiment a substrate transport apparatus auto-teach system for auto-teaching a substrate station location is provided. The system includes a frame; a substrate transport connected to the frame, the substrate transport having an end effector configured to support a substrate; and a controller configured to move the substrate transport so that the substrate transport biases the substrate supported on the end effector against a substrate station feature causing a change in eccentricity between the substrate and the end effector, determine the change in eccentricity, and determine the substrate station location based on at least the change in eccentricity between the substrate and the end effector.

In accordance with one or more aspects of the disclosed embodiment the substrate station location is a Z location of the substrate station.

In accordance with one or more aspects of the disclosed embodiment the system further includes a substrate locating unit connected to the frame.

In accordance with one or more aspects of the disclosed embodiment the substrate locating unit includes an automatic wafer centering (AWC) unit connected to the frame.

In accordance with one or more aspects of the disclosed embodiment the substrate station feature is located inside a process module having a vacuum pressure environment therein.

In accordance with one or more aspects of the disclosed embodiment the vacuum pressure environment is a high vacuum.

In accordance with one or more aspects of the disclosed embodiment the substrate transport biases the substrate supported on the end effector against a substrate station feature in the vacuum pressure environment.

In accordance with one or more aspects of the disclosed embodiment the substrate station feature is located within a process module that is in a state of process security for processing substrates.

In accordance with one or more aspects of the disclosed embodiment the controller includes embedded pick/place commands to move the substrate transport and bias the substrate.

In accordance with one or more aspects of the disclosed embodiment the controller includes embedded substrate locating commands to determine the substrate eccentricity.

In accordance with one or more aspects of the disclosed embodiment a process tool includes a frame; a substrate transport connected to the frame and having an end effector configured to support a substrate; and a substrate transport apparatus auto-teach system for auto-teaching a substrate station location, the auto-teach system including a controller configured to move the substrate transport so that the substrate transport taps the substrate supported on the end effector against a substrate station feature causing a change in eccentricity between the substrate and the end effector, determine the change in eccentricity, and determine the substrate station location based on at least the change in eccentricity between the substrate and the end effector.

In accordance with one or more aspects of the disclosed embodiment the process tool further includes a substrate locating unit connected to the frame.

In accordance with one or more aspects of the disclosed embodiment the substrate locating unit includes an automatic wafer center (AWC) unit connected to the frame.

In accordance with one or more aspects of the disclosed embodiment the substrate station feature is located inside a process module having a vacuum pressure environment therein.

In accordance with one or more aspects of the disclosed embodiment the vacuum pressure environment is a high vacuum.

In accordance with one or more aspects of the disclosed embodiment the substrate transport biases the substrate supported on the end effector against a substrate station feature in the vacuum pressure environment.

In accordance with one or more aspects of the disclosed embodiment the substrate station feature is located within a process module that is in a state of process security for processing substrates.

In accordance with one or more aspects of the disclosed embodiment the controller includes embedded pick/place commands to move the substrate transport and bias the substrate.

In accordance with one or more aspects of the disclosed embodiment the controller includes embedded substrate locating commands to determine the substrate eccentricity.

In accordance with one or more aspects of the disclosed embodiment the substrate is a representative teaching or dummy wafer.

In accordance with one or more aspects of the disclosed embodiment a substrate transport apparatus includes a frame; a substrate transport apparatus movably connected to the frame and having an end effector configured to support a substrate; a substrate station connected to the frame and having at least a first station feature having a predetermined spatial relationship with a substrate holding location of the substrate station; and an auto-teach system for auto-teaching a substrate station location of the substrate station, the auto-teach system including a control system operably connected to the substrate transport apparatus and being configured to determine the substrate holding location with at least one embedded pick/place command from embedded pick/place commands in the controller, wherein the commanded transport of the substrate transport apparatus, from the at least one embedded pick/place command, effects movement of the end effector so that the substrate supported on the end effector taps the at least first station feature causing an eccentricity between the substrate and the end effector through contact with the at least first station feature, determine an amount of the eccentricity, and determine a location of the substrate holding location based on the eccentricity and the predetermined spatial relationship.

In accordance with one or more aspects of the disclosed embodiment the at least first station feature is located inside a process module having a vacuum pressure environment therein.

In accordance with one or more aspects of the disclosed embodiment the vacuum pressure environment is a high vacuum.

In accordance with one or more aspects of the disclosed embodiment the substrate transport taps the substrate supported on the end effector against the at least first station feature in the vacuum pressure environment.

In accordance with one or more aspects of the disclosed embodiment the at least first station feature is located within a process module that is in a state of process security for processing substrates.

In accordance with one or more aspects of the disclosed embodiment the embedded pick/place commands move the substrate transport and taps the substrate against the at least first station feature.

In accordance with one or more aspects of the disclosed embodiment the controller includes embedded substrate locating commands to determine the eccentricity.

In accordance with one or more aspects of the disclosed embodiment the substrate station includes a second station feature having a predetermined spatial relationship with a substrate holding location of the substrate station.

In accordance with one or more aspects of the disclosed embodiment a method for auto-teaching a substrate station location includes providing a substrate transport and supporting a substrate on an end effector of the substrate transport; causing a change in eccentricity between the substrate and the end effector by moving, with a controller, the substrate transport so that the substrate transport biases the substrate supported on the end effector against a substrate station feature; determining, with the controller, the change in eccentricity; and determining, with the controller, the substrate station location based on at least the change in eccentricity between the substrate and the end effector.

In accordance with one or more aspects of the disclosed embodiment the substrate station feature is located inside a process module having a vacuum pressure environment therein.

In accordance with one or more aspects of the disclosed embodiment the vacuum pressure environment is a high vacuum.

In accordance with one or more aspects of the disclosed embodiment the substrate transport biases the substrate supported on the end effector against a substrate station feature in the vacuum pressure environment.

In accordance with one or more aspects of the disclosed embodiment the method further includes moving the substrate transport and biasing the substrate with embedded pick/place commands of the controller.

In accordance with one or more aspects of the disclosed embodiment the method further includes determining the eccentricity with embedded substrate locating commands of the controller.

In accordance with one or more aspects of the disclosed embodiment a method includes providing a substrate transport apparatus having an end effector configured to support a substrate; providing a substrate station having at least a first station feature having a predetermined spatial relationship with a substrate holding location of the substrate station; and automatically teaching a substrate station location of the substrate station by determining the substrate holding location with at least one embedded pick/place command from embedded pick/place commands in a controller, wherein the commanded transport of the substrate transport apparatus, from the at least one embedded pick/place command, effects movement of the end effector so that the substrate supported on the end effector taps the at least first station feature causing an eccentricity between the substrate and the end effector through contact with the at least first station feature, determining, with the controller, an amount of the eccentricity, and determining, with the controller, a location of the substrate holding location based on the eccentricity and the predetermined spatial relationship.

In accordance with one or more aspects of the disclosed embodiment the at least first station feature is located inside a process module having a vacuum pressure environment therein.

In accordance with one or more aspects of the disclosed embodiment the vacuum pressure environment is a high vacuum.

In accordance with one or more aspects of the disclosed embodiment the substrate transport taps the substrate supported on the end effector against the at least first station feature in the vacuum pressure environment.

In accordance with one or more aspects of the disclosed embodiment the method further includes moving the substrate transport and tapping the substrate against the at least first station feature with the embedded pick/place commands.

In accordance with one or more aspects of the disclosed embodiment the method further includes determining the eccentricity with embedded substrate locating commands of the controller.

In accordance with one or more aspects of the disclosed embodiment the method further includes providing the substrate station with a second station feature having a predetermined spatial relationship with a substrate holding location of the substrate station.

In accordance with one or more aspects of the disclosed embodiment a method for in situ auto-teaching of a substrate station location comprises:

providing deterministic station features on a substrate holding station, the deterministic station features deterministically defining a predetermined position of a substrate in contact with the deterministic station features, which predetermined position has a predetermined relation with and identifying the substrate holding station;

determining, through contact between the substrate and at least one deterministic station feature, a common eccentricity of the substrate; and determining a teach location of the substrate holding station based on the common eccentricity.

In accordance with one or more aspects of the disclosed embodiment determining the teach location of the substrate holding station comprises:

establishing a location of the station features in a transport apparatus coordinate system by contacting the at least one deterministic station feature with the substrate and determining an eccentricity of the substrate.

In accordance with one or more aspects of the disclosed embodiment determining the teach location of the substrate holding station comprises:

iteratively contacting the at least one deterministic station feature with the substrate to confirm the eccentricity of the substrate relative to the transport apparatus coordinate system until a change in the eccentricity resolves to the common eccentricity.

In accordance with one or more aspects of the disclosed embodiment determining the teach location of the substrate holding station comprises:

determining the predetermined position of the substrate and a center position of a transport apparatus end effector holding the substrate based on the common eccentricity.

In accordance with one or more aspects of the disclosed embodiment determining the teach location of the substrate holding station comprises:

determining the teach location, in the transport apparatus coordinate system, of the substrate holding station from the predetermined position of the substrate with respect to the substrate holding station and the center position of the transport apparatus end effector.

In accordance with one or more aspects of the disclosed embodiment contact between the substrate and at least one station feature is from a common direction.

In accordance with one or more aspects of the disclosed embodiment the teach location of the substrate holding station is determined in situ to the substrate holding station.

In accordance with one or more aspects of the disclosed embodiment the contact between the substrate and at least one deterministic station feature is an iterative contact and an eccentricity of the substrate is determined for each iteration.

In accordance with one or more aspects of the disclosed embodiment the substrate is repositioned relative to a substrate transport holding the substrate based on the eccentricity for each iteration.

In accordance with one or more aspects of the disclosed embodiment the common eccentricity is an eccentricity within a signal noise of a wafer sensor configured to detect the substrate for determining the common eccentricity.

In accordance with one or more aspects of the disclosed embodiment the method further comprising determining, with a controller a center location of a substrate transport end effector to effect determining the common eccentricity relative to the center location, where the controller adjusts a location of the center location to compensate for thermal effects on the transport apparatus.

In accordance with one or more aspects of the disclosed embodiment a substrate transport apparatus auto-teach system for auto-teaching a substrate holding location comprises:

a frame;

a substrate holding station connected to the frame and having deterministic station features that deterministically define a predetermined position of a substrate in contact with the deterministic station features, which predetermined position has a predetermined relation with and identifying the substrate holding station;

a substrate transport connected to the frame and being configured to move the substrate; and a controller configured to determine, through contact between the substrate and at least one deterministic station feature, a common eccentricity of the substrate; and determine a teach location of the substrate holding station based on the common eccentricity.

In accordance with one or more aspects of the disclosed embodiment the controller is further configured to:

establish a location of the station features in a coordinate system of the substrate transport apparatus by controlling the substrate transport apparatus so that the substrate contacts the at least one station feature and determine an eccentricity of the substrate.

In accordance with one or more aspects of the disclosed embodiment the controller is further configured to:

effect iterative contact between the at least one deterministic station feature and the substrate to confirm the eccentricity of the substrate relative to the coordinate system until a change in the eccentricity resolves to the common eccentricity.

In accordance with one or more aspects of the disclosed embodiment the controller is further configured to:

determine the predetermined position of the substrate and a center position of the transport apparatus based on the common eccentricity.

In accordance with one or more aspects of the disclosed embodiment the controller is further configured to:

determine the teach location of the substrate holding station, in the coordinate system, from the predetermined position of the substrate with respect to the substrate holding station and the center position of the transport apparatus.

In accordance with one or more aspects of the disclosed embodiment the controller is configured to effect contact between the substrate and at least one station feature from a common direction.

In accordance with one or more aspects of the disclosed embodiment the teach location of the substrate holding station is determined in situ to the substrate holding station.

In accordance with one or more aspects of the disclosed embodiment the controller is configured to effect an eccentricity determination of the substrate for each iterative contact.

In accordance with one or more aspects of the disclosed embodiment the controller is configured to effect repositioning of the substrate relative to a substrate transport based on the eccentricity determination for each iterative contact.

In accordance with one or more aspects of the disclosed embodiment the common eccentricity is an eccentricity within a signal noise of a wafer sensor configured to detect the substrate for determining the common eccentricity.

In accordance with one or more aspects of the disclosed embodiment the substrate transport comprises an end effector having a center location, the end effector being configured to hold the substrate, and the controller is further configured to determine the center location to effect determining the common eccentricity relative to the center location, where the controller is configured to adjust a location of the center location to compensate for thermal effects on the transport apparatus.

In accordance with one or more aspects of the disclosed embodiment a substrate transport apparatus auto-teach system for auto-teaching a substrate holding location comprises:

a frame;

a station fixture connected to the frame and having deterministic station features that deterministically define a predetermined position of a substrate in contact with the deterministic station features, which predetermined position has a predetermined relation with and identifying the substrate holding location of the station fixture; and a substrate transport configured to hold the teaching substrate; and a controller configured move the substrate transport so that the teaching substrate moves relative to the station features in a common direction.

In accordance with one or more aspects of the disclosed embodiment the controller is configured to determine the predetermined position of the substrate and the substrate holding location, where the position of the substrate and the substrate holding location are effected by contact between the substrate and the deterministic station features.

In accordance with one or more aspects of the disclosed embodiment a substrate transport apparatus auto-teach system for auto-teaching a substrate holding location comprises:

a frame;

a station fixture connected to the frame and having deterministic station features that deterministically define a predetermined position of a teaching substrate in contact with the deterministic station features;

a teaching substrate configured so that contact with the deterministic station features positions the teaching substrate in the predetermined position with a predetermined relation with and identifying the substrate holding location; and a substrate transport configured to hold the teaching substrate; and a controller configured move the substrate transport so that the teaching substrate moves relative to the station features in a common direction.

In accordance with one or more aspects of the disclosed embodiment the controller is configured to determine the predetermined position of the substrate and the substrate holding location, where the position of the substrate and the substrate holding location are effected by contact between the substrate and the deterministic station features.

In accordance with one or more aspects of the disclosed embodiment a substrate transport apparatus auto-teach system for auto-teaching a substrate holding location comprises:

a frame;

a substrate holding station connected to the frame, the substrate holding station having deterministic station features that deterministically define a predetermined position of a substrate in contact with the deterministic station features, which predetermined position has a predetermined relation with and identifying the substrate holding location of the station fixture;

a transport apparatus connected to the frame and being configured to hold the substrate; and a controller configured to effect movement of the substrate, with the transport apparatus, where the substrate contacts at least one of the deterministic station features, determine a common eccentricity of the substrate relative to the substrate transport apparatus, and determine a position of the substrate holding location based on the common eccentricity.

In accordance with one or more aspects of the disclosed embodiment a substrate transport apparatus auto-teach system for auto-teaching a substrate station location comprises:

a frame;

a substrate transport connected to the frame, the substrate transport having an end effector configured to support a substrate;

a substrate holding station connected to the frame, the substrate holding station having deterministic station features; and a controller configured to move the substrate transport so that the substrate contacts the deterministic station features causing a change in eccentricity between the substrate and the end effector, determine the change in eccentricity, and determine the substrate station location based on at least the change in eccentricity where the eccentricity identifies the substrate station location.

In accordance with one or more aspects of the disclosed embodiment method for in situ auto-teaching of a substrate station location comprises:

providing deterministic station features on a substrate holding station, the deterministic station features deterministically defining a predetermined position of a substrate interacting with the deterministic station features, which predetermined position has a predetermined relation with and identifying the substrate holding station;

determining, through interaction between the substrate and at least one deterministic station feature, a common eccentricity of the substrate; and determining a teach location of the substrate holding station based on the common eccentricity.

In accordance with one or more aspects of the disclosed embodiment determining the teach location of the substrate holding station comprises:

establishing a location of the station features in a transport apparatus coordinate system by contacting the at least one deterministic station feature with the substrate and determining an eccentricity of the substrate.

In accordance with one or more aspects of the disclosed embodiment determining the teach location of the substrate holding station comprises:

iteratively contacting the at least one deterministic station feature with the substrate to confirm the eccentricity of the substrate relative to the transport apparatus coordinate system until a change in the eccentricity resolves to the common eccentricity.

In accordance with one or more aspects of the disclosed embodiment determining the teach location of the substrate holding station comprises:

iteratively passing the substrate past at least one deterministic station feature to confirm the eccentricity of the substrate relative to the transport apparatus coordinate system until a change in the eccentricity resolves to the common eccentricity.

In accordance with one or more aspects of the disclosed embodiment sensing the substrate effects registration of a center position of a transport apparatus end effector, holding the substrate, relative to the substrate holding location.

In accordance with one or more aspects of the disclosed embodiment a substrate transport apparatus auto-teach system for auto-teaching a substrate holding location comprises:

a frame;

a substrate holding station connected to the frame and having deterministic station features that deterministically define a predetermined position of a substrate interfacing with the deterministic station features, which predetermined position has a predetermined relation with and identifying the substrate holding station;

a substrate transport connected to the frame and being configured to move the substrate; and a controller configured to determine, through interaction between the substrate and at least one deterministic station feature, a common eccentricity of the substrate; and determine a teach location of the substrate holding station based on the common eccentricity.

In accordance with one or more aspects of the disclosed embodiment the controller is further configured to establish a location of the station features in a transport apparatus coordinate system by effecting contact between the at least one deterministic station feature and the substrate, and determine an eccentricity of the substrate.

In accordance with one or more aspects of the disclosed embodiment the controller is further configured to effect iterative contact between the at least one deterministic station feature and the substrate to confirm the eccentricity of the substrate relative to the transport apparatus coordinate system until a change in the eccentricity resolves to the common eccentricity.

In accordance with one or more aspects of the disclosed embodiment the controller is further configured to effect iteratively passing the substrate past at least one deterministic station feature to confirm the eccentricity of the substrate relative to the transport apparatus coordinate system until a change in the eccentricity resolves to the common eccentricity.

In accordance with one or more aspects of the disclosed embodiment sensing the substrate effects registration of a center position of a transport apparatus end effector, holding the substrate, relative to the substrate holding location.

In accordance with one or more aspects of the disclosed embodiment a substrate transport apparatus auto-teach system for auto-teaching a substrate holding location comprises:

a substrate holding fixture; and a teaching substrate, the substrate holding fixture and the teaching substrate having in combination a configuration that is deterministic with respect to a substrate holding fixture Z teach location that is effected with bump touch;

wherein the configuration of the substrate holding fixture and the teaching substrate defines at least one feature with a contact surface between the substrate holding fixture and teaching substrate, the at least one feature having a predetermined variance in both a Z direction and a radial extension direction of a substrate transport, and determines, through contact between the teaching substrate and the contact surface, resolution of the substrate holding fixture Z teach location.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Accordingly, in accordance with the aspects of the disclosed embodiment, any one or more of the features described in the above paragraphs may be advantageously combined with any other features described in the above paragraphs, such a combination remaining within the scope of the aspects of the invention. Further, the mere fact that different features are recited in mutually different dependent or independent claims does not indicate that a combination of these features cannot be advantageously used, such a combination remaining within the scope of the aspects of the invention.

What is claimed is:

1. A process tool comprising:
   a frame forming an enclosure arranged to hold a controlled environment therein and having a substrate station located therein and an enclosure feature included in the controlled environment with a predetermined relationship to a substrate station location;
   a substrate transport connected to the frame and having an end effector configured to support a substrate; and
   a controller communicably connected to the substrate transport and configured to:
      move the substrate transport so as to bias the substrate on the end effector on the enclosure feature, and
      confirm an eccentricity of the substrate, relative to a coordinate system of the substrate transport, so that a change in eccentricity resolves to an eccentricity determinative of the substrate station location.

2. The process tool of claim 1, wherein substrate station location is a Z location of the substrate station.

3. The process tool of claim 1, further comprising a substrate locating unit connected to the frame and including an automatic wafer center (AWC) unit connected to the frame.

4. The process tool of claim 1, wherein the enclosure feature is located inside a process module having a vacuum pressure environment therein.

5. The process tool of claim 4, wherein the vacuum pressure environment is a high vacuum.

6. The process tool of claim 4, wherein the substrate transport biases the substrate supported on the end effector against the enclosure feature in the vacuum pressure environment.

7. The process tool of claim 1, wherein the enclosure feature is located within a process module that is in a state of process security for processing substrates.

8. The process tool of claim 1, wherein the controller includes embedded pick/place commands to move the substrate transport and bias the substrate.

9. The process tool of claim 1, wherein the controller includes embedded substrate locating commands to determine the eccentricity.

10. The process tool of claim 1, wherein the substrate is a representative teaching or dummy wafer.

11. A method comprising:
   providing a frame forming an enclosure arranged to hold a controlled environment therein and having a substrate station located therein and an enclosure feature included in the controlled environment with a predetermined relationship to a substrate station location;
   providing a substrate transport connected to the frame and having an end effector configured to support a substrate;
   providing a substrate transport apparatus auto-teach system for auto-teaching a substrate station location;
   moving, with a controller, the substrate transport so as to bias the substrate on the end effector on the enclosure feature to confirm an eccentricity of the substrate, relative to a coordinate system of the substrate transport, so that a change in eccentricity resolves to an eccentricity determinative of the substrate station location.

12. The process tool of claim 11, wherein the enclosure feature is located inside a process module having a vacuum pressure environment therein.

13. The process tool of claim 12, wherein the substrate transport biases the substrate supported on the end effector against the enclosure feature in the vacuum pressure environment.

14. A method comprising:
   providing a substrate transport apparatus having an end effector configured to support a substrate;
   providing a frame forming an enclosure arranged to hold a controlled environment therein and having at least a first enclosure feature having included in the controlled environment with a predetermined relationship to a substrate station location; and
   automatically teaching the substrate station location by determining the substrate holding location with at least one embedded pick/place command from embedded pick/place commands in a controller,
   wherein the commanded transport of the substrate transport apparatus, from the at least one embedded pick/place command, effects movement of the end effector so that the substrate supported on the end effector interacts with the at least first enclosure feature causing an eccentricity between the substrate and the end effector through contact with the at least first enclosure feature, wherein a change in eccentricity resolves to an eccentricity determinative of a location of the substrate holding location.

15. The method of claim 14, wherein the at least first enclosure feature is located inside a process module having a vacuum pressure environment therein.

16. The method of claim 15, wherein the vacuum pressure environment is a high vacuum.

17. The method of claim 15, wherein the substrate transport interacts with the substrate supported on the end effector against the at least first enclosure feature in the vacuum pressure environment.

18. The method of claim 14, further comprising moving the substrate transport and tapping the substrate against the at least first enclosure feature with the embedded pick/place commands.

19. The method of claim 14, further comprising determining the eccentricity with embedded substrate locating commands of the controller.

20. The method of claim 14, further comprising providing the frame with a second enclosure feature having a predetermined relationship to the substrate station location.

* * * * *